US012713609B2

(12) United States Patent
Park et al.

(10) Patent No.: US 12,713,609 B2
(45) Date of Patent: Aug. 18, 2026

(54) VERTICAL MEMORY DEVICES

(71) Applicant: SAMSUNG ELECTRONICS CO., LTD., Suwon-si (KR)

(72) Inventors: Kyungeun Park, Suwon-si (KR); Solmi Kwak, Suwon-si (KR); Jinhyuk Kim, Suwon-si (KR); Hyeongjin Kim, Suwon-si (KR); Jeongyong Sung, Suwon-si (KR); Minsoo Shin, Suwon-si (KR); Seungjun Shin, Suwon-si (KR); Joongshik Shin, Suwon-si (KR); Sunghee Chung, Suwon-si (KR); Jeehoon Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 278 days.

(21) Appl. No.: 18/435,342

(22) Filed: Feb. 7, 2024

(65) Prior Publication Data

US 2024/0381641 A1 Nov. 14, 2024

(30) Foreign Application Priority Data

May 11, 2023 (KR) ........................ 10-2023-0061113

(51) Int. Cl.
*H10B 43/27* (2023.01)
*H10B 41/27* (2023.01)
(Continued)

(52) U.S. Cl.
CPC ............. *H10B 43/27* (2023.02); *H10B 41/27* (2023.02); *H10B 41/40* (2023.02); *H10B 43/40* (2023.02)

(58) Field of Classification Search
CPC ........ H10B 43/27; H10B 43/40; H10B 41/27; H10B 41/40
See application file for complete search history.

(56) References Cited

U.S. PATENT DOCUMENTS

| | | | |
|---|---|---|---|
| 9,842,855 | B2 | 12/2017 | Lee |
| 10,347,654 | B1 | 7/2019 | Iwai et al. |

(Continued)

FOREIGN PATENT DOCUMENTS

| | | | |
|---|---|---|---|
| KR | 20170119915 | A | 10/2017 |
| KR | 20210032592 | A | 3/2021 |
| KR | 20210098141 | A | 8/2021 |

*Primary Examiner* — Douglas M Menz
(74) *Attorney, Agent, or Firm* — Wolf, Greenfield & Sacks, P.C.

(57) ABSTRACT

A vertical memory device may include a common source plate on a substrate including a first region and a second region; gate pattern structures on the common source plate and extending from the first region to the second region, wherein the gate pattern structures include gate patterns and first insulation layers, and wherein the adjacent gate pattern structures are spaced apart from each other; first separation patterns filling first openings between the adjacent gate pattern structures on the first region; second separation patterns filling second openings between the adjacent gate pattern structures on the second region, wherein at least one of the second separation patterns is connected to at least one of the first separation patterns, and wherein the second separation pattern has a shape different from a shape of the first separation pattern; and channel structures passing through the gate pattern structures on the first region.

20 Claims, 44 Drawing Sheets

(51) Int. Cl.

| | |
|---|---|
| ***H10B 41/40*** | (2023.01) |
| ***H10B 43/40*** | (2023.01) |

(56) References Cited

U.S. PATENT DOCUMENTS

| | | | | |
|---|---|---|---|---|
| 10,381,373 | B2 | 8/2019 | Okizumi et al. | |
| 10,510,770 | B2 | 12/2019 | Harada et al. | |
| 10,964,711 | B2 | 3/2021 | Murata et al. | |
| 10,971,507 | B2 | 4/2021 | Kaminaga | |
| 11,205,653 | B2 | 12/2021 | Lee | |
| 11,462,554 | B2 | 10/2022 | Son et al. | |
| 2015/0340377 | A1* | 11/2015 | Lee | H10D 62/83 257/314 |
| 2021/0320125 | A1* | 10/2021 | Shin | H10B 43/10 |
| 2022/0077163 | A1 | 3/2022 | Lee | |
| 2023/0005948 | A1 | 1/2023 | Son et al. | |

* cited by examiner 160
148
176
110
112
100
160
162
176
120
W
176
176
176
170
170
170
130c
130b
130
130a
140
M
E
E'
162
152
150
152
150
152
150

198b
186c
198b
162
196
152
150
152
150
120
B'
190
192
194
186c
140
130c
130b
130a
B 198a
186b
198a
162
196
152
150
152
150
120
A'
190
192
194
186b
140
130c
130b
130a
A
152
190a
190b
190c
190

198b
186c
198b
189
188
162
196
152
150
152
150
120
B'
B
190
192
194
186c
140
130c
130b
130a 198a
200
198a
212
189
188
162
196
152
150
152
150
120
A'
A
190
192
194
140

198b
186c
198b
188
162
196
152
150
152
150
120
B'
B
190
192
194
186c
140
130c
130b
130a 198a
200
198a
188
162
196
152
150
152
150
120
A'
202b
210a
202a
214
A
190
192
194
140

198b
186c
198b
216
188
162
196
152
150
148
120
190
192
194
186c
140
130c
130b
130a
B
B'

198a
200
198a
216
188
162
196
152
150
148
120
190
192
194
140
214
202a
210a
202b
A
A'

188
162
196
150
150
148
120
B'
198b
198b
230
240
190
192
194
140
130c
130b
130a
B 188
162
196
150
150
148
120
A'
198a
198a
230
240
202b
210a
202a
214
190
192
194
140
A 188
162
196
250
150
250
150
148
120
B'
198b
198b
260b
203a
190
192
194
140
130c
130b
130a
B 188
162
196
250
150
250
150
148
120
A'
198a
198a
260a
202b
210a
202a
214
190
192
194
140
A

VERTICAL MEMORY DEVICES

CROSS-REFERENCE TO RELATED APPLICATION

This application claims priority under 35 USC § 119 to Korean Patent Application No. 10-2023-0061113, filed on May 11, 2023, in the Korean Intellectual Property Office (KIPO), the contents of which are incorporated by reference herein in their entirety.

BACKGROUND

The present disclosure relates to vertical memory devices including a separation pattern.

Vertical memory devices in which memory cells are vertically stacked have been developed. In the vertical memory devices, the memory cells may include gate pattern structures including gate patterns stacked in a vertical direction. The gate pattern structures may be spaced apart from each other, and a separation pattern may be formed between the gate pattern structures to insulate the gate pattern structures from each other. When the separation pattern has a wide width (e.g., an excessive width), the separation pattern may contact some of the memory cells formed in the gate pattern structure, or an integration of the vertical memory device may be decreased. When the separation pattern has a narrow width (e.g., an insufficient width), the gate pattern structures may not be separated from each other.

SUMMARY

Various example embodiments provide a vertical memory device including a separation pattern.

According to some example embodiments, there is provided a vertical memory device. The vertical memory device comprises: a common source plate on a substrate, wherein the common source plate includes a first region and a second region extending around the first region; a plurality of gate pattern structures on the common source plate, wherein the plurality of gate pattern structures extends from the first region to the second region in a first direction parallel to an upper surface of the substrate, wherein each of the plurality of gate pattern structures includes gate patterns and first insulation layers alternately and repeatedly stacked, and wherein adjacent gate pattern structures among the plurality of gate pattern structures are spaced apart from each other in a second direction perpendicular to the first direction; a plurality of first separation patterns filling a plurality of first openings between the adjacent gate pattern structures among the plurality of gate pattern structures on the first region, wherein the plurality of first separation patterns is arranged in the first direction; a plurality of second separation patterns filling a plurality of second openings between the adjacent gate pattern structures among the plurality of gate pattern structures on the second region, wherein the plurality of second separation patterns is arranged in the first direction, wherein a second separation pattern among the plurality of second separation patterns is connected to a first separation pattern among the plurality of first separation patterns, and wherein the second separation pattern has a shape different from a shape of the first separation pattern; and a plurality of channel structures passing through the plurality of gate pattern structures on the common source plate on the first region, wherein each of the plurality of channel structures includes a channel and a charge storage structure.

According to some example embodiments, there is provided a vertical memory device. The vertical memory device, comprising: a common source plate on a substrate, wherein the common source plate includes a first region and a second region that extends around the first region; a plurality of gate pattern structures on the common source plate, wherein the plurality of gate pattern structures extends from the first region to the second region in a first direction parallel to an upper surface of the substrate, wherein each of the plurality of gate pattern structures includes gate patterns and first insulation layers alternately and repeatedly stacked, and wherein adjacent gat pattern structures among the plurality of gate pattern structures are spaced apart in a second direction perpendicular to the first direction; a plurality of first separation patterns filling a plurality of first openings between the adjacent gate pattern structures among the plurality of gate pattern structures on the first region, wherein the plurality of first separation patterns is arranged in the first direction; a plurality of second separation patterns filling a plurality of second openings between the adjacent gate pattern structures among the plurality of gate pattern structures on the second region, wherein the plurality of second separation patterns is arranged in the first direction, and wherein a second separation pattern among the plurality of second separation patterns is connected to a first separation pattern among the plurality of first separation patterns; and a plurality of channel structures passing through the plurality of gate pattern structures on the common source plate on the first region, wherein each of the plurality of channel structures includes a channel and a charge storage structure, wherein the plurality of first separation patterns has different widths depending on positions thereof in the second direction, and opposite sidewalls of the plurality of first separation patterns are symmetrical to each other, wherein the plurality of second separation patterns has different widths depending on positions thereof in the second direction, and opposite sidewalls of the plurality of second separation patterns are symmetrical to each other, and wherein a first maximum width of the plurality of first separation patterns in the second direction is different from a second maximum width of the plurality of second separation patterns in the second direction.

According to some example embodiments, there is provided a vertical memory device. The vertical memory device, comprising: a lower circuit pattern on a substrate; a common source plate on the lower circuit pattern, wherein the common source plate includes a first region and a second region extending around the first region; a plurality of gate pattern structures on the common source plate, wherein the plurality of gate pattern structures extends from the first region to the second region in a first direction parallel to an upper surface of the substrate, wherein each of the plurality of gate pattern structures includes gate patterns and first insulation layers alternately and repeatedly stacked, and wherein adjacent gate pattern structures among the plurality of gate pattern structures are spaced apart in a second direction perpendicular to the first direction; a plurality of first separation patterns filling a plurality of first openings between the adjacent gate pattern structures among the plurality of gate pattern structures on the first region, wherein the plurality of first separation patterns is arranged in the first direction; a plurality of second separation patterns filling a plurality of second openings between the adjacent gate pattern structures among the plurality of gate pattern structures on the second region, wherein the plurality of second separation patterns is arranged in the first direction, wherein a second separation pattern among the plurality of second separation patterns is connected to a first separation pattern among the plurality of first separation patterns, and wherein the second separation pattern has a shape different from a shape of the first separation pattern; a plurality of channel structures passing through the plurality of gate pattern structures on the common source plate on the first region, wherein each of the plurality of channel structures includes a channel and a charge storage structure; and a channel connection pattern between the common source plate and at least one of the plurality of gate pattern structures on the first region, wherein the gate patterns on the second region have a staircase shape, wherein lengths of the gate patterns in the first direction decrease as distances between the gate patterns and the substrate in a vertical direction increase, wherein the vertical direction is perpendicular to the substrate, and wherein at least a portion of one of the plurality of first separation patterns contacts the channel connection pattern.

According to example embodiments, the first separation pattern and the second separation pattern may be formed on the first region and the second region, respectively. Accordingly, the first separation pattern may be formed within a relatively smaller horizontal area on the first region. Additionally, the gate pattern structures may be completely electrically separated by the first and second separation patterns.

BRIEF DESCRIPTION OF THE DRAWINGS

Various example embodiments of the present disclosure will be more clearly understood from the following detailed description taken in conjunction with the accompanying drawings.

FIGS. 1 to 43 are cross-sectional views and plan views illustrating a method of manufacturing a vertical memory device according to example embodiments;

FIG. 44 is a plan view of a first separation pattern structure in a vertical memory device according to example embodiments; and FIG. 45 is a plan view of a first separation pattern structure in a vertical memory device according to example embodiments.

DETAILED DESCRIPTION

Hereinafter, various example embodiments will be described in detail with reference to the accompanying drawings.

Hereinafter, a direction parallel to a surface of a substrate is referred to as a first direction, and a direction parallel to the surface of the substrate and perpendicular to the first direction is referred to as a second direction. In addition, a direction perpendicular to the surface of the substrate is referred to as a vertical direction.

FIGS. 1 to 43 are cross-sectional views and plan views illustrating a method of manufacturing a vertical memory device according to example embodiments.

FIGS. 4, 7, 10, 13, 16, 19, 30, 33, 36, 41 and 43 are plan views. FIGS. 1 to 3, 5, 6, 8, 9, 11, 12, 14, 15, 17, 18, 20 to 29, 31, 32, 34, 35, 37 to 40 and 42 are cross-sectional views.

Figure 6:
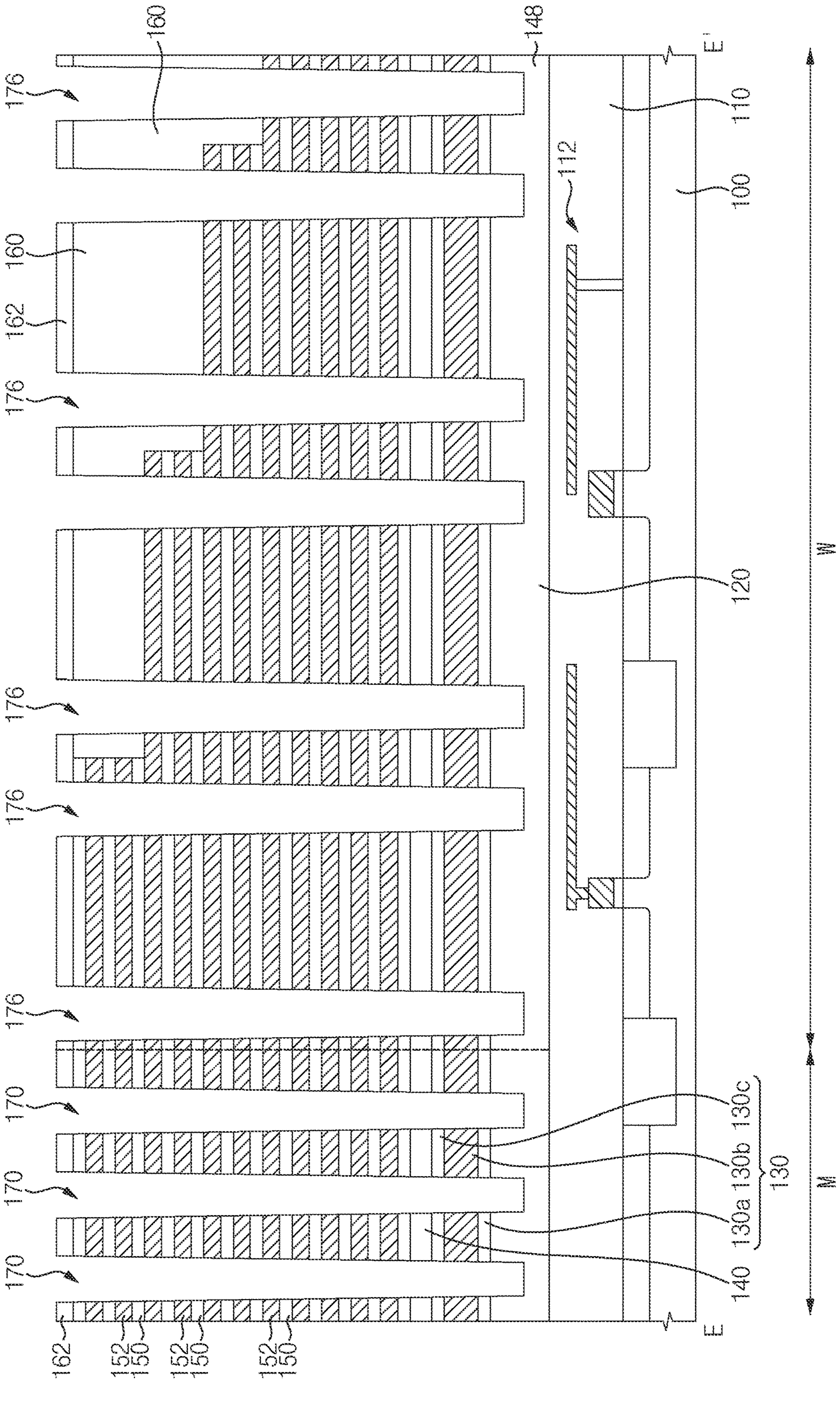
Figure 7:
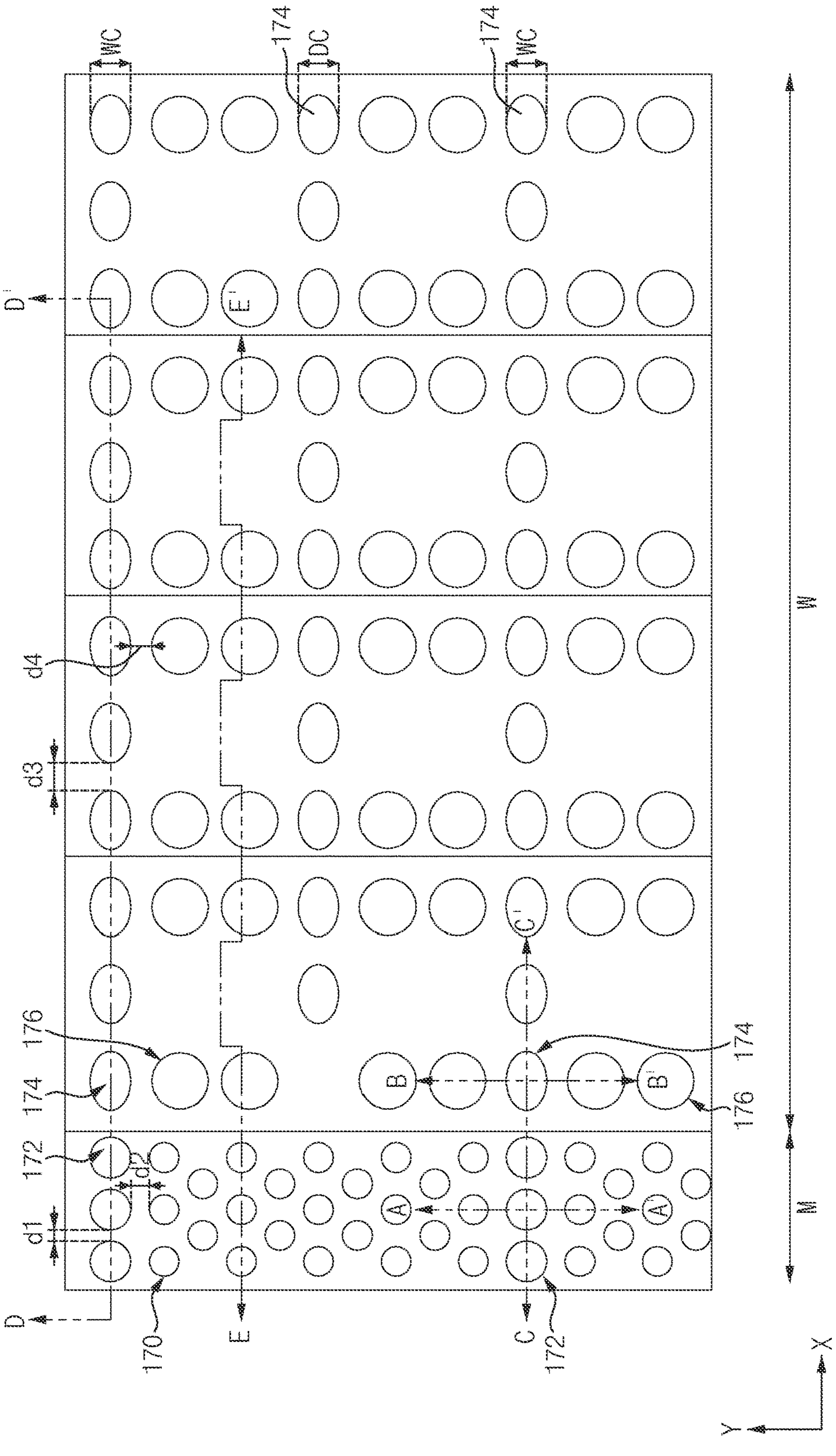
Figure 42:
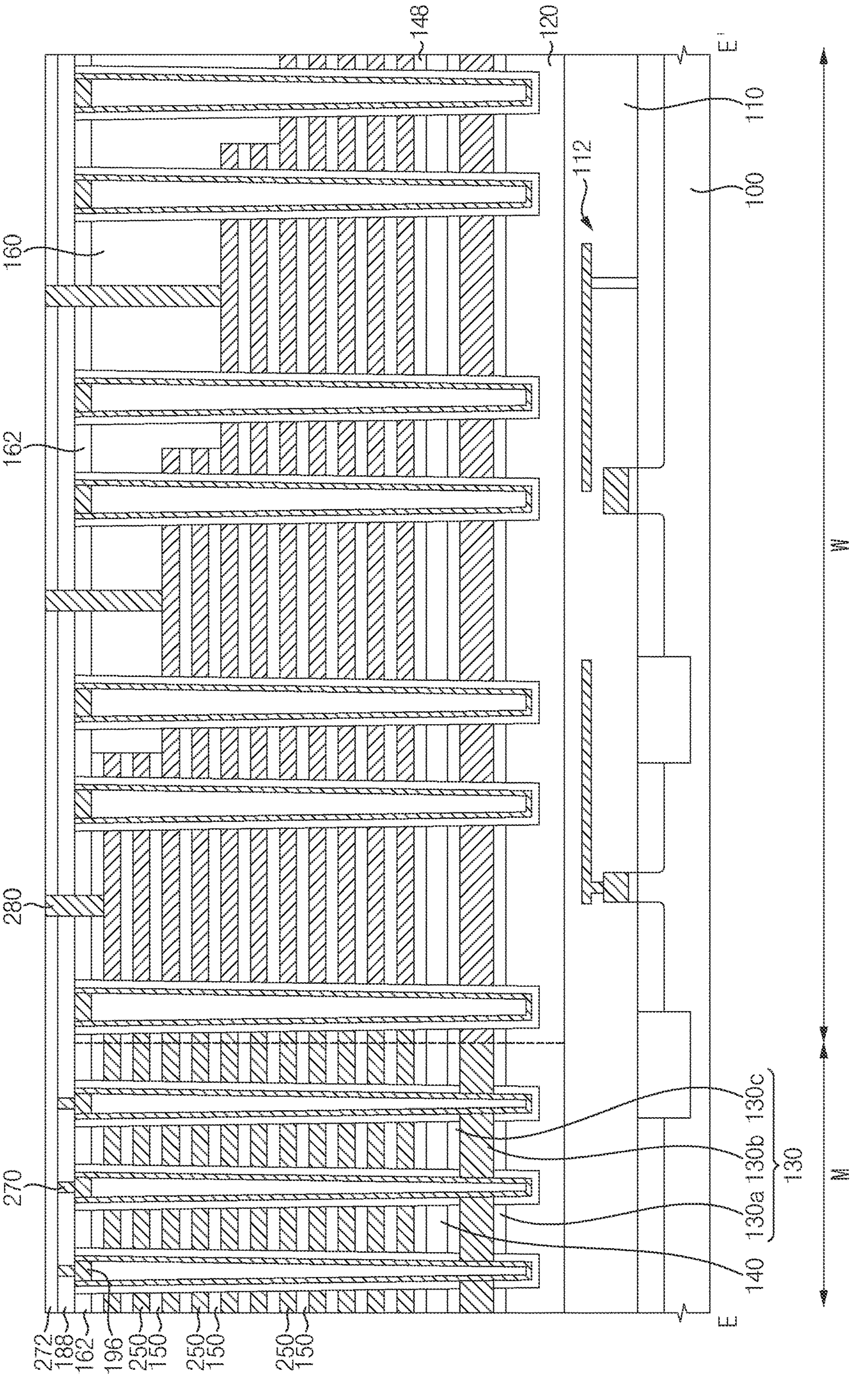

FIGS. 1, 2, 3, and 5 are cross-sectional views taken along line D-D' of FIG. 7. FIGS. 6 and 42 are cross-sectional views taken along line E-E' of FIG. 7. FIGS. 8, 11, 12, 14, 17, 20 to 22, 24, 26, 28, 31, 34, 37 to 39 are cross-sectional views taken along line A-A' and line B-B' of FIG. 7. FIGS. 9, 15, 18, 23, 25, 27, 29, 32, 35, and 40 are cross-sectional views taken along line C-C' of FIG. 7.

Figure 1:
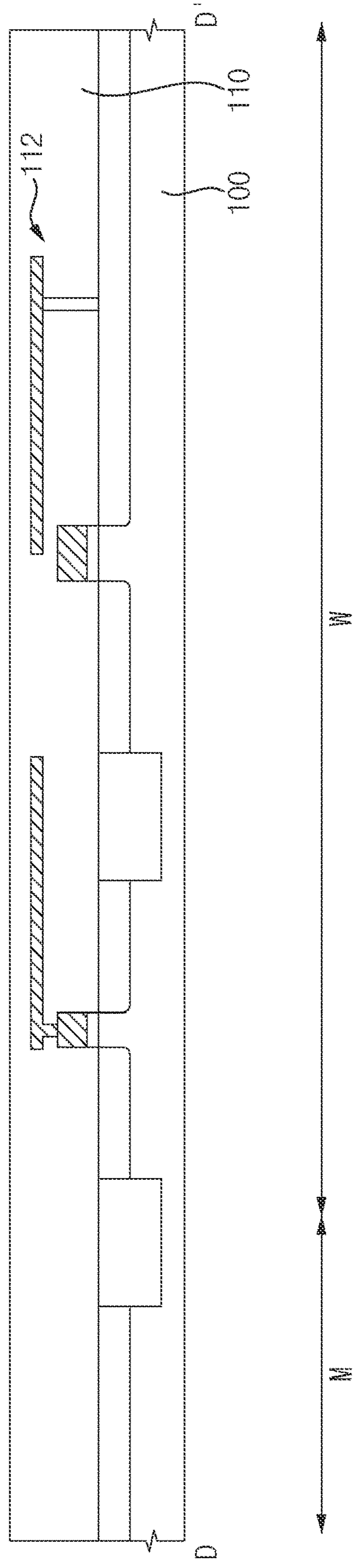
FIGS. 1 to 45 represent various non-limiting, example embodiments as described herein.

Referring to FIG. 1, a lower circuit pattern 112 including (or constituting) a peripheral circuit may be formed on a substrate 100. A lower insulating interlayer 110 may be formed on (e.g., to cover) the lower circuit pattern 112. The lower circuit pattern 112 may include, e.g., a transistor, a lower contact plug, a lower wiring, a lower via, etc.

The substrate 100 may include a first region M and a second region W extending around (e.g., surrounding) the first region M. The first region M may be a region for forming a memory cell array. The second region W may extend from the memory cell array and may be a region for forming wirings. For example, the second region W may be a region for forming contact plugs that are electrically connected to gate patterns included in the memory cell array (in the first region M). The first and second regions M and W may include an upper surface of the substrate 100 and a portion extending in the vertical direction from the upper surface of the substrate 100.

Figure 2:
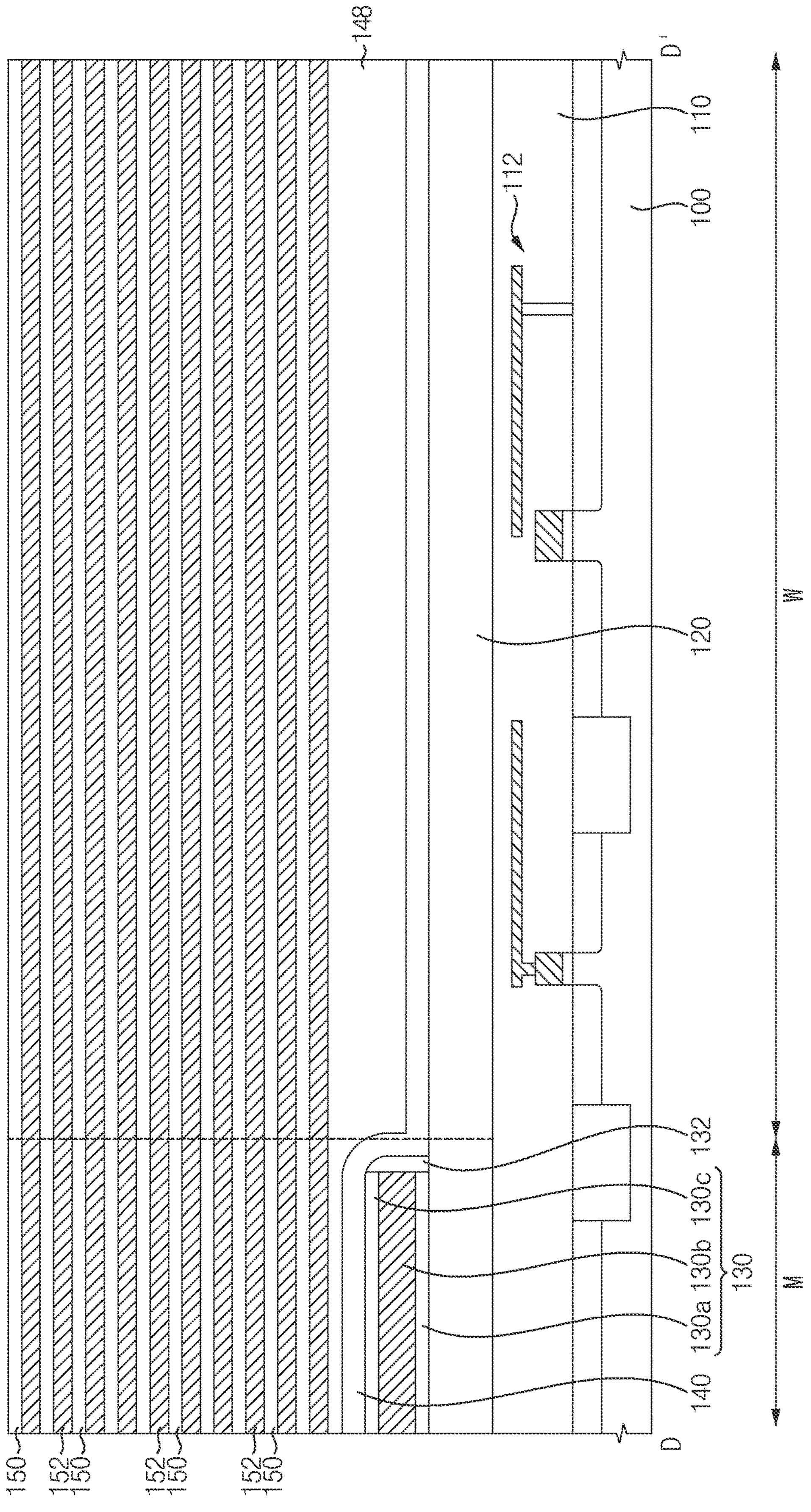

Referring to FIG. 2, a common source plate ("CSP") 120 and a sacrificial layer structure 130 may be sequentially formed on the lower insulating interlayer 110. The sacrificial layer structure 130 may be partially removed to form a first opening exposing an upper surface of the common source plate 120. The first opening may expose an upper surface of the common source plate 120 in the second region W. A first spacer 132 may be formed on a sidewall of the (remained) sacrificial layer structure 130. The remained sacrificial layer structure 130 after forming of the first opening may be disposed in the first region M. A support layer 140 may be formed on an upper surface of the sacrificial layer structure 130, the first spacer 132, and an upper surface of the common source plate 120. For example, the support layer 140 may be formed on the upper surface of the remained sacrificial layer structure 130 in the first region M, the first spacer 132, and the exposed upper surface of the common source plate 120 in the second region W.

The (remained) sacrificial layer structure 130 may include first, second, and third sacrificial layers 130*a*, 130*b*, and 130*c* sequentially stacked. The first and third sacrificial layers 130*a* and 130*c* may include, for example, an oxide such as silicon oxide, and the second sacrificial layer 130*b* may include, for example, a nitride such as silicon nitride.

In example embodiments, the first opening may be formed at a region corresponding to a word line cutting region (WC, referred to as FIG. 7) in the second region W and at an edge of the first region M adjacent thereto. That is, the sacrificial layer structure 130 may not be formed on the region corresponding to the word line cutting region WC in the second region W and the edge of the first region M adjacent thereto. The first opening may extend in the first direction. The first direction may be referred to as a first direction X. The second direction may be referred to as a second direction Y.

The support layer 140 may include a material having an etch selectivity with respect to the first, second, and third sacrificial layers 130*a*, 130*b*, and 130*c*, and may include e.g., polysilicon doped with n-type impurities. The support layer 140 may have a constant (e.g., a uniform) thickness. In the first opening, the support layer 140 may be on the upper surface of the common source plate 120. For example, the support layer 140 inside the first opening may contact the upper surface of the common source plate 120.

Thereafter, a first lower insulation layer 148 may be formed on the support layer 140. An upper surface of the first lower insulation layer 148 may be substantially flat. For example, the upper surfaces of the first lower insulation layer 148 in the first region M and the second region W may be disposed at substantially the same distance from the substrate 100 in the vertical direction.

A fourth sacrificial layer 152 and a first insulation layer 150 may be alternately and repeatedly stacked on the first lower insulation layer 148.

As the upper surface of the first lower insulation layer 148 are substantially flat, upper surfaces of the fourth sacrificial layers 152 and the first insulation layers 150 on the first lower insulation layer 148 may be substantially flat.

The first lower insulation layer 148 and the first insulation layer 150 may include, for example, an oxide such as silicon oxide, and the fourth sacrificial layer 152 may include, for example, a nitride such as silicon nitride.

Figure 3:
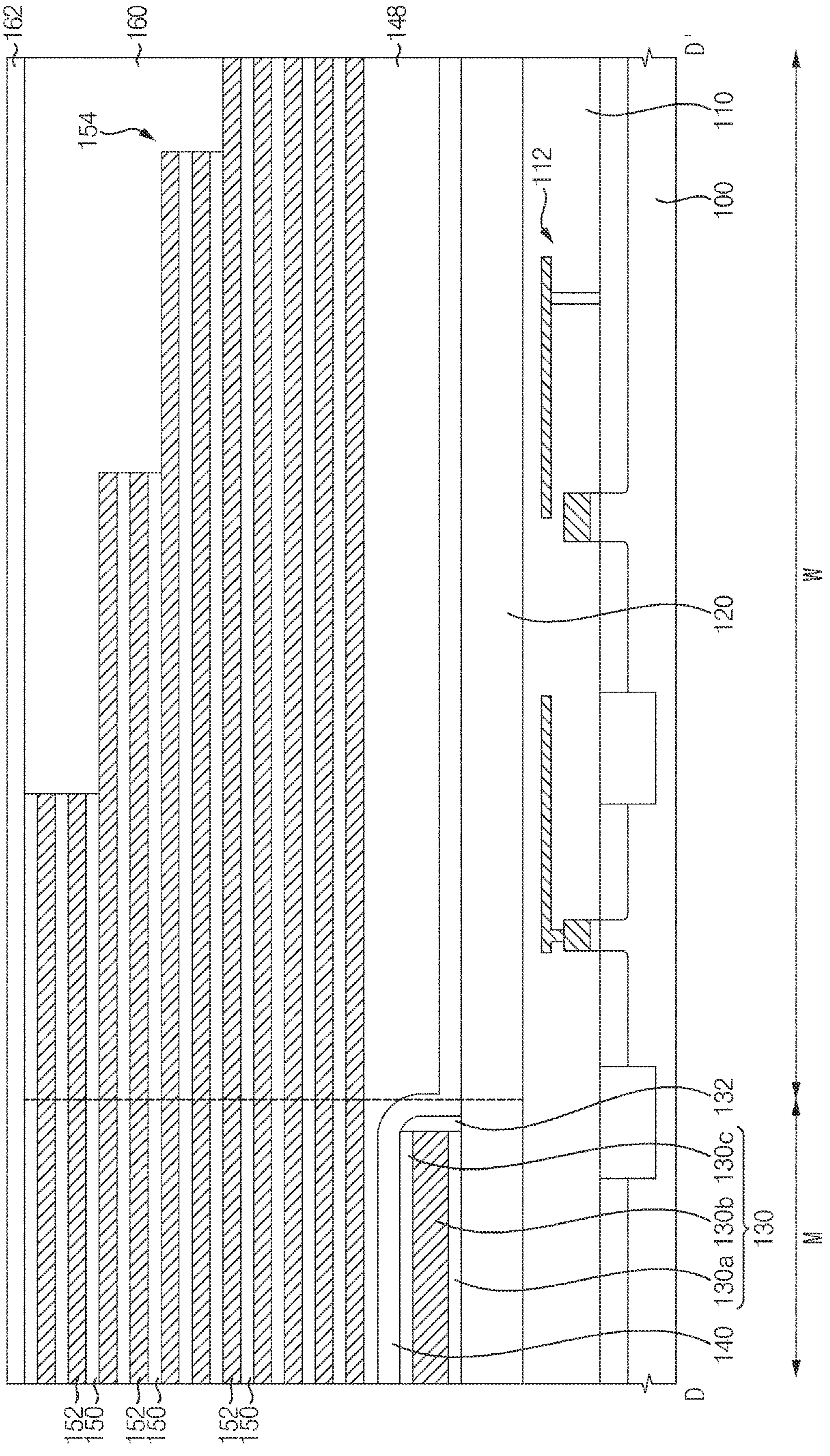
Figure 4:
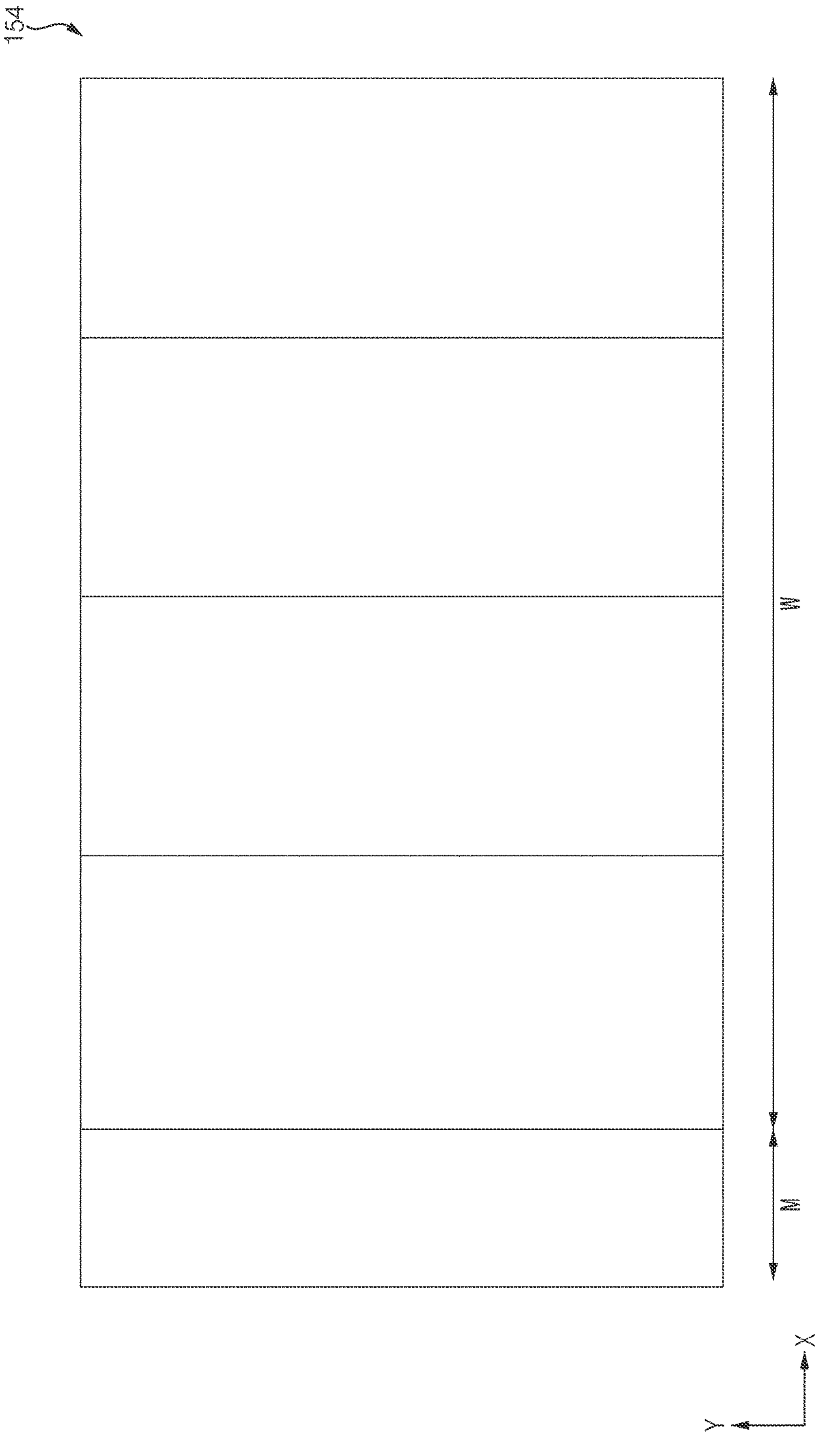

Referring to FIGS. 3 and 4, the first insulation layers 150 and fourth sacrificial layers 152 on the second region W may be patterned to form a first preliminary mold structure 154 on the first lower insulation layer 148. The first preliminary mold structure 154 may include the first insulation layers 150 and the fourth sacrificial layers 152, and may have a staircase shape on the second region W. Although only three upper stairs are shown in each of cross-sectional views, the first preliminary mold structure 154 on the second region W may include a plurality of stairs (e.g., two or more than three stairs) in the first direction X. The plurality of stairs in a direction (e.g., the first direction X) may refer to a structure, in which a lower stair (e.g., a closer stair to the substrate 100 in the vertical direction) among the plurality of stairs has a longer upper surface than that of an upper stair (e.g., a farther stair from the substrate 100 in the vertical direction) among the plurality of stairs in such a direction (e.g., the first direction X).

Hereinafter, in each of structures, a portion having the staircase shape formed on the second region W (e.g., the first preliminary mold structure 154) is referred to as a staircase. In addition, a stair may be defined as a portion of the staircase that is not covered by an upper stair and is exposed to an outside, and the stair may include an upper surface of the staircase and a vertical sidewall connected from the upper surface of the staircase to a lower portion of the staircase. As used hereinafter, the terms "external/outside configuration", "external/outside device", "external/outside power", "external/outside signal", or "outside" are intended to broadly refer to a device, circuit, block, module, power, and/or signal that resides externally (e.g., outside of a functional or physical boundary) with respect to a given circuit, block, module, system, or device. Hereinafter, the term "lower portion" of an element may refer to a portion of the element at the same level and/or lower level than a center portion of the element in the vertical direction. The term "upper portion" of an element may refer to a portion of the element at the same level and/or upper level than a center portion of the element in the vertical direction. For example, a lower portion of an element on the substrate 100 may be closer than an upper portion of the element to the substrate 100 in the vertical direction.

In example embodiments, an edge portion of the first preliminary mold structure 154 in the first direction X may include stairs in the first direction X. In some example embodiments, an edge portion of the first preliminary mold structure 154 in the first direction X may include stairs in each of the first direction X and the second direction Y.

In some embodiments, the fourth sacrificial layer 152 or the first insulation layer 150 may be exposed on an upper surface of a stair of the first preliminary mold structure 154. For example, the fourth sacrificial layer 152 or the first insulation layer 150 may comprise an upper surface of a stair of the first preliminary mold structure 154. In example embodiments, the fourth sacrificial layer 152 may be exposed on an upper surface of each of the stairs of the first preliminary mold structure 154. For example, the fourth sacrificial layer 152 may comprise an upper surface of each of the stairs of the first preliminary mold structure 154. One or multiple layers of the first insulation layer 150 and the fourth sacrificial layer 152 may be exposed on the vertical sidewalls of each of the stairs.

Thereafter, a first insulating interlayer 160 may be formed on the first preliminary mold structure 154, and the first insulating interlayer 160 may be planarized until an upper (e.g., an uppermost) surface of the first preliminary mold structure 154 is exposed.

A second insulating interlayer 162 may be formed on the first preliminary mold structure 154 and the first insulating interlayer 160. The first and second insulating interlayers 160 and 162 may include, for example, silicon oxide.

Figure 5:
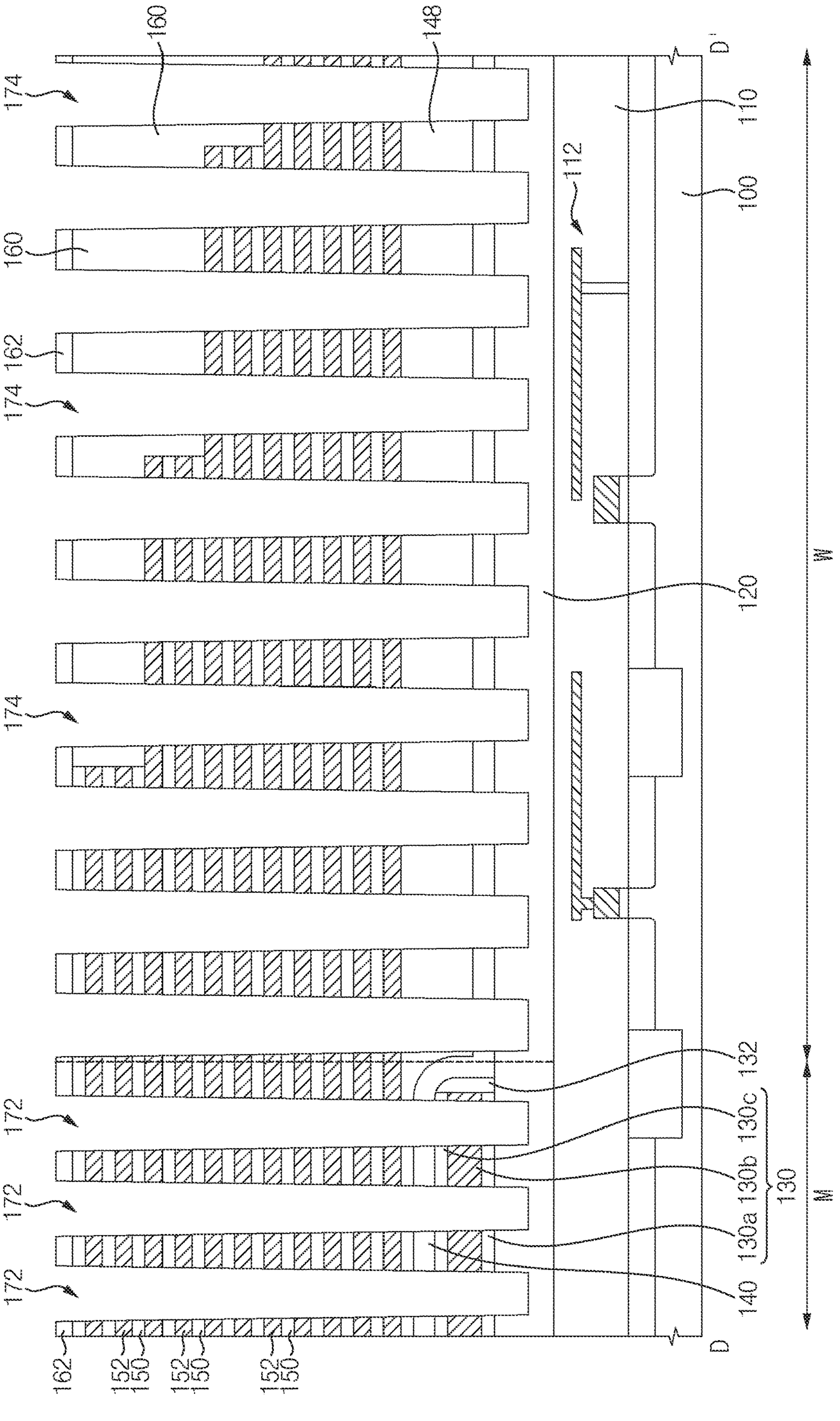

Referring to FIGS. 5 to 7, channel holes 170 and first holes 172 may be formed through the second insulating interlayer 162, the first preliminary mold structure 154, the first lower insulation layer 148, the support layer 140, and the sacrificial layer structure 130 on the first region M of the substrate 100. The channel holes 170 and the first holes 172 may extend into an upper portion of the common source plate 120 on the first region M of the substrate 100 in the vertical direction.

Additionally, dummy channel holes 176 and second holes 174 may be formed through the second insulating interlayer 162, the first insulating interlayer 160, the first preliminary mold structure 154, the first lower insulation layer 148, the support layer 140, and the sacrificial layer structure 130 on the second region W of the substrate 100. The dummy channel holes 176 and the second holes 174 may extend into the upper portion of the common source plate 120 on the second region W of the substrate 100 in the vertical direction.

The common source plate 120 may be exposed by a lower surface and a lower (e.g., a lowermost) sidewall of each of the channel holes 170, first holes 172, dummy channel holes 176, and second holes 174.

In example embodiments, the lower surfaces of the channel holes 170, first holes 172, dummy channel holes 176, and second holes 174 may be substantially coplanar with each other. For example, the lower surfaces of the channel holes 170, first holes 172, dummy channel holes 176, and second holes 174 may be substantially the same plane.

In example embodiments, the channel holes 170 and the first holes 172 may be formed together by the same etching process or the same series of etching processes. In some example embodiments, the channel holes 170 and the first holes 172 may be formed by different etching processes.

In example embodiments, the dummy channel holes 176 and the second holes 174 may be formed together by the same etching process or the same series of etching processes. In some example embodiments, the dummy channel holes 176 and the second holes 174 may be formed by different etching processes.

In some example embodiments, the channel holes 170, the first holes 172, the dummy channel holes 176, and the second holes 174 may be formed together by the same etching process or the same series of etching processes. It is preferable that the number of etching processes for forming the holes (e.g., the channel holes 170, the first holes 172, the dummy channel holes 176, and the second holes 174) is lesser to simplify process, but the number of etching processes may be adjusted to form various holes having target sizes.

A memory cell may comprise a channel structure 198*a* (referring to FIG. 12) formed in each of the channel holes 170 through subsequent processes. The channel holes 170 may be regularly arranged in the first direction X and second directions Y.

The first holes 172 may be disposed within the word line cutting region WC. The first holes 172 may be spaced apart from each other in the first direction X within the word line cutting region WC, and may be aligned in the first direction X. The first holes 172 may be transformed into a trench for cutting of word lines through subsequent processes.

A minimum distance between the adjacent first holes 172 in the first direction X is referred to as a first distance d1. A minimum distance between the first hole 172 and the channel hole 170 in the second direction Y is referred to as a second distance d2. The second distance d2 may be greater than ½ (half) of the first distance d1.

In some embodiments, an area of the first hole 172 may be larger than an area of the channel hole 170 in a plan view. In example embodiments, inner widths of the channel hole 170 and the first hole 172 may be different from each other (e.g., different from each other in the same direction). For example, as shown in FIG. 7, the inner width of the first hole 172 may be greater than the inner width of the channel hole 170 (e.g., greater than the inner width of the channel hole 170 in the same direction).

In some example embodiments, the inner width of the channel hole 170 and the first hole 172 may be substantially the same (e.g., substantially the same in the same direction).

A dummy channel structure 198*b* (referring to FIG. 12) may be formed in each of the dummy channel holes 176 through subsequent processes. The dummy channel structure 198*b* may serve as a support pillar to support the structures formed on the second region W, in performing subsequent processes (e.g., a word line replacement process). The dummy channel holes 176 may be regularly arranged in the first direction X and the second direction Y.

The second holes 174 may be disposed within the word line cutting region WC and a dummy cutting region DC. The second holes 174 may be spaced apart from each other in the first direction X within the word line cutting region WC and the dummy cutting region DC, and the second holes 174 may be aligned in the first direction X. Additionally, the second holes 174 may be aligned with the first holes 172 in the first direction X.

A minimum distance between the adjacent second holes 174 in the first direction X is referred to as a third distance d3. A minimum distance between the second hole 174 and the dummy channel hole 176 in the second direction Y is referred to as a fourth distance d4. The fourth distance d4 may be greater than ½ (half) of the third distance d3.

The third distance d3 and the first distance d1 may be different (e.g., different in the same direction). In example embodiments, the third distance d3 may be greater than the first distance d1 (e.g., greater than the first distance d1 in the same direction).

An arrangement density of the dummy channel holes 176 and an arrangement density of the second holes 174 may be lower than an arrangement density of the channel holes 170. For example, the number of the dummy channel holes 176 and the number of the number of second holes 174 within the same horizontal area may be smaller than the number of channel holes 170 within the same horizontal area.

In some embodiments, an area of the dummy channel hole 176 may be larger than an area of the channel hole 170 in a plan view. In example embodiments, the channel hole 170 may have the inner width less than an inner width of the dummy channel hole 176 (e.g., less than an inner width of the dummy channel hole 176 in the same direction). In some embodiments, an area of the second hole 174 may be larger than an area of the first hole 172 in a plan view. In example embodiments, the first hole 172 may have the inner width less than an inner width of the second hole 174 (e.g., less than an inner width of the second hole 174 in the same direction).

In example embodiments, the dummy channel hole 176 and the second hole 174 may have different inner widths (e.g., different inner widths in the same direction). However, the inner widths of the dummy channel hole 176 and the second hole 174 may not be limited thereto.

In some example embodiments, the inner widths of the dummy channel holes 176 and the second holes 174 may be substantially the same (e.g., substantially the same in the same direction).

Each of the channel hole 170, the dummy channel hole 176, the first hole 172, and the second hole 174 may have a circular shape (or a substantially circular shape) or an oval shape, in a plan view. In example embodiments, at least the channel hole 170 and the dummy channel hole 176 may have circular shapes (or substantially circular shapes), in a plan view. For example, each of the channel hole 170, the dummy channel hole 176, and the first hole 172 may have a circular shape (or a substantially circular shape), and the second hole 174 may be an oval shape having a long axis in the first direction X, in a plan view. In some embodiments, each of the channel hole 170, the dummy channel hole 176, the first hole 172, and the second hole 174 may be a circular shape (or a substantially circular shape), in a plan view.

Hereinafter, methods for manufacturing the vertical memory device may be described with reference to cross-sectional views taken along lines A-A' and B-B' of FIG. 7 and cross-sectional views taken along lines C-C' of FIG. 7. The cross-sectional views omit structures formed below the common source plate (e.g., the common source plate 120) to avoid complication of the drawing and show only the common source plate and structures formed on the common source plate.

Figure 8:
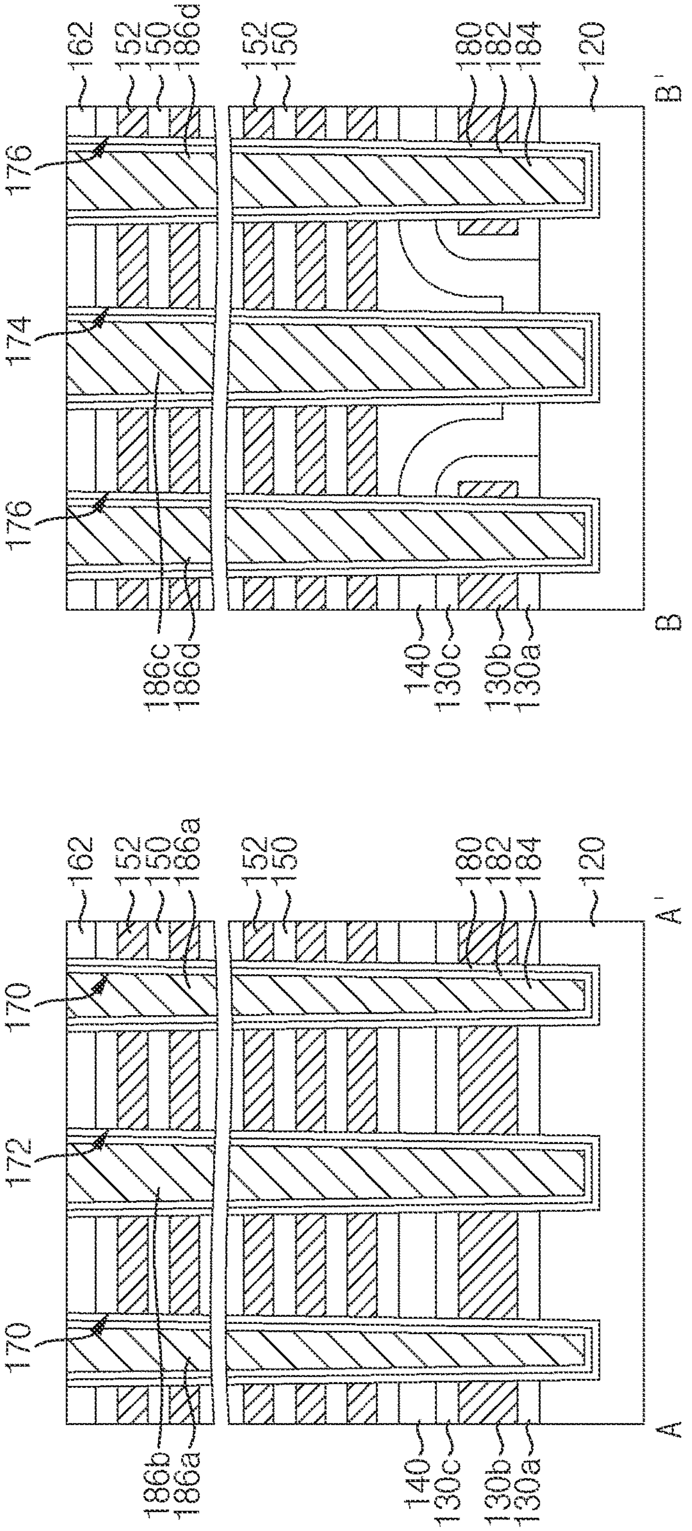
Figure 9:
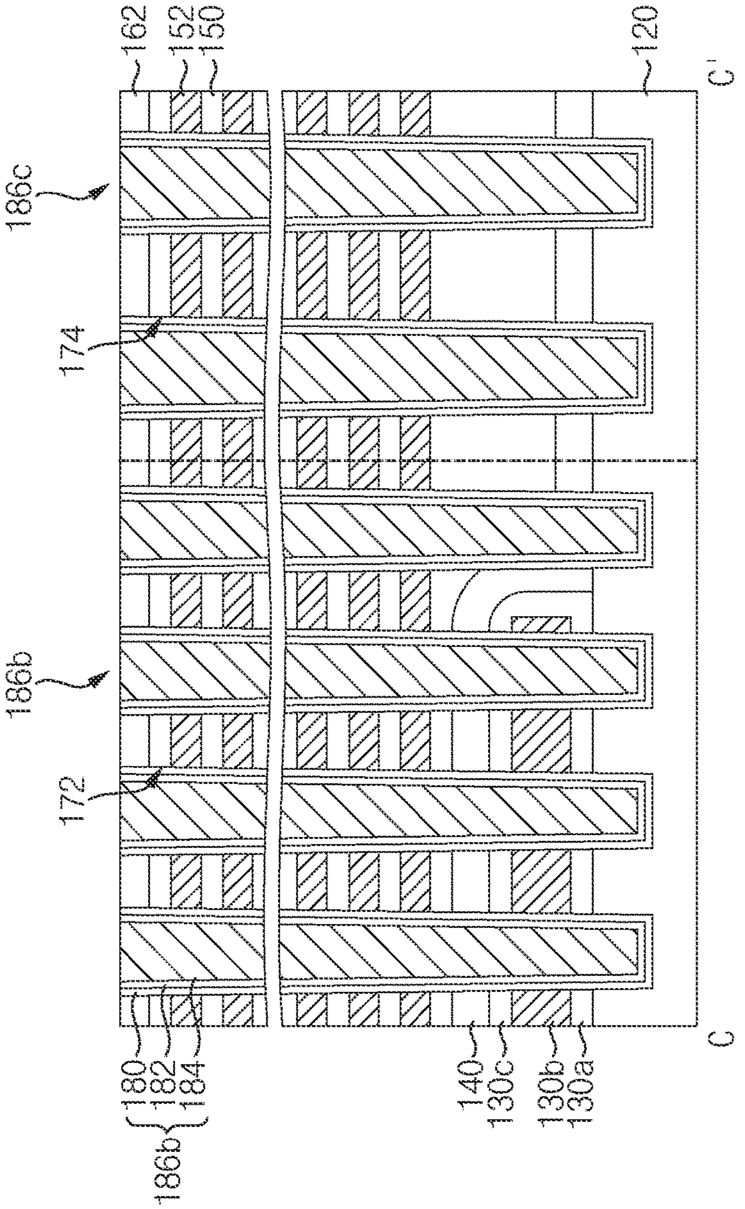
Figure 10:
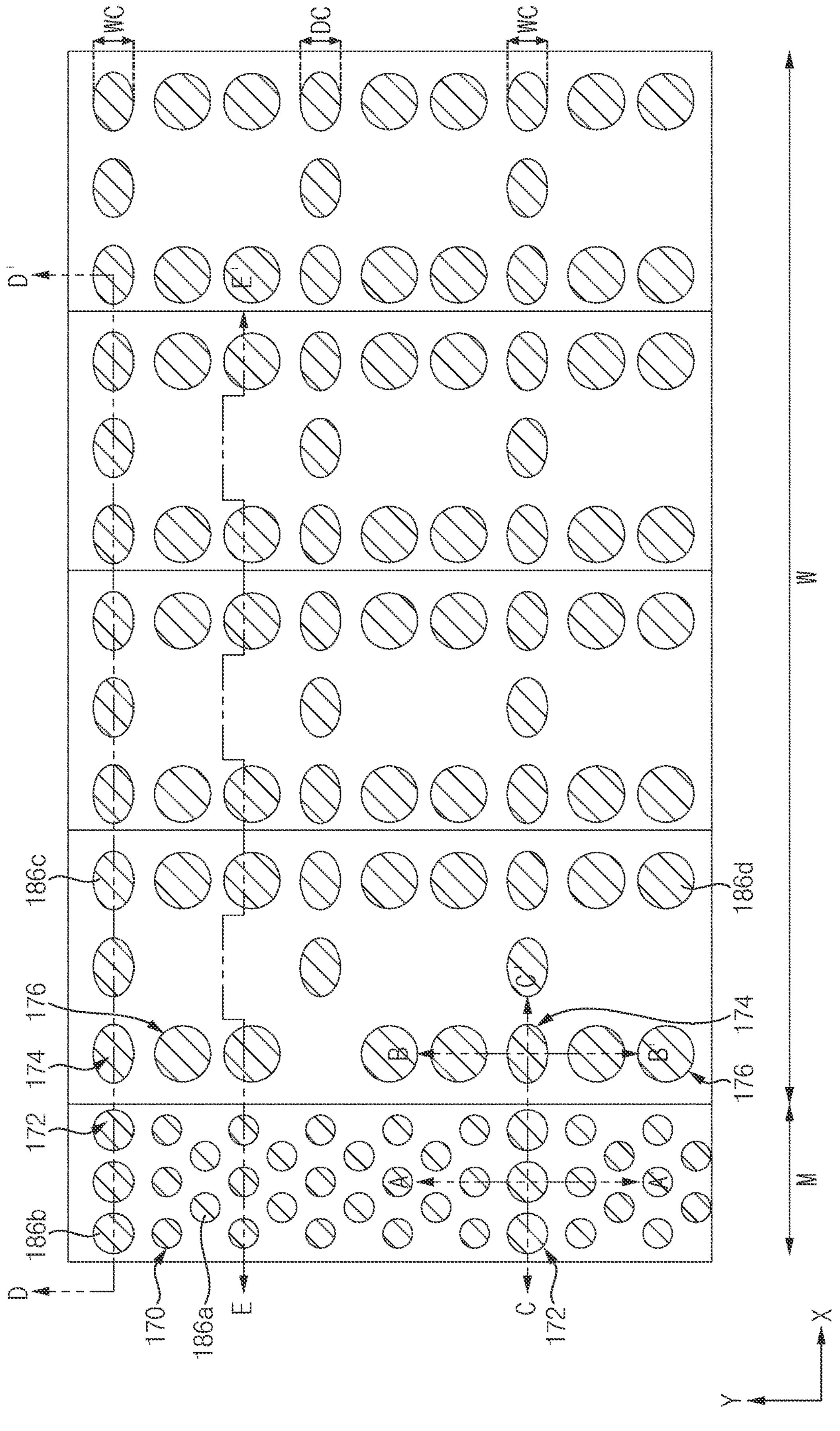

Referring to FIGS. 8 to 10, fifth, sixths, seventh, and eighth sacrificial patterns 186*a*, 186*b*, 186*c* and 186*d* may be formed in the channel hole 170, the first hole 172, the second hole 174, and dummy channel hole 176, respectively.

The fifth, sixths, seventh, and eighth sacrificial patterns 186*a*, 186*b*, 186*c* and 186*d* may include, for example, a silicon nitride layer pattern 180 and a silicon oxide layer pattern 182 formed (e.g., sequentially formed) along the surfaces of the channel hole 170, the first hole 172, the second hole 174, and dummy channel hole 176. A polysilicon pattern 184 may be formed on the silicon oxide layer pattern 182. The polysilicon pattern 184 may completely fill the channel holes 170, first holes 172, second holes 174, and dummy channel holes 176. Hereinafter, the term "fill" may refer to "partially fill" and/or "completely fill" unless clearly stated otherwise.

Figure 11:
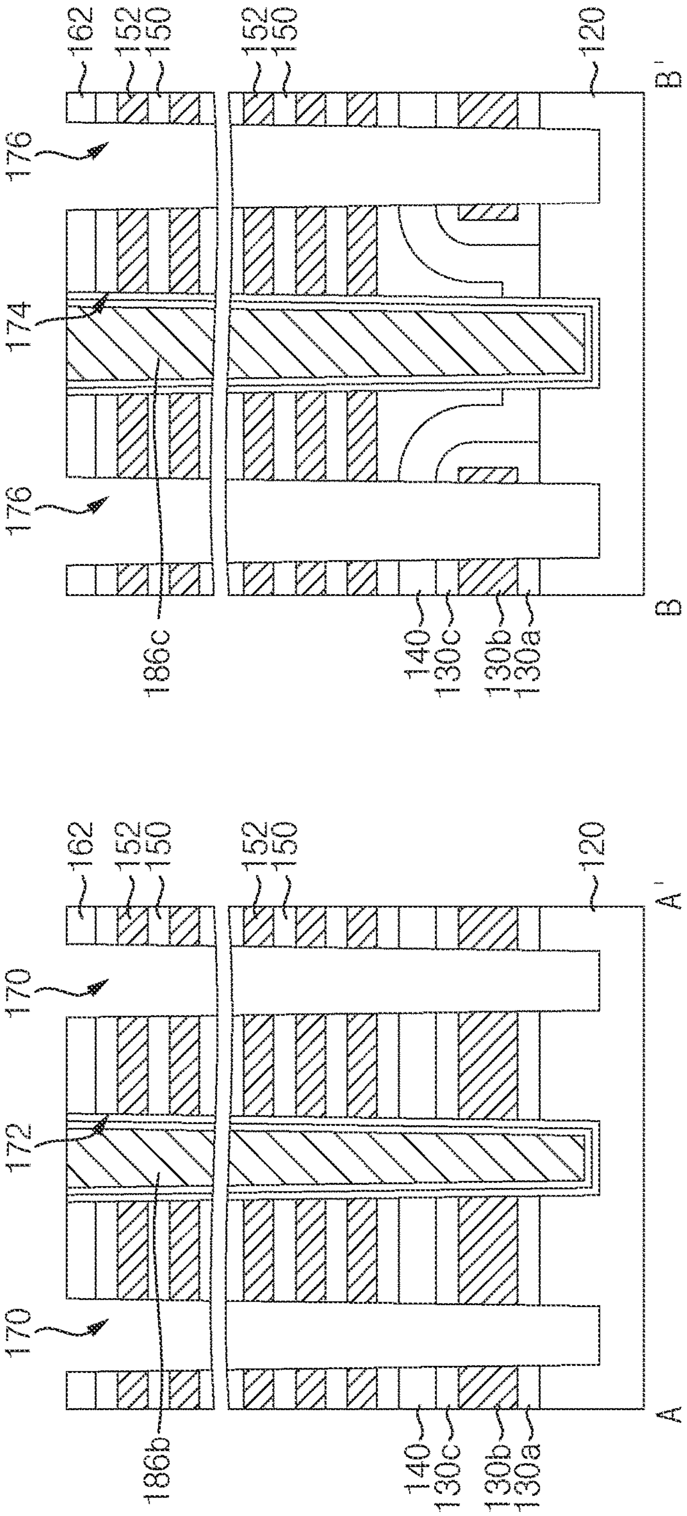

Referring to FIG. 11, A first etch mask pattern (not shown) selectively exposing the fifth and eighth sacrificial patterns 186*a* and 186*d* may be formed on the second insulating interlayer 162 and the fifth, sixth, seventh, and eighth sacrificial patterns 186*a*, 186*b*, 186*c*, and 186*d*. The fifth and eighth sacrificial patterns 186*a* and 186*d* may be removed using the first etch mask pattern to form the channel holes 170 and dummy channel holes 176 again.

Figure 12:
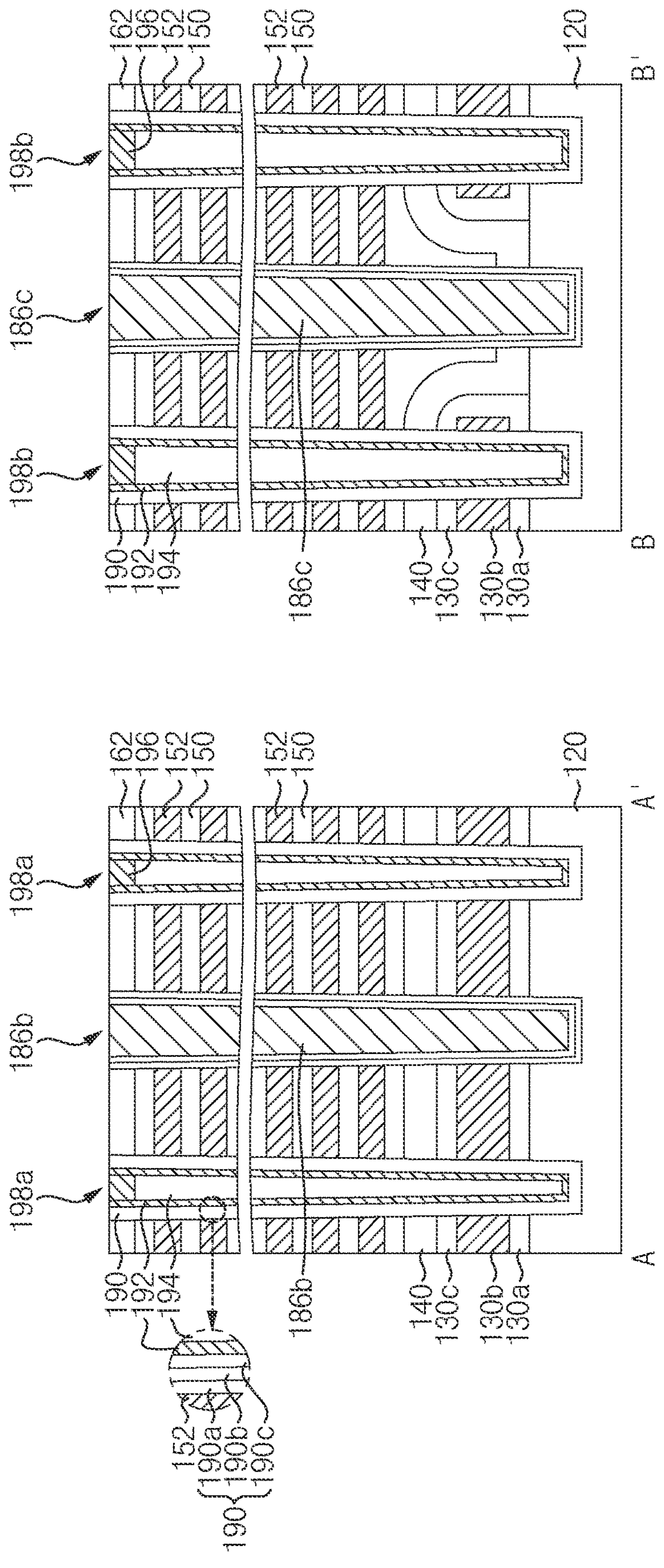
Figure 13:
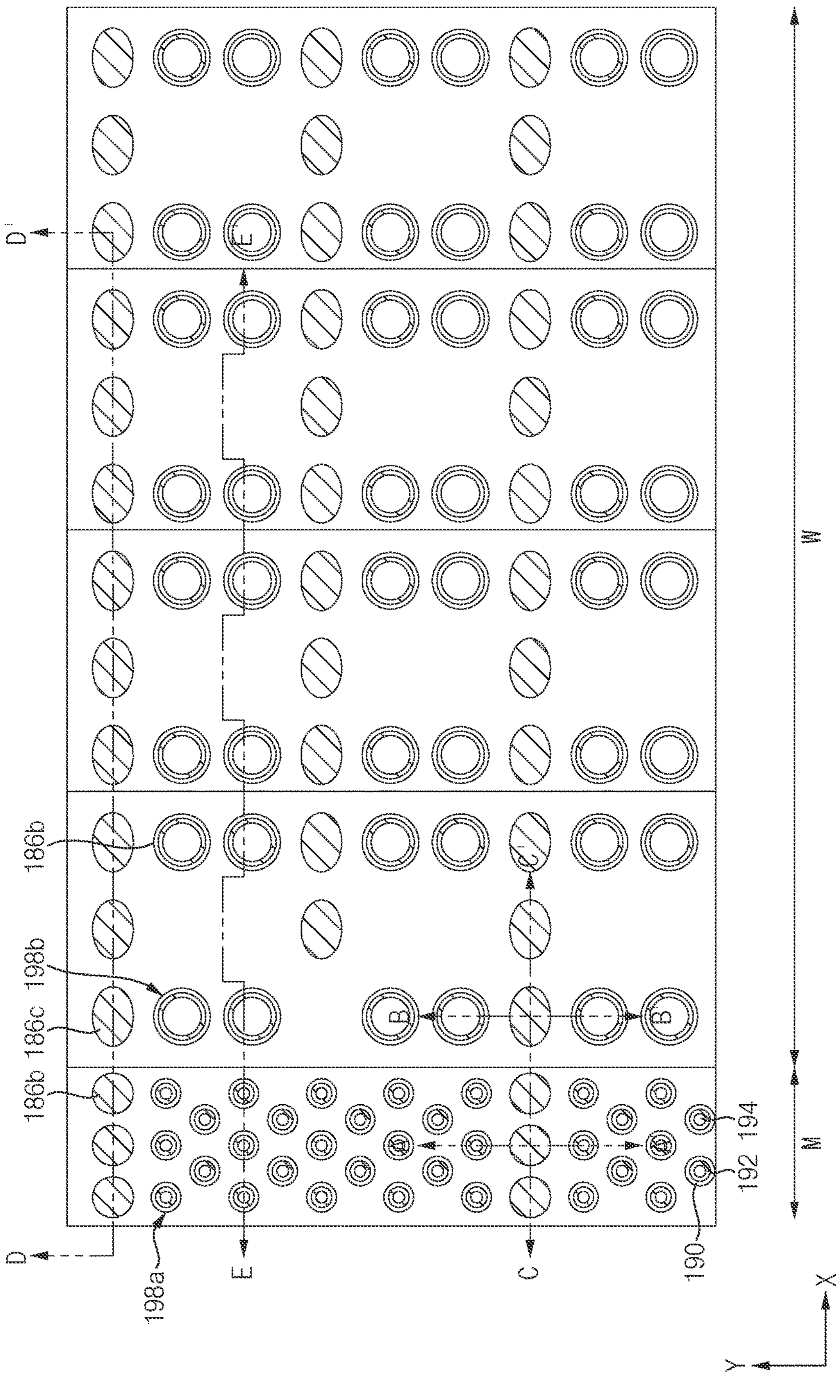

Referring to FIGS. 12 and 13, the channel structure 198*a* and the dummy channel structure 198*b* may be formed in the channel hole 170 and the dummy channel hole 176, respectively.

In example embodiments, each of the channel structure 198*a* and the dummy channel structure 198*b* may include a charge storage structure 190, a channel 192, a filling insulation pattern 194, and a capping pattern 196. Each of the charge storage structure 190 and the channel 192 may be formed (e.g., sequentially formed) along surface profile of each of the channel hole 170 and the dummy channel hole 176, and may have, e.g., a cup shape. The filling insulation pattern 194 may fill most of an internal space on the channel 192. The capping pattern 196 may be formed on the filling insulation pattern 194 (e.g., on an upper surface of the filling insulation pattern 194) and may contact an upper portion of the channel 192. The charge storage structure 190 may include a first blocking insulation layer 190*a*, a charge storage layer 190*b*, and a tunnel insulation layer 190*c* sequentially stacked on a sidewall of the channel hole 170 and/or a sidewall of the dummy channel hole 176. The channel 192 and the capping pattern 196 may include, for example, polysilicon.

Figure 14:
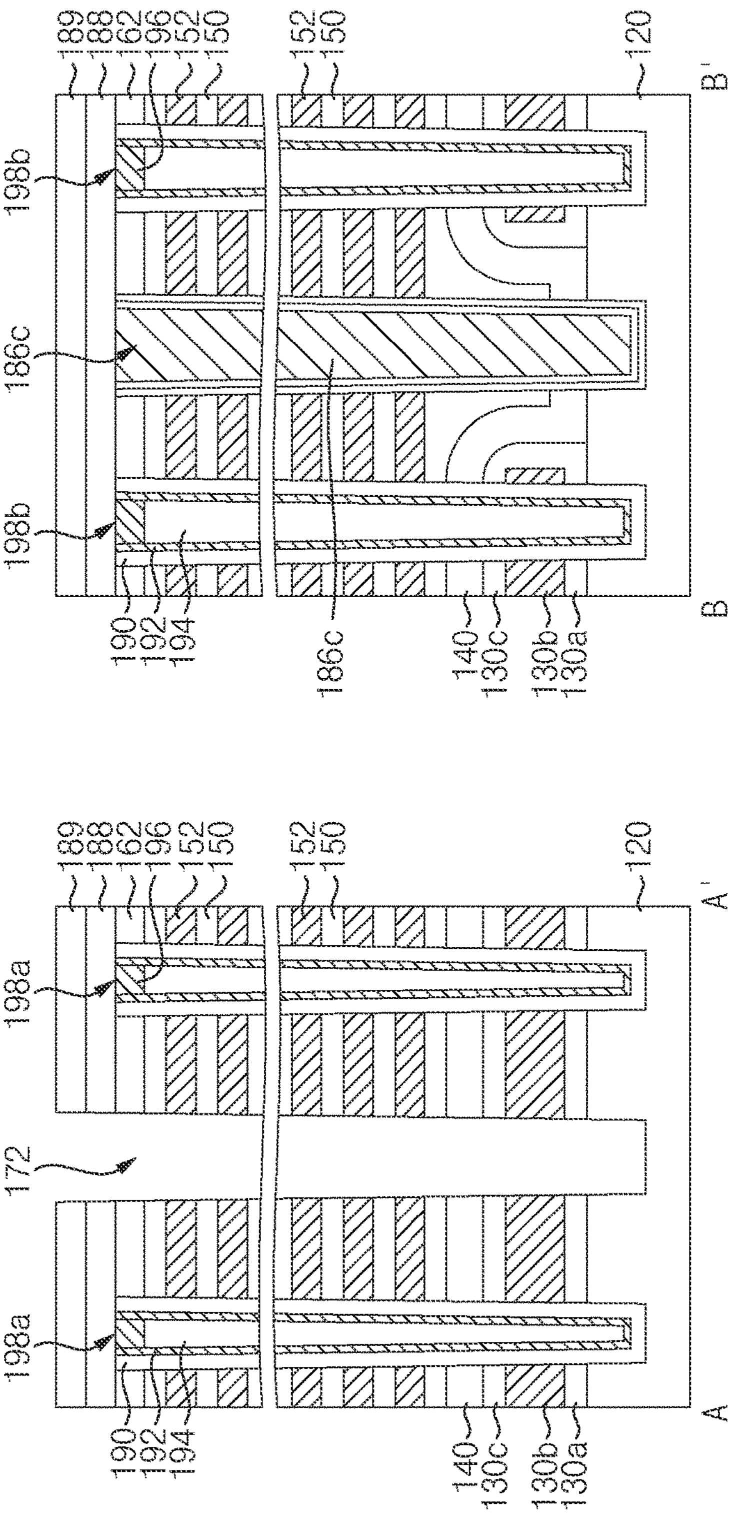
Figure 15:
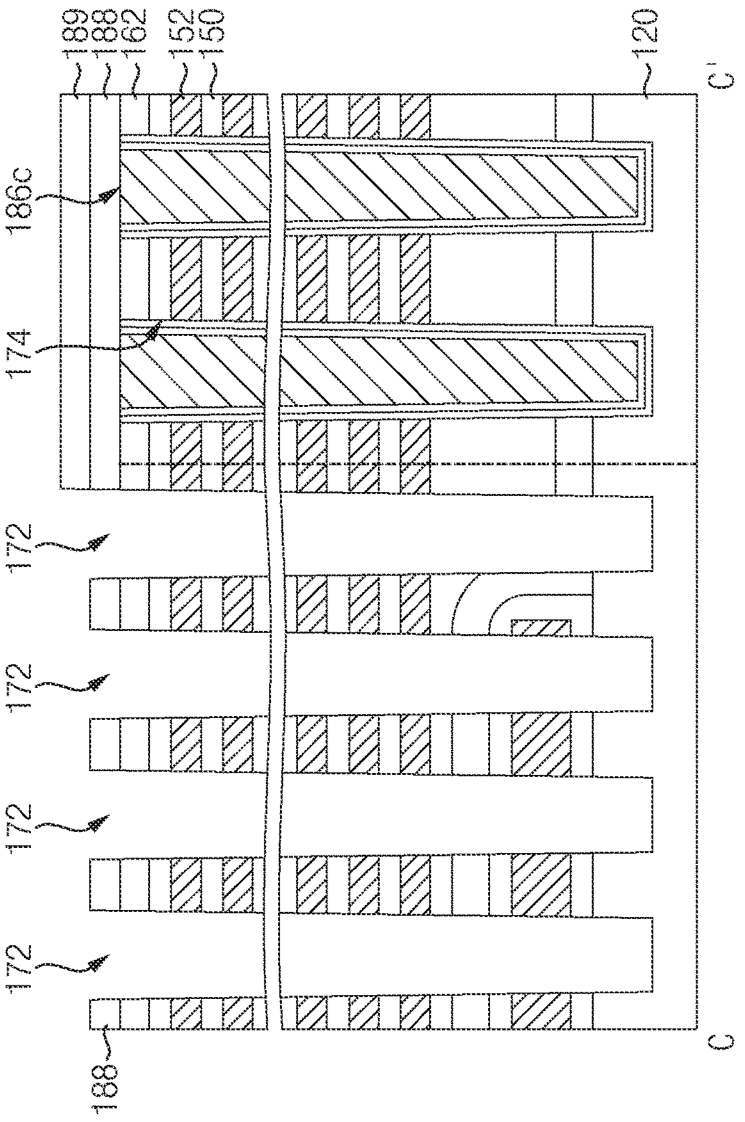
Figure 16:
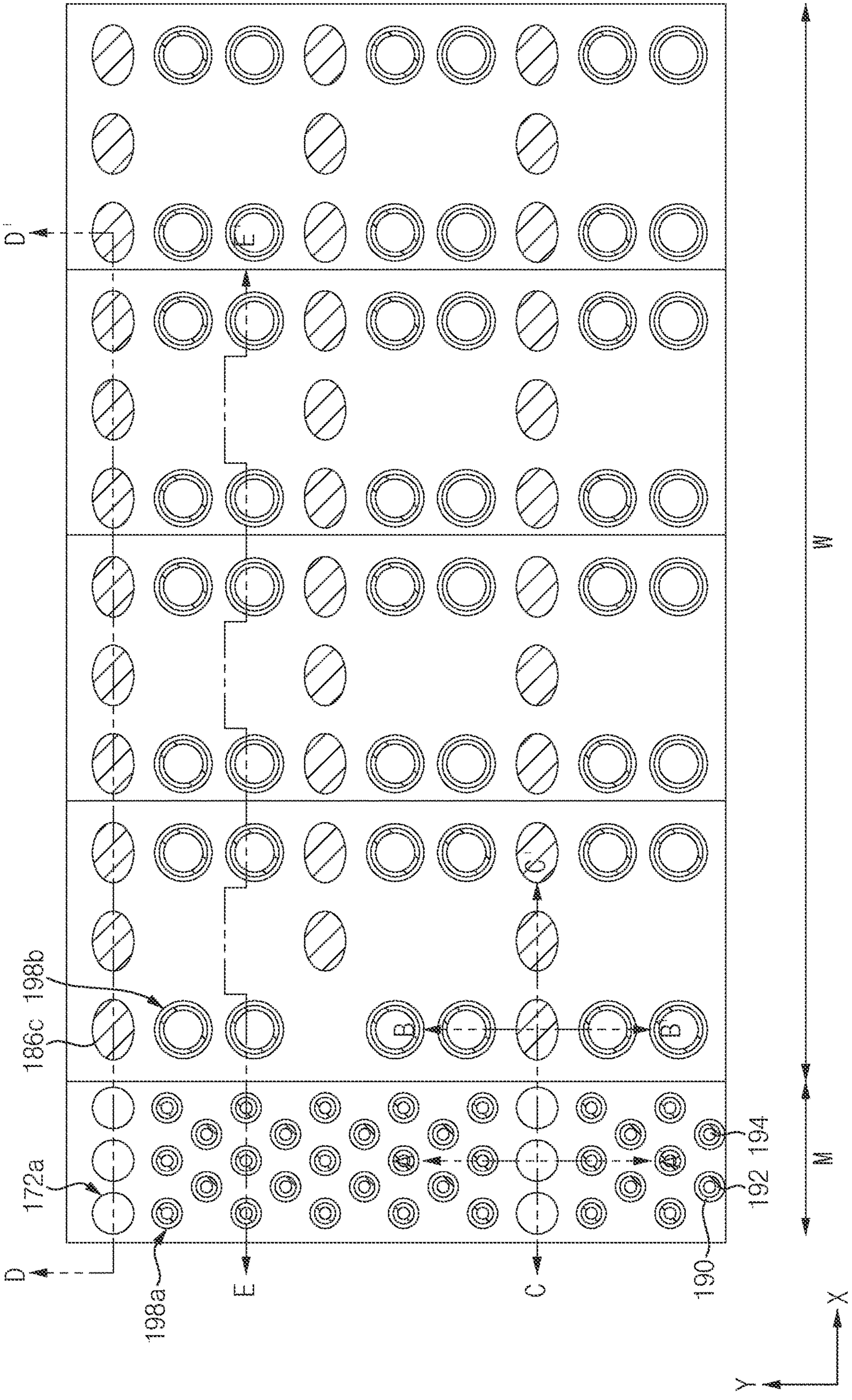

Referring to FIGS. 14 to 16, a third insulating interlayer 188 may be formed on (e.g., to cover) the second insulating interlayer 162, the channel structure 198*a*, and the dummy channel structure 198*b*. A second etch mask pattern 189 selectively exposing a region corresponding to the word line cutting region (e.g., the word line cutting region WC) on the first region M may be formed on the third insulating interlayer 188. The second etch mask pattern 189 (e.g., a sidewall of the second etch mask pattern 189) may face the sixth sacrificial patterns 186*b* in the first holes 172.

Thereafter, (at least a portion of) the third insulating interlayer 188 and the sixth sacrificial patterns 186*b* may be removed using the second etch mask pattern 189 to form the first holes 172 again.

In this case, since the second holes 174 are covered by the second etch mask pattern 189, the seventh sacrificial patterns 186*c* formed in the second holes 174 may not be removed and remain.

Figure 17:
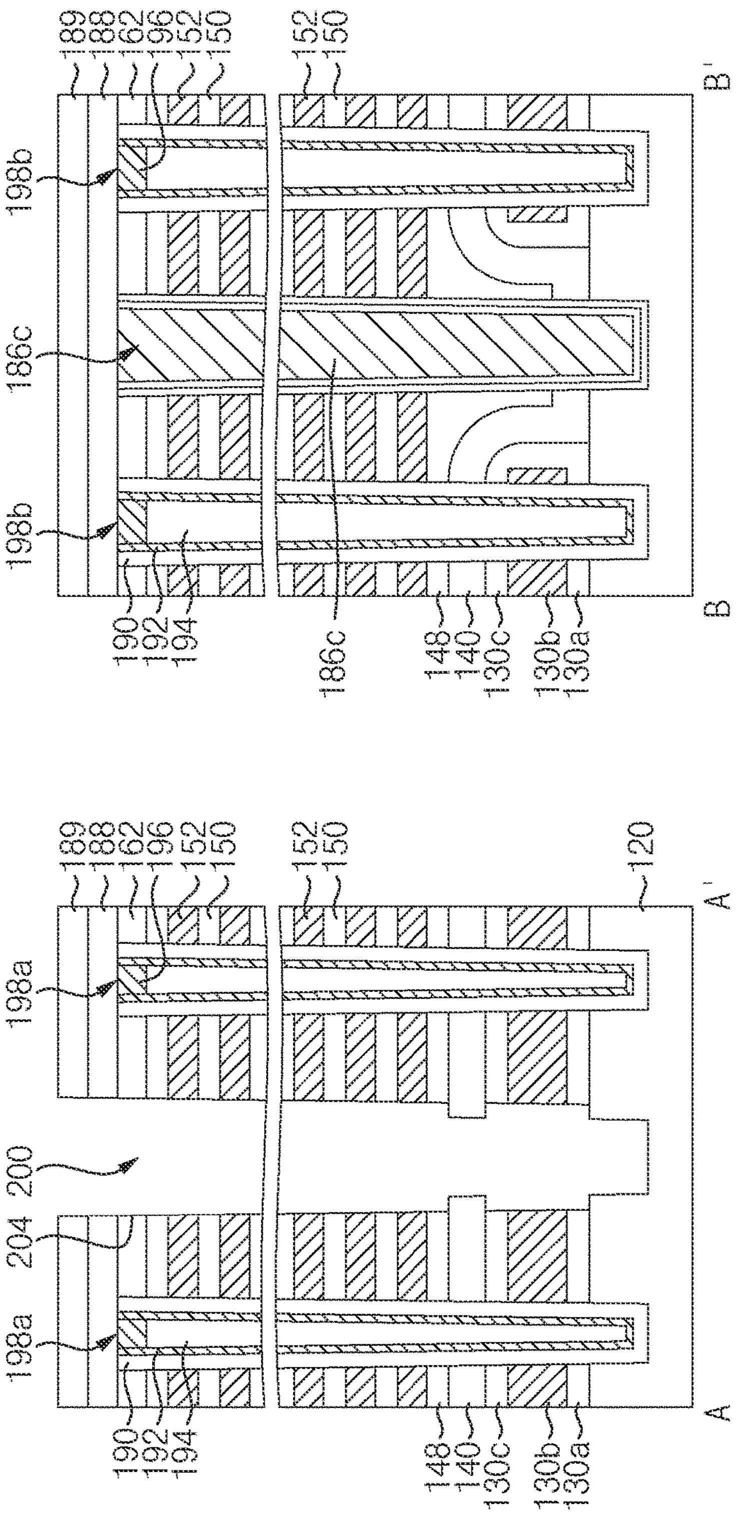
Figure 18:
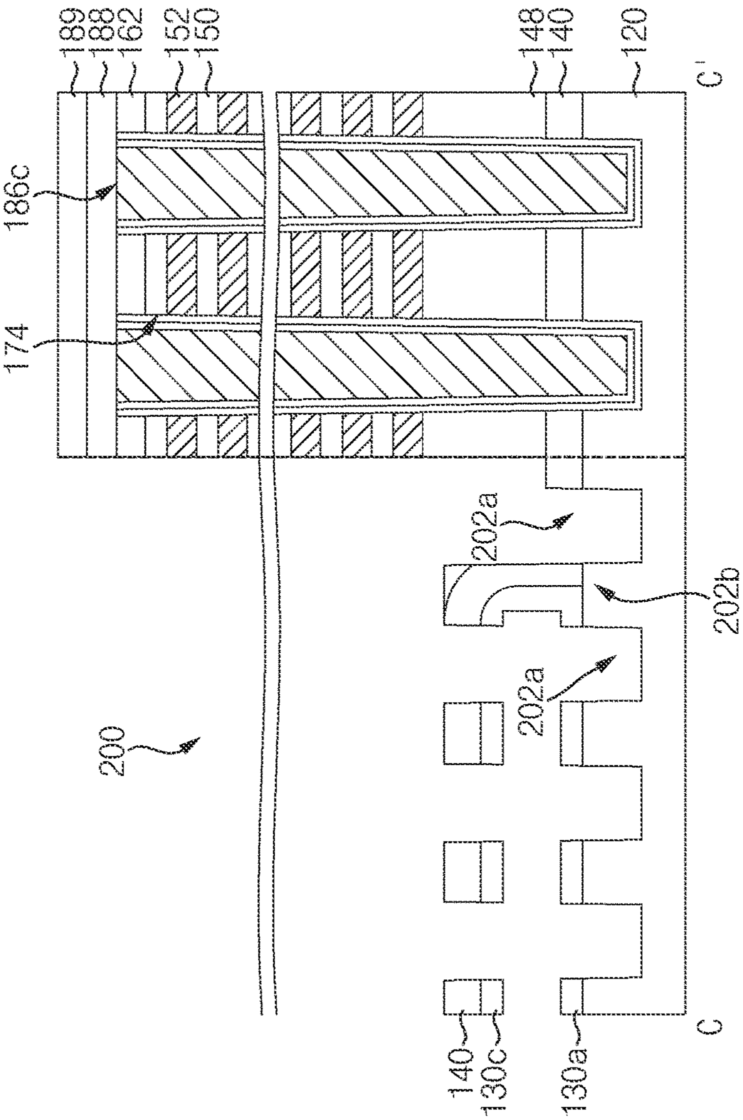
Figure 19:
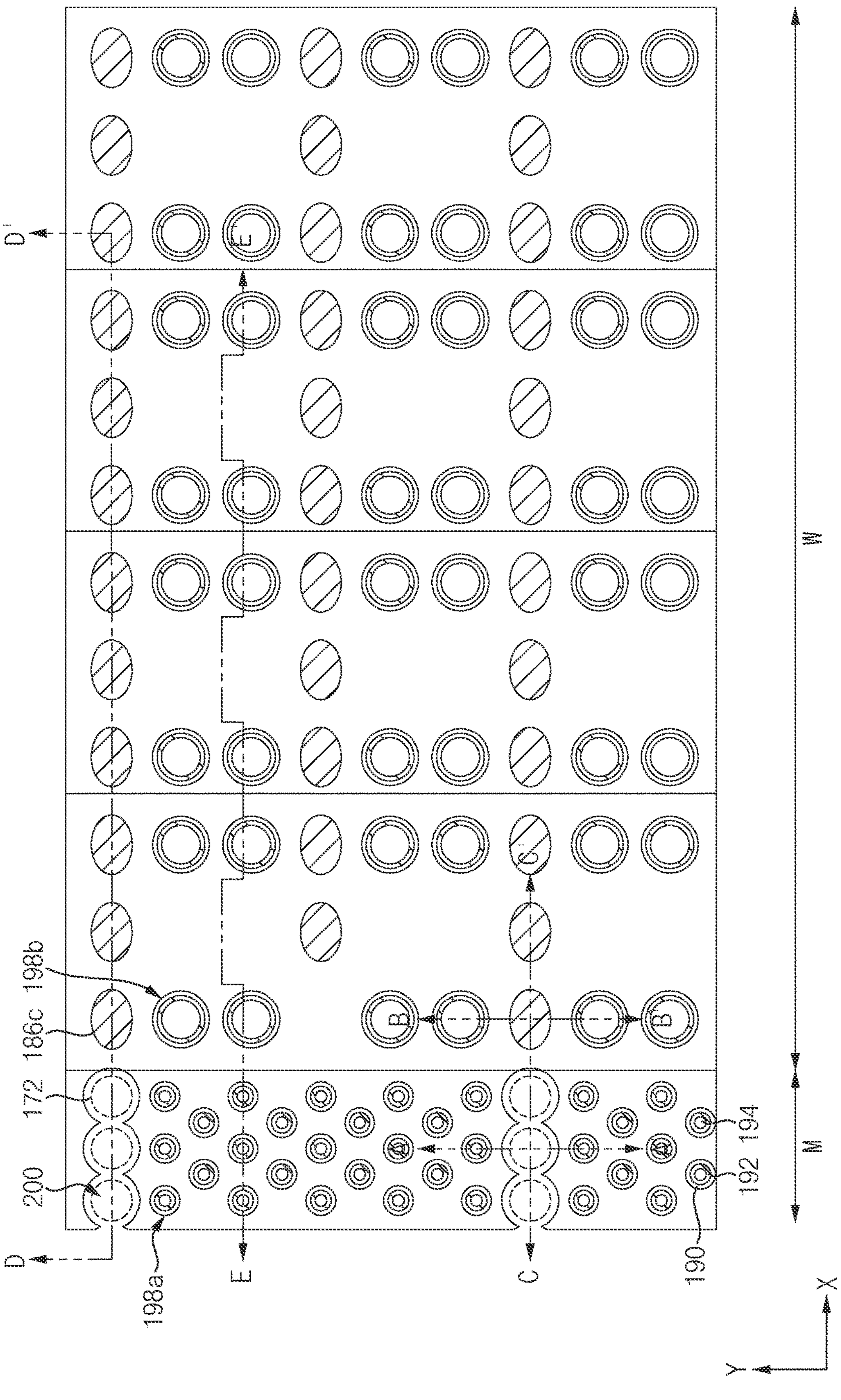

Referring to FIGS. 17 to 19, sidewalls of the first holes 172 may be etched so that adjacent first holes 172 may be connected to each other in the first direction X to form a second opening 200 having a shape of a single trench. In the etching process, the inner width (e.g., the inner width in the first direction X) of each of the first holes 172 may be expanded (e.g., expanded in the first direction X) so that the first holes 172 may be connected to each other. The etching process of the sidewalls of the first holes 172 may be an isotropic etching process, e.g., a wet etching process.

In the etching process, the first lower insulation layer 148, first insulation layers 150, and fourth sacrificial layers 152 exposed by the sidewalls of the first holes 172 may be partially etched. Additionally, the sacrificial layer structure 130 (e.g., the first sacrificial layer 130*a*, the second sacrificial layer 130*b*, and/or the third sacrificial layer 130*c*) exposed by the sidewalls of the first holes 172 may be partially removed.

In the etching process, the common source plate 120 and the support layer 140 exposed by the first holes 172 may be hardly etched (or may not be etched). For example, the common source plate 120 and the support layer 140 exposed by the first holes 172 may be etched less than the first lower insulation layer 148, first insulation layers 150, fourth sacrificial layers 152, and/or the sacrificial layer structure 130 exposed by the first holes 172.

The second opening 200 may be formed only on the first region M of the substrate 100, and may extend in the first direction X. The common source plate 120 may be exposed by a lower portion (e.g., a lower surface and/or a lower sidewall) of the second opening 200.

To form the second opening 200 extending in the first direction X, the first lower insulation layer 148, first insulation layers 150 and fourth sacrificial layers 152 exposed by the sidewall of the first holes 172 may be etched by at least a thickness of ½ (half) of the first distance d1. In addition, the first lower insulation layer 148, first insulation layers 150 and fourth sacrificial layers 152 exposed by the sidewall of the first holes 172 may be etched by a thickness less than the second distance d2, so that the channel structure 198*a* may not be exposed by a sidewall of the second opening 200.

Since the first holes 172 have the circular shape (or a substantially circular shape) or the oval shape in a plan view, the second openings 200 formed by expanding the first holes 172 may not have the same width in the second direction Y depending on positions thereof. The second opening 200 may include a first portion having a maximum width in the second direction Y and a second portion having a minimum width in the second direction Y. The first portion and the second portion may be alternately and repeatedly disposed in the first direction X. The width of the second opening 200 in the second direction Y may gradually decrease from the first portion to the second portion in the first direction X, and may gradually increase again from the second portion to the first portion (e.g., the next first portion) in the first direction X. In a plan view, the second opening 200 may have a connected circular shape or a connected oval shape.

In example embodiments, the first preliminary mold structures 154 on the first region M of the substrate 100 may be separated from each other by the second opening 200.

In the cross-sectional view cut in the first direction X, as shown in FIG. 18, the lower portion of the second opening 200 may include portions corresponding to the first holes 172 and portions between the first holes 172 repeatedly disposed. In the lower portions of the second opening 200, upper portions (e.g., upper surfaces) of the common source plate 120 corresponding to lower portions (e.g., lower surfaces) of the first holes 172 may be already etched before the etching process for forming the second opening 200. Therefore, the upper portion of the common source plate 120 of corresponding to the lower portion of the first holes 172 may comprise a first recess 202*a* after the etching process for forming the second opening 200. However, a portion of the common source plate 120 between the adjacent first holes 172 may not be etched before the etching process for forming the second opening 200 and after the etching process for forming the second opening 200, so that the portion (e.g., the upper portion) of the common source plate 120 between the adjacent first holes 172 may comprise a first protrusion 202*b*. Therefore, the upper surface of the common source plate 120 in the second opening 200 may have the first recess 202*a* and the first protrusion 202*b* alternately and repeatedly arranged in the first direction X.

The support layer 140 may be disposed to face the first protrusion 202*b*, and at least a portion of the support layer 140 may be spaced apart from an upper surface of the first protrusion 202*b*.

In the following description, a portion of the second opening 200 positioned higher than a lower surface of the support layer 140 is referred to as an upper portion of the second opening 200, and a portion of the second opening 200 positioned lower than the lower surface of the support layer 140 is referred to as a lower portion of the second opening 200.

Figure 20:
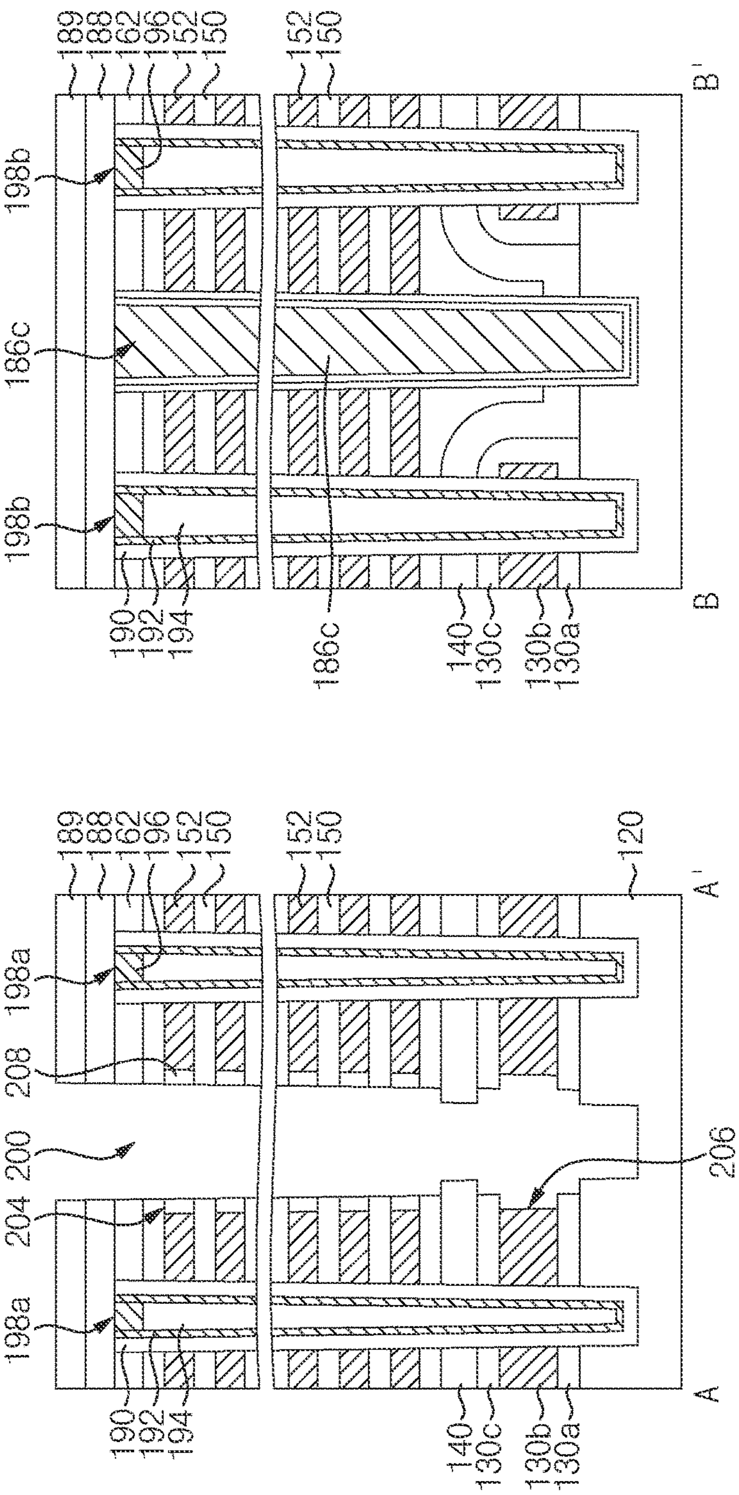

Referring to FIG. 20, the fourth sacrificial layer 152 and the second sacrificial layer 130*b* exposed by the sidewall of the second opening 200 may be partially removed. Accordingly, a second recess 204 may be formed between the adjacent first insulation layers 150 exposed by the sidewall of the second opening 200, and a third recess 206 may be formed at a removed portion of the second sacrificial layer 130*b*. A vertical height (e.g., a length in the vertical direction) of the second recess 204 may be less than a vertical height (e.g., a length in the vertical direction) of the third recess 206.

A second spacer layer may be formed along an inner surface of the second opening 200 and the upper surface of the third insulating interlayer 188. The second spacer layer may be formed (e.g., folded) within the second recess 204 to fill the second recess 204. The second spacer layer may be formed so as not to fold within the third recess 206. Accordingly, the second spacer layer may be formed along a surface of the third recess 206 without filling the third recess 206.

The second spacer layer may include an insulation material having an etch selectivity with respect to silicon nitride. The second spacer layer may include, e.g., silicon oxide.

The second spacer layer may be partially removed so that the second spacer layer remains only inside the second recess 204 to form a second spacer pattern 208 only inside the second recess 204. The removing process may include a wet etching process. The second spacer pattern 208 may cover sidewalls of the fourth sacrificial layers 152. Accordingly, the fourth sacrificial layers 152 may not be exposed by the second opening 200. The second spacer layer on the surface of the third recess 206 may be completely removed, and thus the second sacrificial layer 130*b* may be exposed by the lower portion of the second opening 200.

Figure 21:
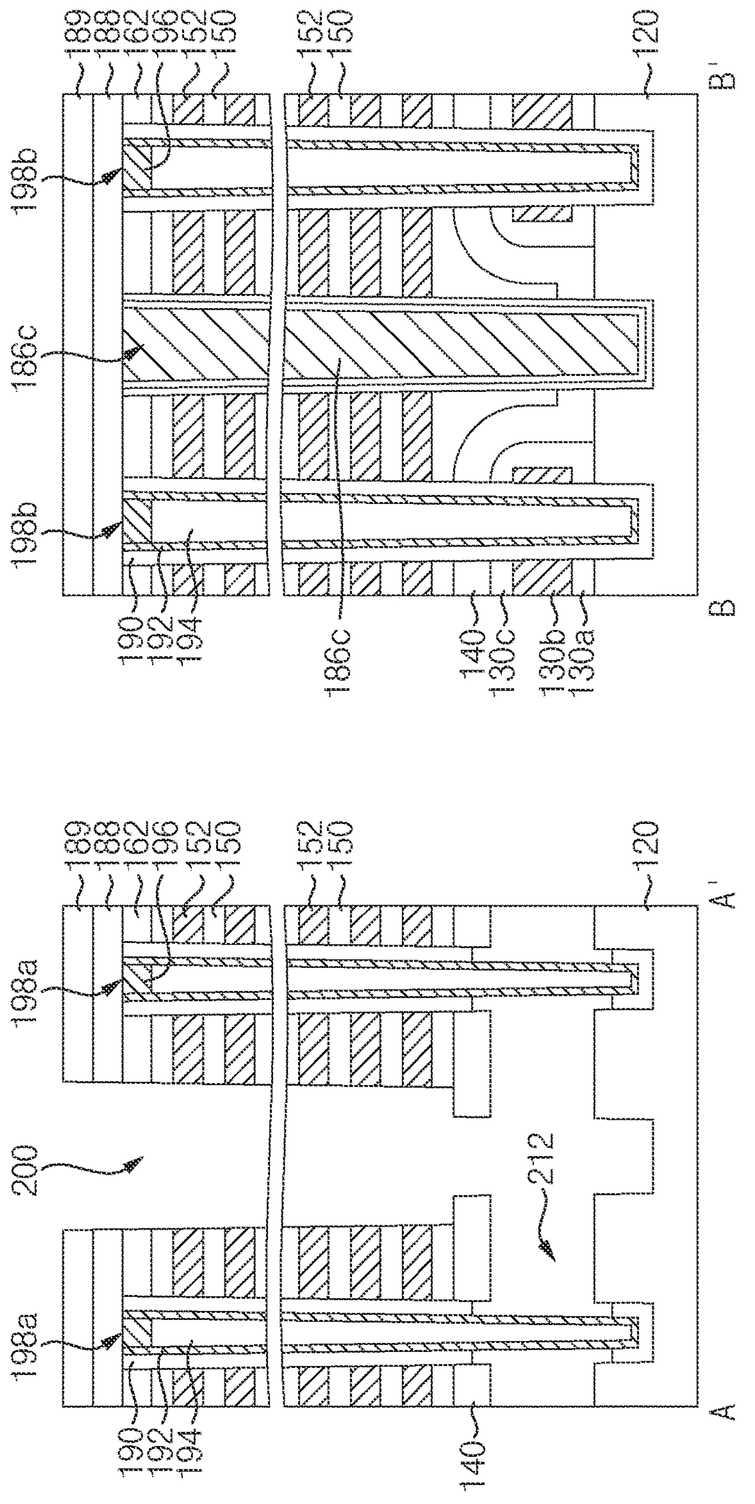

Referring to FIG. 21, the second sacrificial layer 130*b* exposed by the lower portion of the second opening 200 may be completely removed to form a preliminary first gap.

In the first region M, the second spacer pattern 208 may be formed on the sidewalls of the fourth sacrificial layers 152, so that the fourth sacrificial layer 152 may not be removed by the removing process of the second sacrificial layer 130*b*.

A seventh sacrificial pattern 186*c* may remain in the second holes 174 on the second region W, before removing the second sacrificial layer 130*b*. Therefore, in the process of removing the second sacrificial layer 130*b*, the fourth sacrificial layer 152 on the second region W may not be exposed to the outside, and thus the fourth sacrificial layer 152 may not be etched. Therefore, in the process of etching the second sacrificial layer 130*b*, defects that occur as at least a portion of the fourth sacrificial layer 152 on the second region W are etched together may be decreased.

At least a portion of the charge storage structure 190 may be exposed by the preliminary first gap. At least a portion of the exposed portion of the charge storage structure 190 may be removed by a wet etching process. Accordingly, the charge storage structure 190 may be separated into an upper portion and lower portion, and a lower sidewall of the channel 192 (a sidewall of the lower portion of the channel 192) may be exposed between the upper and lower portions of the charge storage structure 190.

Particularly, the first blocking insulation layer 190*a* (referred to as FIG. 12) exposed by the first preliminary gap may be removed. When the first blocking insulation layer 190*a* is removed, the first sacrificial layer 130*a* and the third sacrificial layer 130*c* exposed by the first preliminary gap may be (at least partially) removed together. In addition, the second spacer pattern 208 exposed by the sidewall of the second opening 200 may be removed together, and the first insulation layer 150 may be partially removed together.

Thereafter, the exposed charge storage layer 190*b* (referred to as FIG. 12) may be removed. When the charge storage layer 190*b* is removed, the fourth sacrificial layer 152 exposed by the sidewall of the second opening 200 may be partially removed together. The exposed tunnel insulation layer 190*c* (referred to as FIG. 12) may be removed. When the tunnel insulation layer 190*c* is removed, both the first sacrificial layer 130*a* and the third sacrificial layer 130*c* exposed by the first preliminary gap may be completely removed together, and the first insulation layer 150 exposed by the sidewall of the second opening 200 may be partially removed together When the above processes are performed, a first gap 212 may be formed to be connected to a lower sidewall of the second opening 200. Additionally, as an upper sidewall of the second opening 200 may be partially etched (e.g., may be expanded) during the process for forming the first gap 212, an upper width of the second opening 200 may increase. The common source plate 120 may be exposed by a lower surface of the first gap 212, and the lower surface of the support layer 140 may be exposed by an upper surface of the first gap 212.

Figure 22:
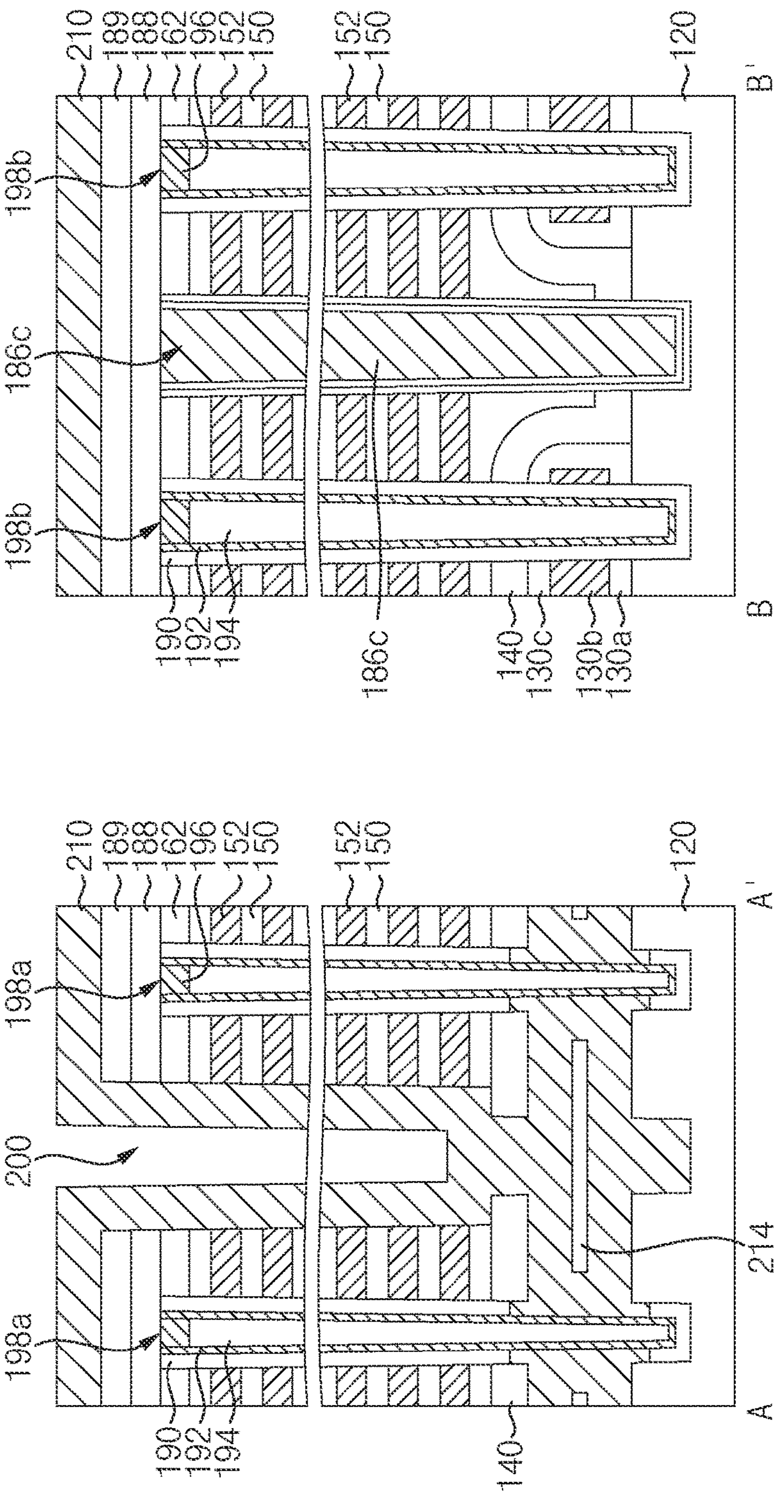
Figure 23:
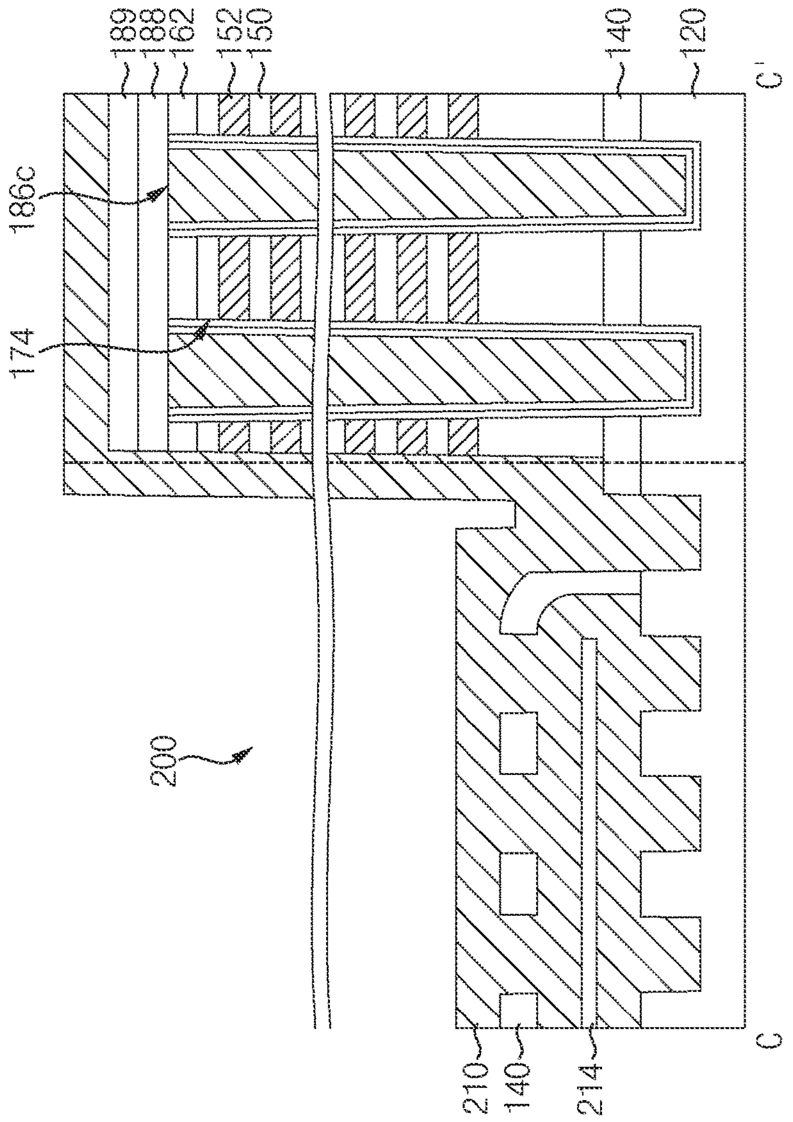

Referring to FIGS. 22 and 23, a channel connection layer 210 may be formed along surface profiles of the second opening 200 and the first gap 212. The channel connection layer 210 may also be formed on an upper surface of the second etch mask pattern 189.

The channel connection layer 210 may include, e.g., polysilicon.

The channel connection layer 210 may be formed along the sidewall of the second opening 200 and may at least partially fill the lower portion of the second opening 200 and an inner portion of the first gap 212. The channel connection layer 210 may be formed along the upper and lower surfaces of the first gap 212, and the channel connection layer 210 may be folded in the first gap 212 to at least partially fill the first gap 212. In example embodiments, a seam 214 may be included in the channel connection layer 210 in the first gap 212. The seam 214 may extend a horizontal direction at a center portion in the vertical direction of the first gap 212. In some example embodiments, the seam 214 may not be formed.

The channel connection layer 210 may completely fill the first recess 202*a* of the upper surface of the common source plate 120 at the lower surface of the second opening 200.

Figure 24:
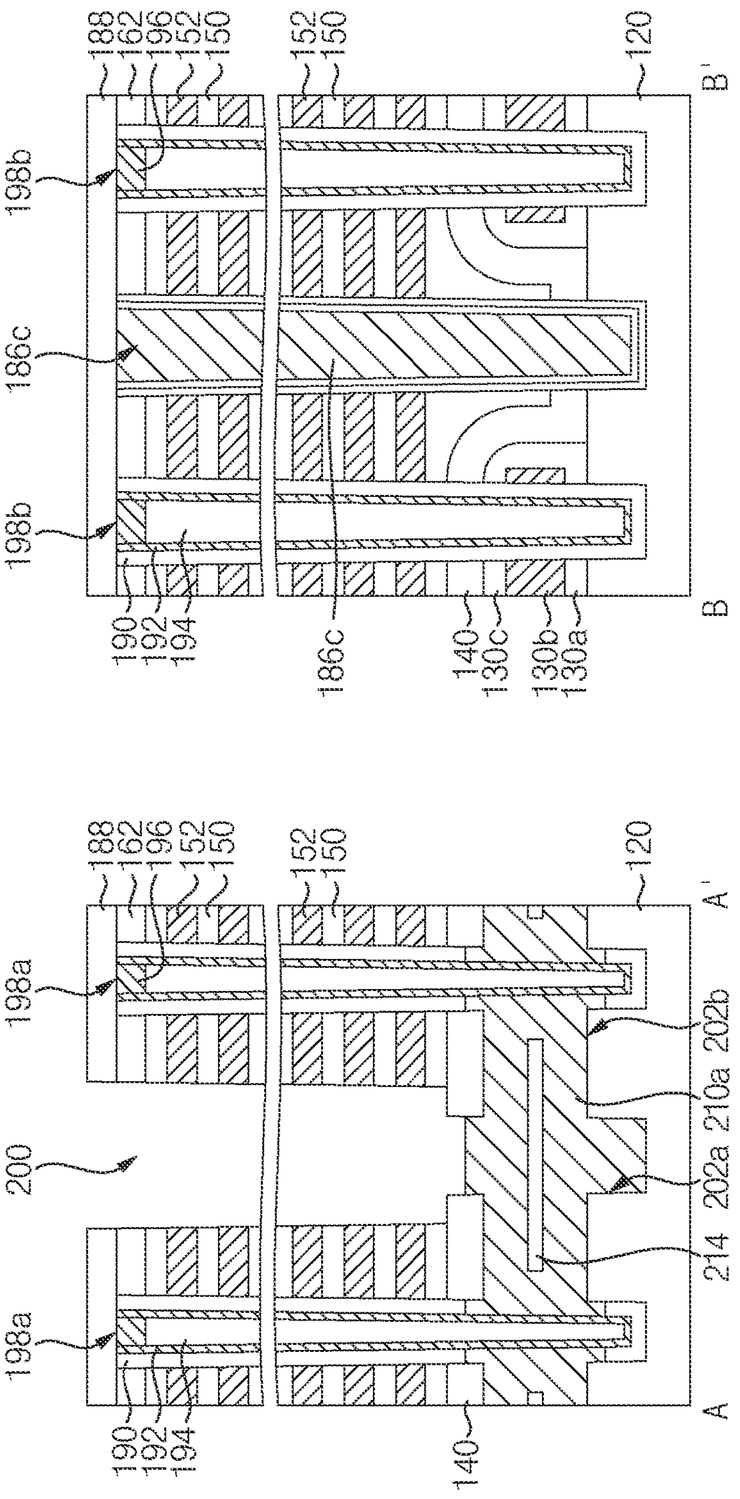
Figure 25:
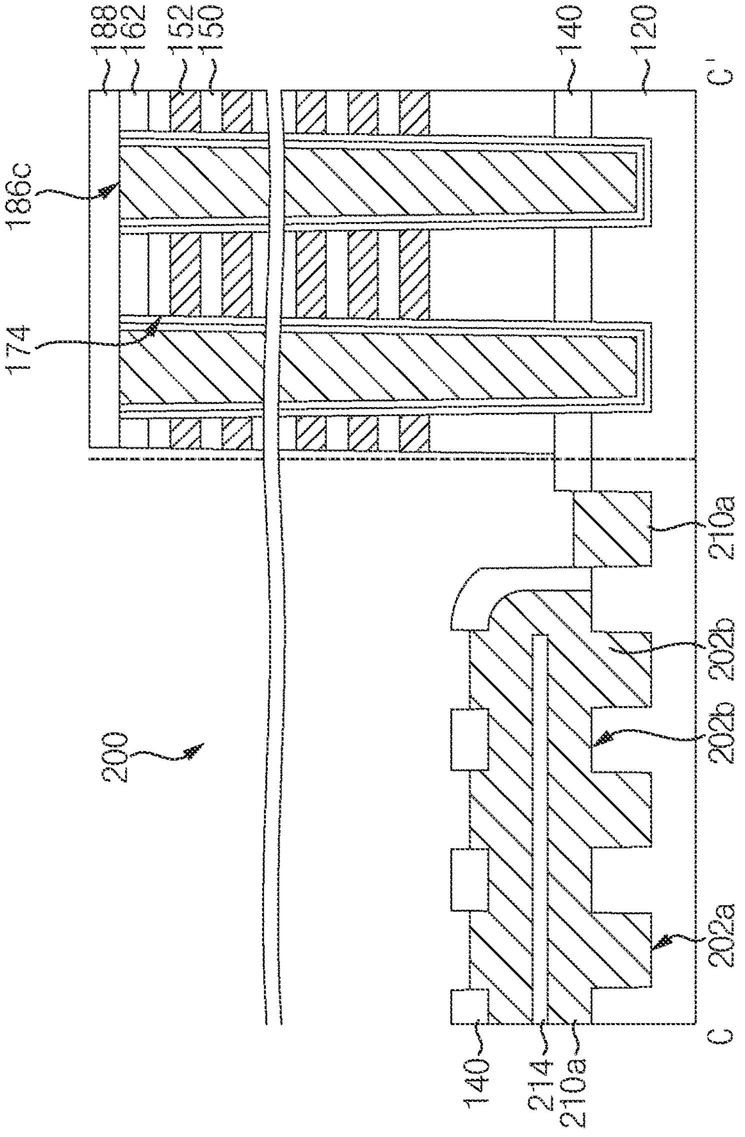

Referring to FIGS. 24 and 25, the channel connection layer 210 on the upper portion of the second opening 200 and on the second etch mask pattern 189 may be removed to form a channel connection pattern 210*a* in the first gap 212 and in the first recess 202*a* of the upper surface of the common source plate 120 at the lower surface of the second opening 200. In the above process, the second etch mask pattern 189 may also be removed together.

Neighboring channels 192 may be electrically connected to each other by the channel connection pattern 210*a*. Additionally, the channels 192 may be electrically connected to the common source plate 120.

That is, the channel connection pattern 210*a* formed in the first recess 202*a* may protrude downwardly. A lower surface of the channel connection pattern 210*a* formed in the word line cutting region WC may include downward protrusions repeatedly arranged in the first direction X.

In example embodiments, a lower surface of the channel connection pattern 210*a* that is inside the first recess 202*a* may be substantially coplanar with a lower surface of the channel structure 198*a*.

Figure 26:
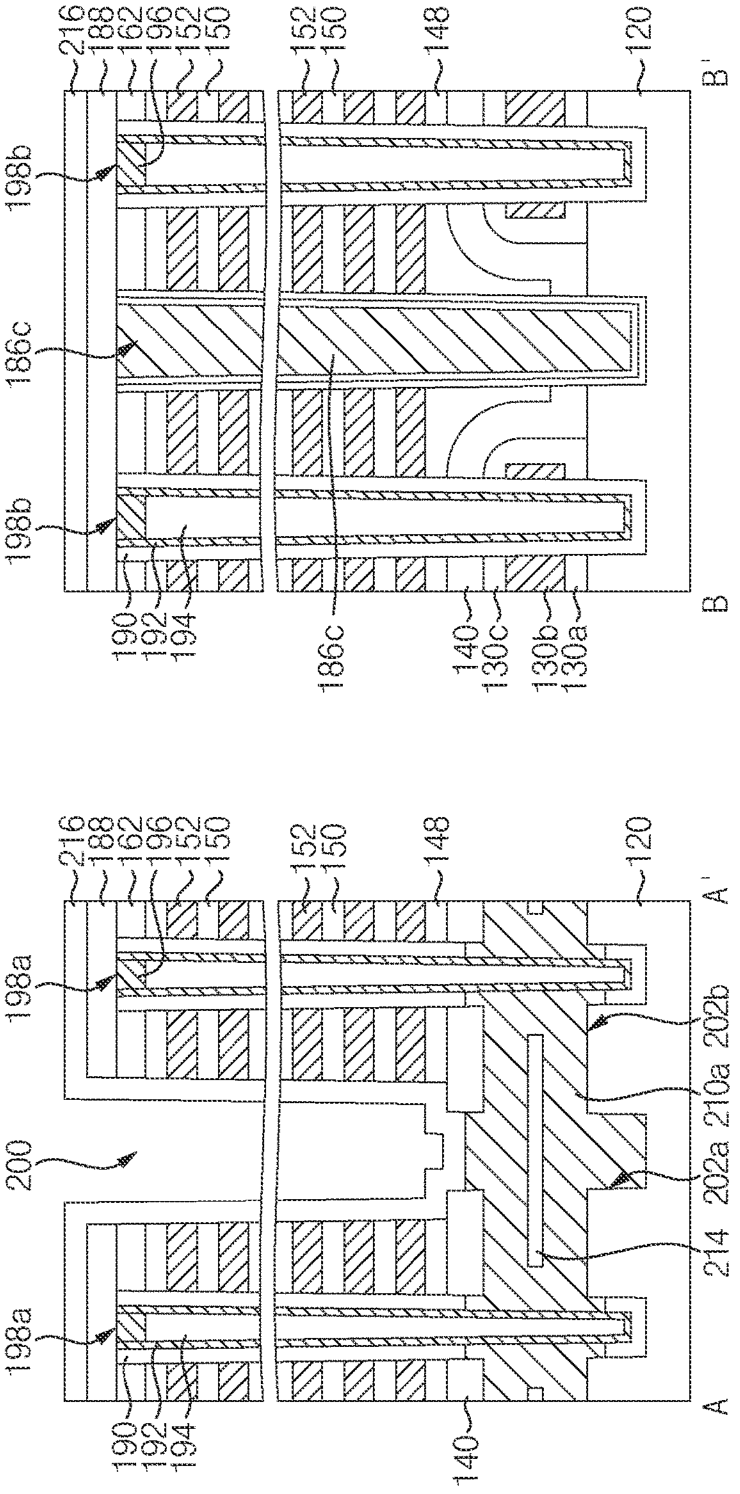
Figure 27:
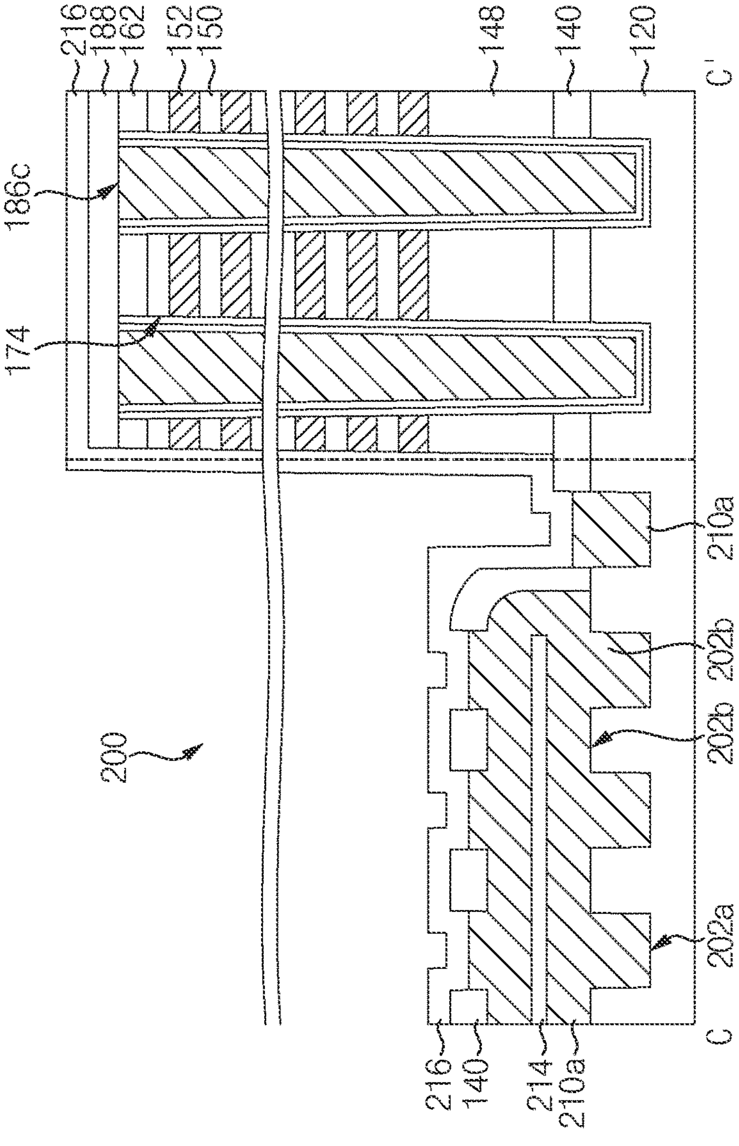

Referring to FIGS. 26 and 27, a third spacer layer 216 may be formed on the sidewall and lower surface of the second opening 200 (e.g., of the upper portion of the second opening 200) on the channel connection pattern 210*a*. The third spacer layer 216 may also be formed on the third insulating interlayer 188.

The third spacer layer 216 may be conformally formed on the first lower insulation layer 148, the first insulation layers 150 and the fourth sacrificial layers 152 exposed by the sidewall of the second opening 200, and the support layer 140 and the channel connection pattern 210*a* on the lower surface of the second opening 200. The third spacer layer 216 may include an insulation material, e.g., silicon nitride.

Figure 28:
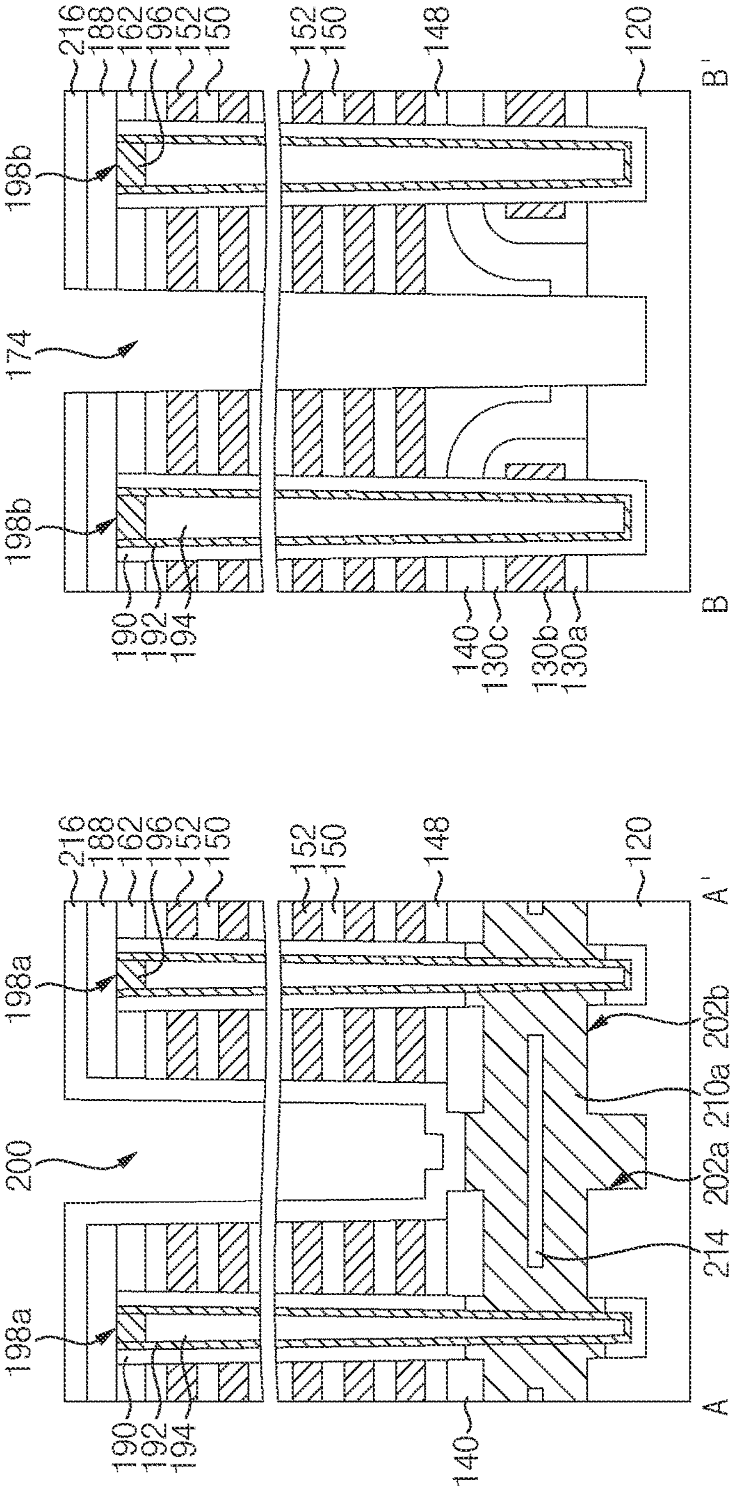
Figure 29:
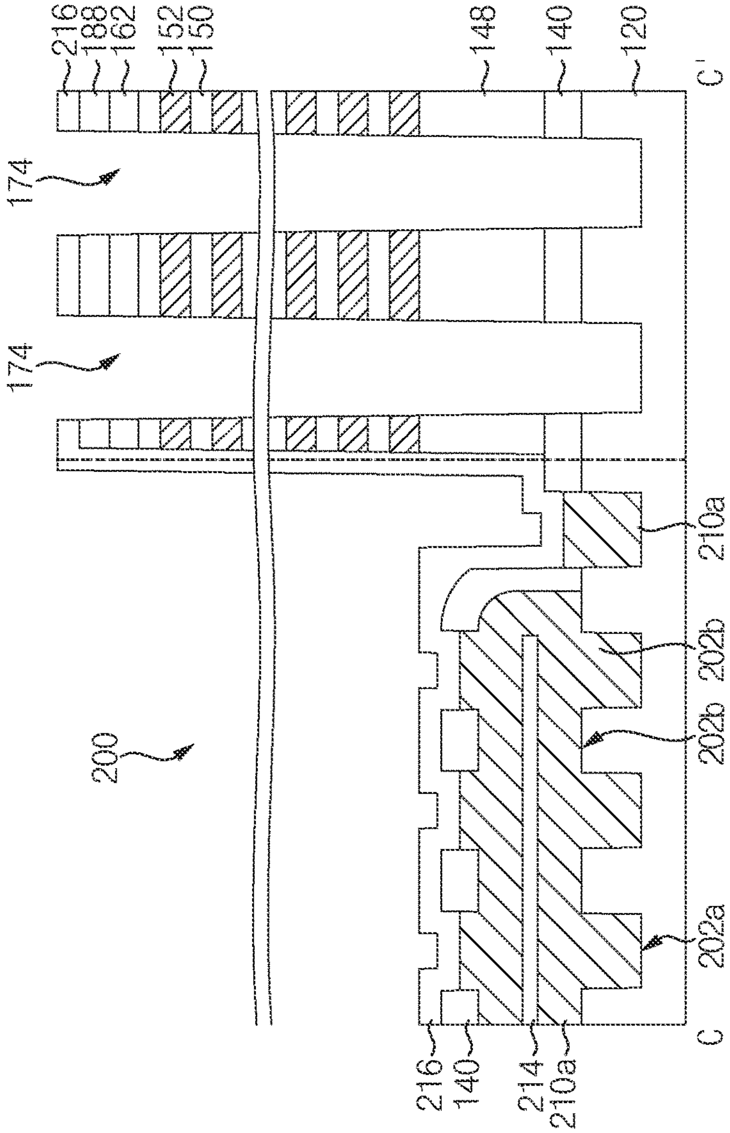
Figure 30:
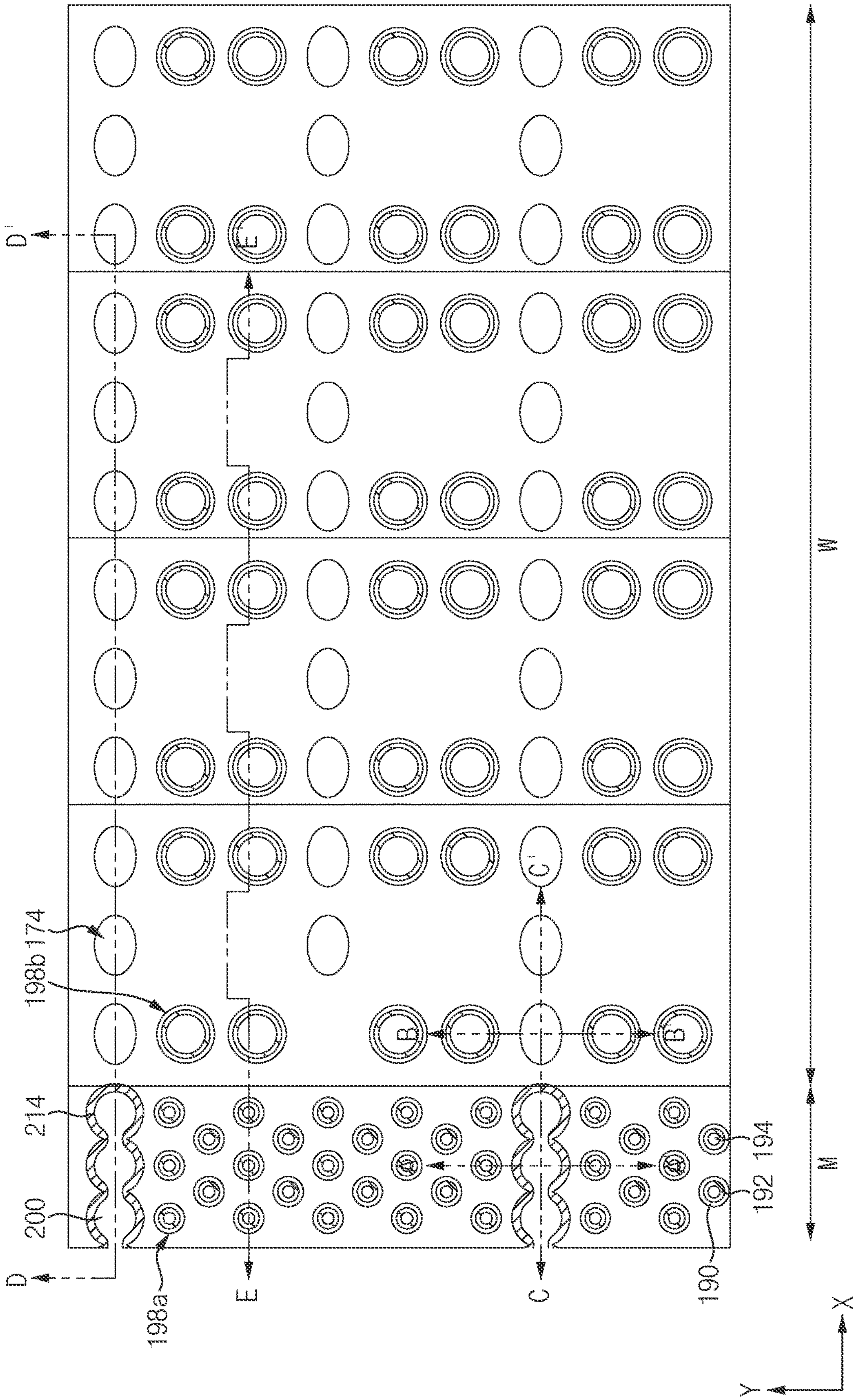

Referring to FIGS. 28 to 30, a third etch mask pattern (not shown) may be formed on the third spacer layer 216. The third etch mask pattern may selectively expose the word line cutting region WC for dividing cell blocks on the second region W and the dummy cutting region DC for a word line replacement process.

The third spacer layer 216 and the third insulating interlayer 188 may be etched using the third etch mask pattern to expose the seventh sacrificial patterns 186*c* inside the second holes 174. Thereafter, the exposed seventh sacrificial patterns 186*c* may be removed to form the second holes 174 again.

Figure 31:
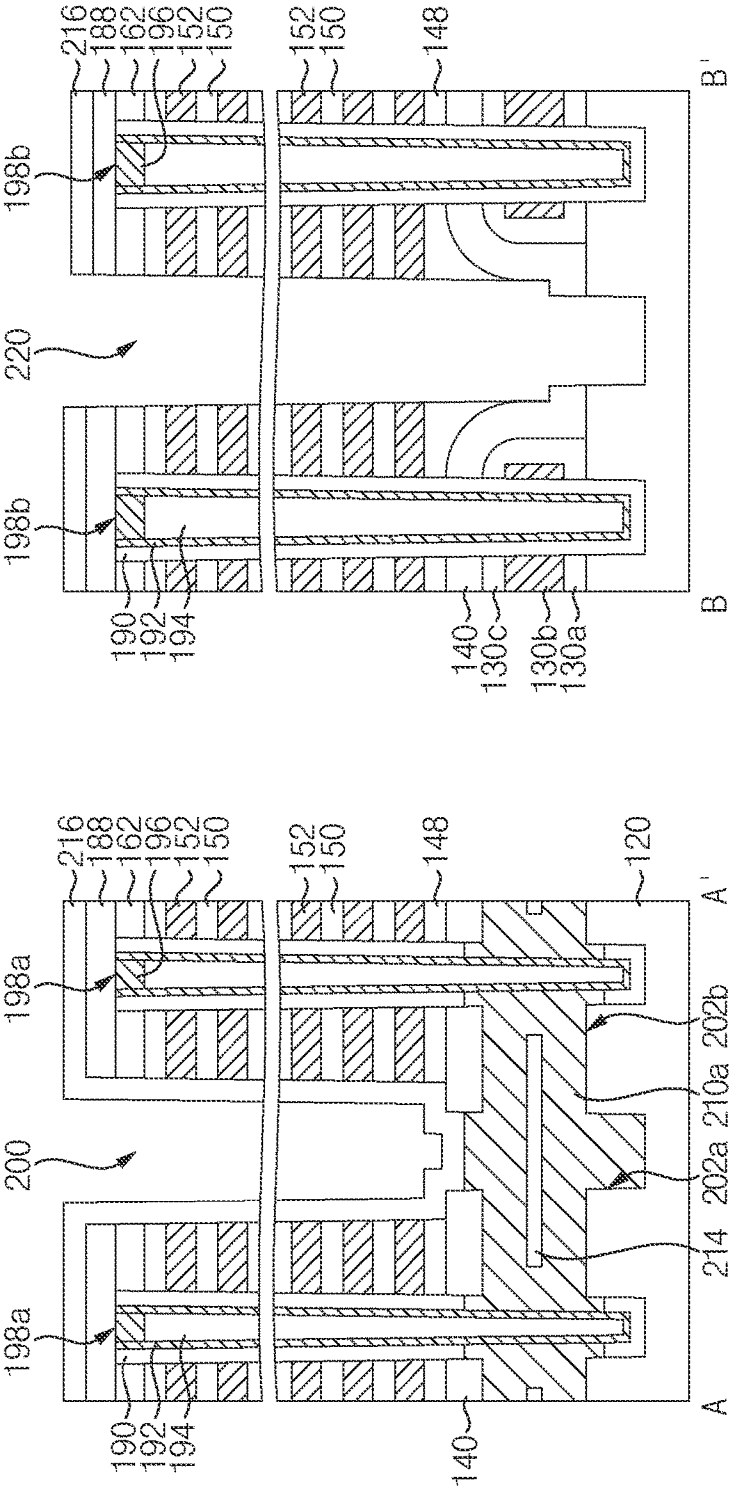
Figure 32:
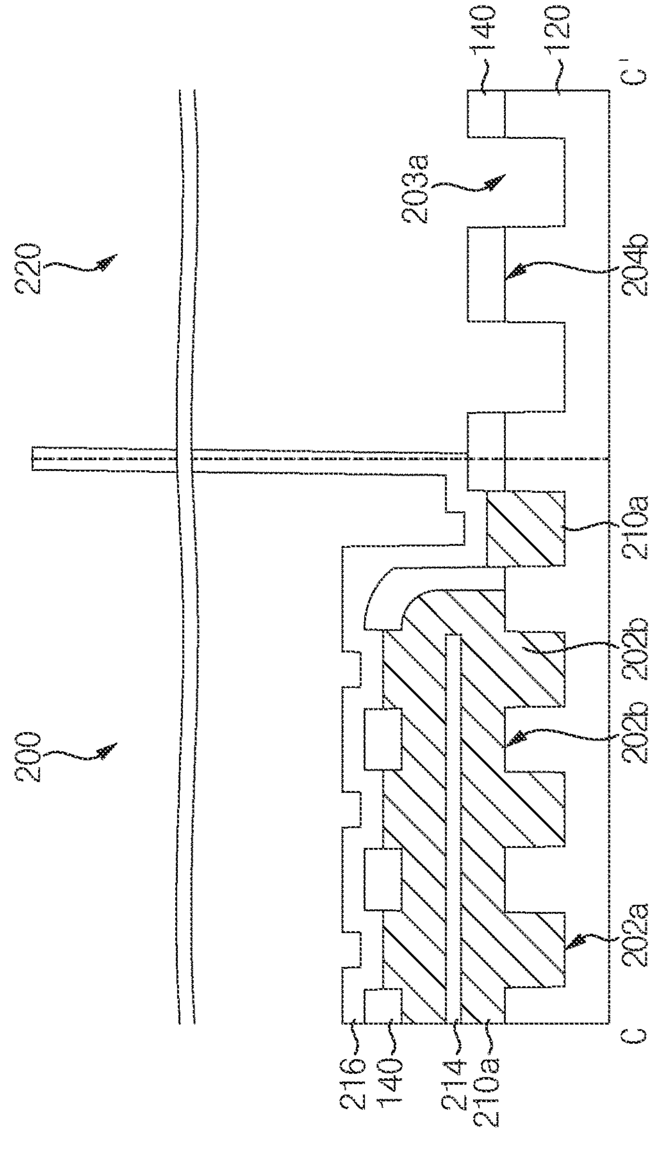
Figure 33:
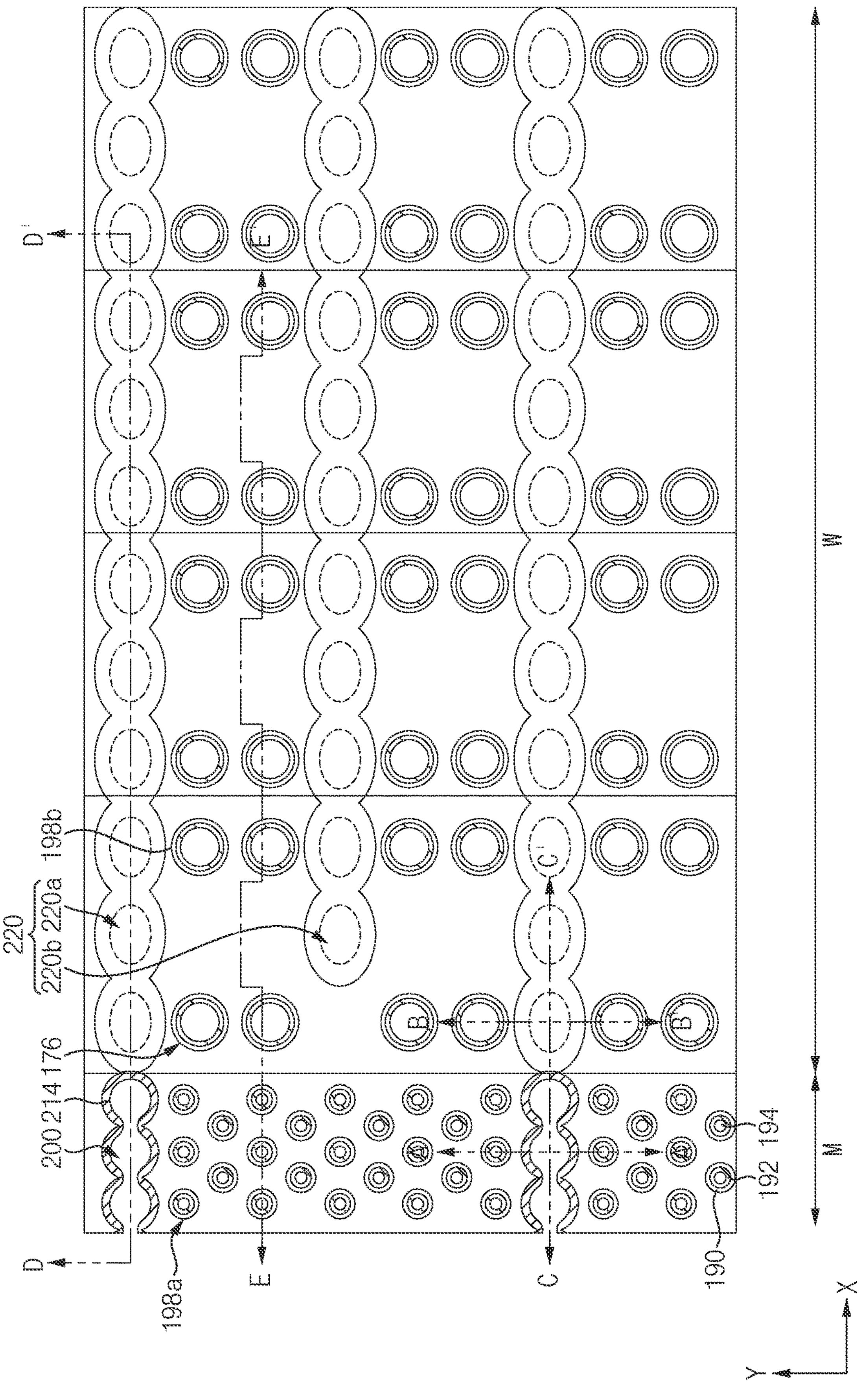

Referring to FIGS. 31 to 33, sidewalls of the second holes 174 may be etched (e.g., may be expanded) so that the adjacent second holes 174 may be connected to each other in the first direction X to form a third opening 220 having a shape of a trench. In the etching process, an inner width of each of the second holes 174 expanded so that the second holes 174 may be connected to each other. The etching process of the sidewalls of the second holes 174 may include isotropic etching, e.g., a wet etching process.

In a cross-sectional view cut in the first direction X, a lower portion of the third opening 220, may include a portion corresponding to the second hole 174 and a portion corresponding to a portion between the adjacent second holes 174. The portion of the third opening 220 corresponding to the second hole 174 and the portion of the third opening 220 corresponding to the portion between the adjacent second holes 174 may be repeatedly disposed. In the lower portion of the third opening 220, an upper portion (e.g., an upper surface) of the common source plate 120 corresponding to the lower portion (e.g., lower surface) of the second holes 174 may be already etched before the etching process for forming the third opening 220. Therefore, the upper portion of the common source plate 120 corresponding to the lower portion of the second holes 174 may comprise a fourth recess 203*a* after the etching process for forming the third opening 220. However, a portion of the common source plate 120 between the adjacent second holes 174 may not be etched before the etching process for forming the third opening 220 and after the etching process for forming the third opening 220, so that the portion (e.g., the upper portion) of the common source plate 120 between the adjacent second holes 174 may comprise a second protrusion 204*b*. Therefore, the upper surface of the common source plate 120 in the third opening 220 may have the fourth recess 203*a* and the second protrusion 204*b* alternately and repeatedly arranged in the first direction X.

In the etching process for forming the third opening 220, the first lower insulation layer 148, first insulation layers 150 and fourth sacrificial layers 152 exposed by the sidewalls of the second holes 174 may be partially etched together.

The third opening 220 may be formed only in the second region W of the substrate 100, and may extend in the first direction X. The common source plate 120 may be exposed by the lower portion of the third opening 220.

To form the third opening 220 extending in the first direction X, the first lower insulation layer 148, the first insulation layers 150, and the fourth sacrificial layer 152 exposed by the second hole 174 may be etched by at least a thickness of ½ (half) of the third distance d3. Etching thicknesses of the first lower insulation layer 148, the first insulation layers 150, and the fourth sacrificial layers 152 for forming the third opening 220 and etching thicknesses of the first lower insulation layer 148, the first insulation layers 150, and the fourth sacrificial layers 152 for forming the second opening 200 may be different from each other.

In example embodiments, the etching thicknesses of the first lower insulation layer 148, the first insulation layers 150, and the fourth sacrificial layer 152 for forming the third opening 220 may be greater than the etching thickness of the first lower insulation layer 148, the first insulation layers 150, and the fourth sacrificial layers 152 for forming the second opening 200.

Since the second holes 174 have the circular shape (or a substantially circular shape) or the oval shape in a plan view, the third opening 220 formed by expanding the second holes 174 may not have the same width in the second direction Y depending on positions thereof. The third opening 220 may include a third portion having a maximum width in the second direction Y and a fourth portion having a minimum width in the second direction Y. The third portion and the fourth portion may be alternately and repeatedly disposed in the first direction X. The width of the third opening 220 in the second direction Y may gradually decrease from the third portion to the fourth portion in the first direction X, and may gradually increase again from the fourth portion to the third portion (e.g., the next third portion) in the first direction X. In a plan view, the third opening 220 may have a connected circular shape or a connected oval shape.

In example embodiments, inner widths of the second opening 200 and the third opening 220 may be different from each other. For example, a first maximum width of the second opening 200 and a second maximum width of the third opening 220 may be different from each other, and a first minimum width of the second opening 200 and a second minimum width of the third opening 220 may be different from each other. For example, the second maximum width of the third opening 220 may be greater than the first maximum width of the second opening 200, and the second minimum width of the third opening 220 may be greater than the first minimum width of the second opening 200.

The third opening 220 may include a first portion 220*a* corresponding to the word line cutting region WC for dividing cell blocks and a second portion 220*b* corresponding to the dummy cutting region DC for word line replacement process.

As described above, the etching process of the sidewall of the first hole 172 for forming the second opening 200 on the first region M and the etching process of the sidewall of the second hole 174 for forming the third opening 220 on the second region W may be different etching processes. That is, the second opening 200 and the third opening 220 may be formed by different etching processes, and thus the etching thickness of the layers (e.g., the first lower insulation layer 148, the first insulation layers 150, and the fourth sacrificial layer 152) in forming the second opening 200 and the etching thickness of the layers in forming the third opening 220 may be different to each other. Accordingly, the inner width of the second opening 200 (e.g., the inner width of the second opening 200 in a direction) and the inner width of the third opening 220 may be different from each other. (e.g., the inner width of the third opening 220 in the direction).

If the etching process of the sidewall of the first hole 172 for forming the second opening 200 on the first region M and the etching process of the sidewall of the second hole 174 for forming a third opening 220 on the second region W are the same etching process, the etching thickness of the layers may be determined so as to form the second opening 200 and the third opening 220 together. When the etching thickness of the layers for forming the second opening 200 and the etching thickness of the layers for forming the third opening 220 are different from each other, the layers may be etched by thicker etching thickness among the etching thicknesses required to form the second opening 200 or the third opening 220. For example, if the etching thickness required to form the third opening 220 may be greater than the etching thickness required to form the second opening 200, the second opening 200 may be excessively etched in the etching process. Therefore, the inner width of the second opening 200 may be greater than a target inner width of the second opening 200. In this case, the second opening 200 may contact the channel structure 198*a* due to the excessive etching, and thus defects may occur. If the layer may not be etched to a sufficient thickness for forming the third opening 220, a defect may occur in which the third opening 220 may not extend in the first direction X.

However, in this embodiment, in the etching process for forming the second opening 200, the etching process may be performed to a minimum etching thickness required to form the second opening 200. Therefore, defects in which the second opening 200 and the channel structure 198*a* contact each other may be decreased. Additionally, in the etching process for forming the third opening 220, the etching process may be performed to a sufficient etching thickness required to form the third opening 220. Thus, defects in which the third opening 220 does not extend in the first direction X may be decreased.

Figure 34:
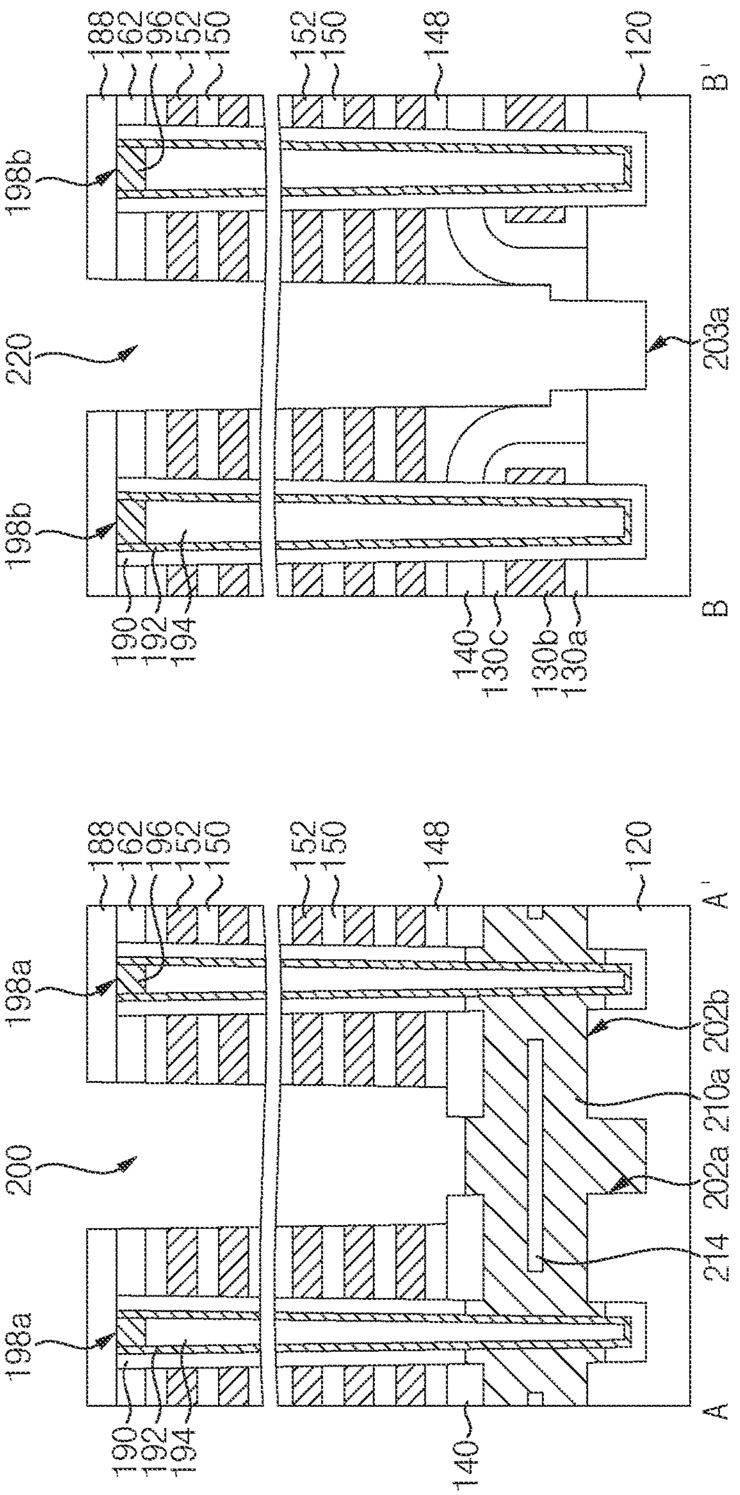
Figure 35:
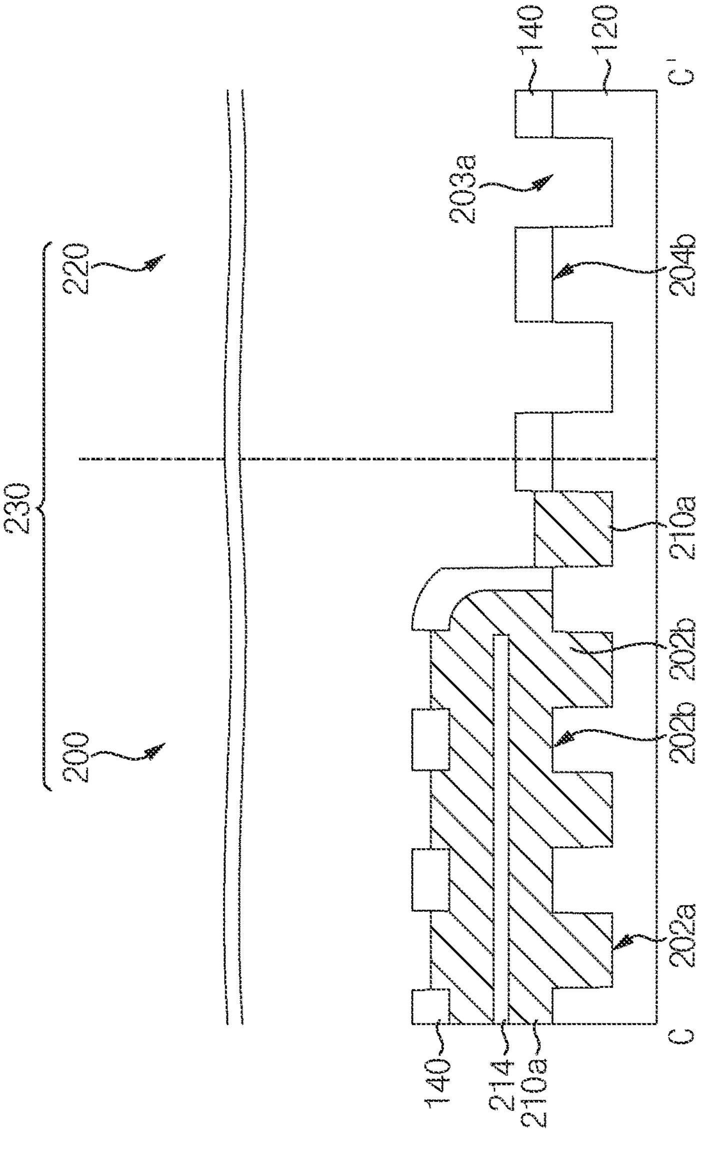
Figure 36:
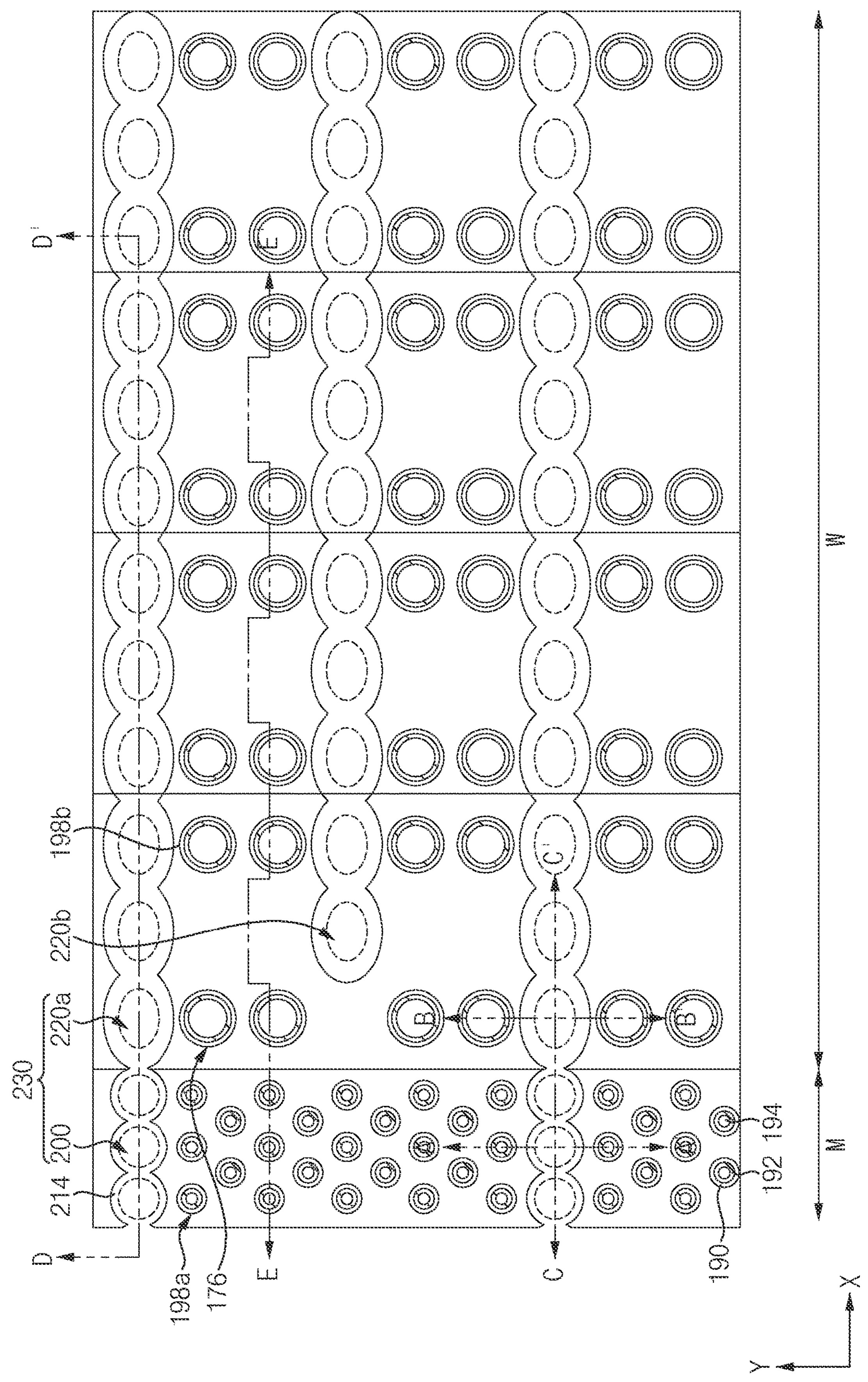

Referring to FIGS. 34 to 36, the third spacer layer 216 on the surfaces of the second opening 200 and the third insulating interlayer 188 may be removed. Accordingly, the second opening 200 and the first portion 220*a* of the third opening 220 may be connected to each other, and may extend in the first direction X. The second and third openings 200 and 220 connected to each other may be referred to as a first trench 230, and the preliminary mold structure (e.g., the first preliminary mold structure 154) may be separated by the first trench 230 to form a mold structure.

The second portion 220*b* of the third opening 220 may be formed only on the second region W and may be referred to as a second trench 220*b*. The second trench 220*b* may be positioned on the dummy cutting region DC and may be formed for word line replacement process. In some example embodiments, the second trench 220*b* may not be formed. When the second trench 220*b* is not formed, the second holes 174 may be formed only in the word line cutting region WC.

Figure 37:
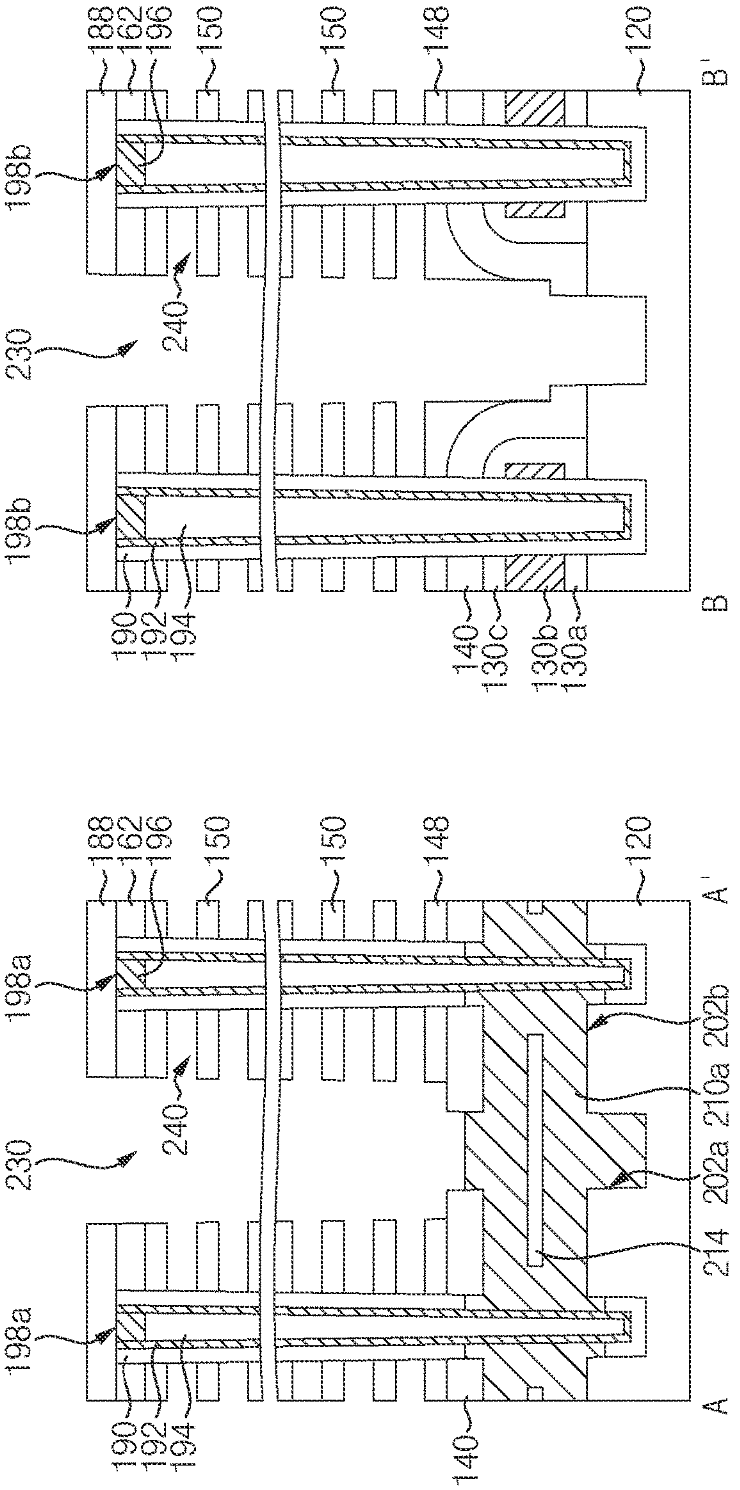

Referring to FIG. 37, the fourth sacrificial layers 152 exposed by the first and second trenches 230 and 220*b* may be removed to form a second gap 240 between the first insulation layers 150. An outer wall (e.g., at least a portion of an outer sidewall) of the charge storage structure 190 included in the channel structure 198*a* may be exposed by the second gap 240.

In example embodiments, the fourth sacrificial layers 152 may be removed by a wet etching process using an etchant containing phosphoric acid ($H_3PO_4$) or sulfuric acid ($H_2SO_4$).

Figure 38:
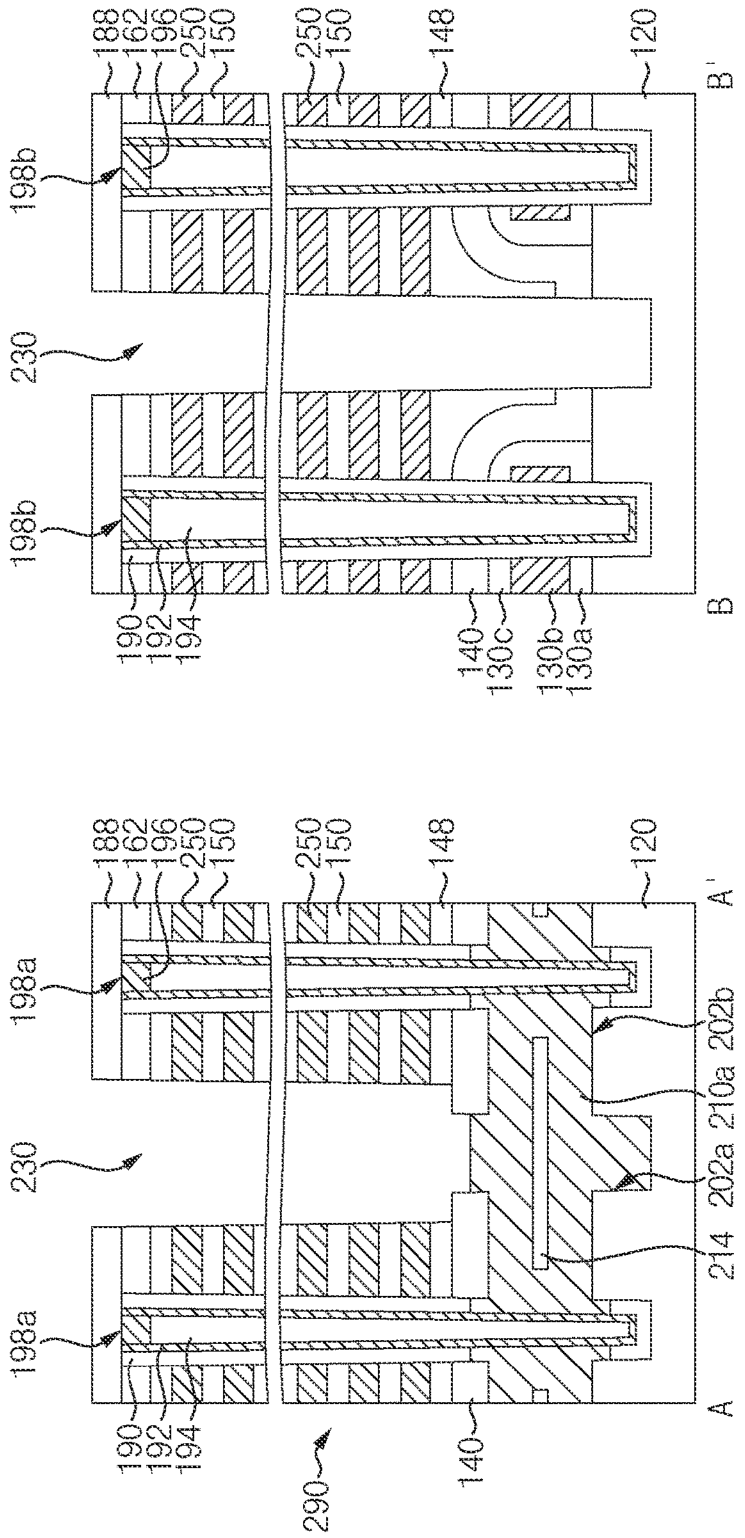

Referring to FIG. 38, a second blocking layer may be formed on the surfaces of the first and second trenches 230 and 220*b*, the surface of the second gap 240, and the upper surface of the third insulating interlayer 188. A gate electrode layer may be formed on the second blocking layer. The gate electrode layer may include a barrier metal layer and a metal layer. For example, the second blocking layer may include a metal oxide such as aluminum oxide or hafnium oxide. The barrier metal layer may include, e.g., titanium, titanium nitride, tantalum, or tantalum nitride. The metal layer may include e.g., tungsten.

Thereafter, the gate electrode layer may be partially removed to form a gate pattern 250 inside the second gap 240. In example embodiments, the gate electrode layer may be partially removed by a wet etching process.

As the fourth sacrificial layer 152 is replaced with the gate pattern 250, the mold structure may be converted into a gate pattern structure 290. The gate pattern structure 290 may include first insulation layers 150 and gate patterns 250 alternately and repeatedly stacked. The gate pattern structure 290 may extend in the first direction X. The gate patterns 250 may extend in the first direction X and may be spaced apart from each other in the vertical direction.

The gate electrode layers on the surfaces of the first and second trenches 230 and 220*b* may be removed. Accordingly, the first and second trenches 230 and 220*b* may be formed again.

Figure 39:
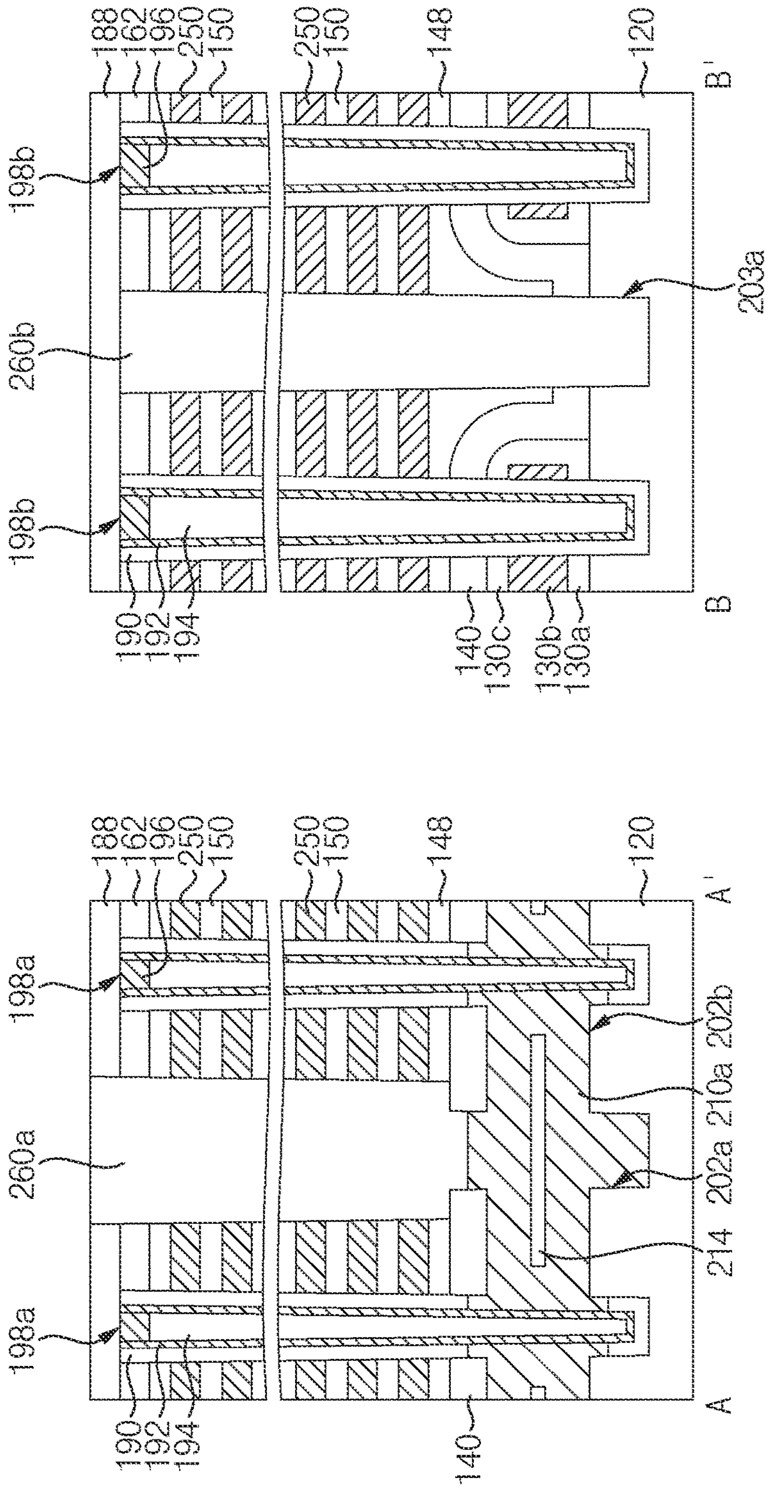
Figure 40:
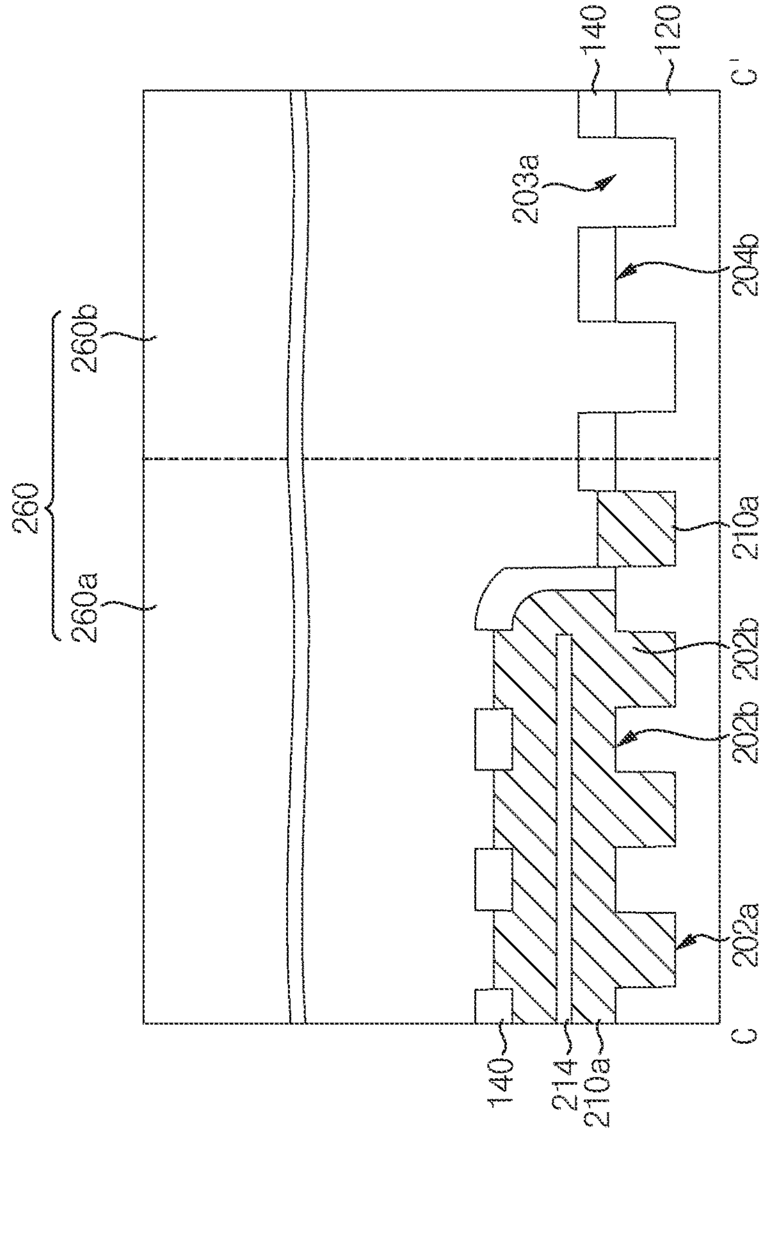
Figure 41:
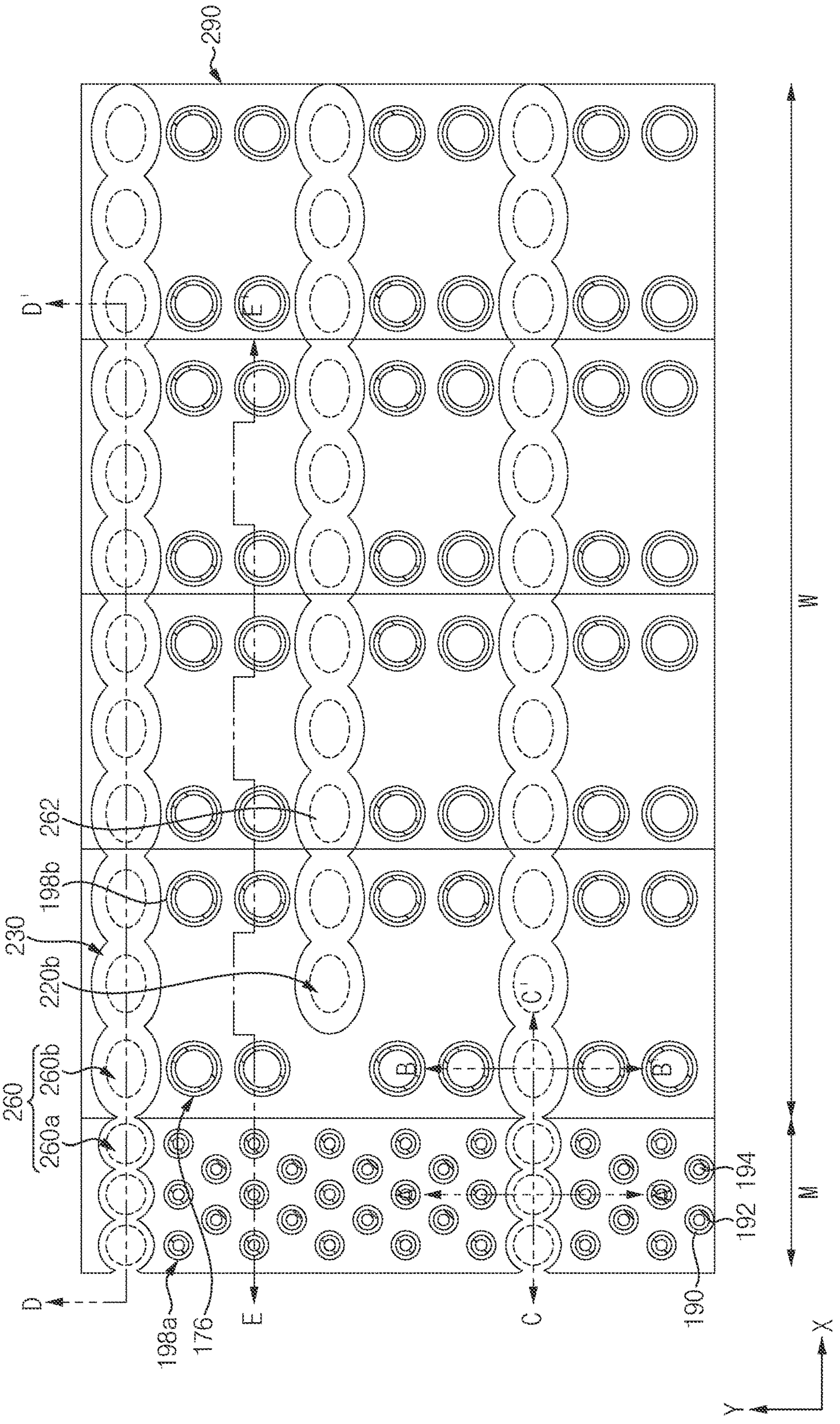

Referring to FIGS. 39 to 41, a first separation layer may be formed to fill the first and second trenches 230 and 220*b*. Additionally, the first separation layer may be planarized until an upper surface of the third insulating interlayer 188 is exposed to form a first separation pattern structure 260 in the first trench 230 and a second separation pattern structure 262 in the second trench 220*b*.

The first separation pattern structure 260 may extend in the first direction X from the first region M to the second region W. The first separation pattern structure 260 may include a first separation pattern 260*a* on the first region M and a second separation pattern 260*b* on the second region W. The first and second separation patterns 260*a* and 260*b* may be connected to each other. In a plan view, a shape of the first separation pattern 260*a* may be substantially the same as a shape of the second opening 200. Additionally, in a plan view, a shape of the second separation pattern 260*b* may be substantially the same as a shape of the third opening 220.

The first separation pattern 260*a* may include a first portion having a maximum width in the second direction Y and a second portion having a minimum width in the second direction Y. The first and second portions of the first separation pattern 260*a* may be repeatedly arranged in the first direction X. The second separation pattern 260*b* may include a third portion having a maximum width in the second direction Y and a fourth portion having the minimum width in the second direction Y. The third and fourth portions of the second separation pattern 260*b* may be repeatedly arranged in the first direction X. In a plan view, each of the first and second separation patterns 260*a* and 260*b* may have a connected circular shape or a connected oval shape.

The first separation pattern 260*a* and the second separation pattern 260*b* may have different widths. In example embodiments, the maximum width of the first separation pattern 260*a* (hereinafter referred to as a first maximum width) and the maximum width of the second separation pattern 260*b* (hereinafter referred to as a second maximum width) may be different from each other. The minimum width of the first separation pattern 260*a* (hereinafter referred to as a first minimum width) and the minimum width of the second separation pattern 260*b* (hereinafter referred to as a second minimum width) may be different from each other. In example embodiments, the second maximum width (e.g., the second maximum width in a direction) may be greater than the first maximum width (e.g., the first maximum width in the direction), and the second minimum width (e.g., the second minimum width in a direction) may be greater than the first minimum width (e.g., the first minimum width in the direction).

The second separation pattern structure 262 may be formed only in the second region W, and may extend in the first direction X. In a plan view, the second separation pattern structure 262 may have a shape the same (or significantly the same) as a shape of the second separation pattern 260*b*.

As shown in FIG. 39, the channel connection pattern 210*a* may be formed in the lower portion of the first trench 230 on the first region M. For example, the channel connection pattern 210*a* may fill the first recess 202*a* in the first trench 230 on the first region M.

However, the channel connection patterns may not be formed in the lower portions of the first trench 230 and the second trench 220*b* on the second region W. For example, the channel connection pattern may not fill the fourth recess 203*a* in the first and second trenches 230 and 220*b* on the second region W.

Therefore, a lower portion of the first separation pattern 260*a* may contact the channel connection pattern 210*a* and the support layer 140. The second separation pattern 260*b* and the second separation pattern structure 262 may fill the fourth recess 203*a*. The second separation pattern 260*b* and the second separation pattern structure 262 may contact the common source plate 120 and the support layer 140.

Figure 43:
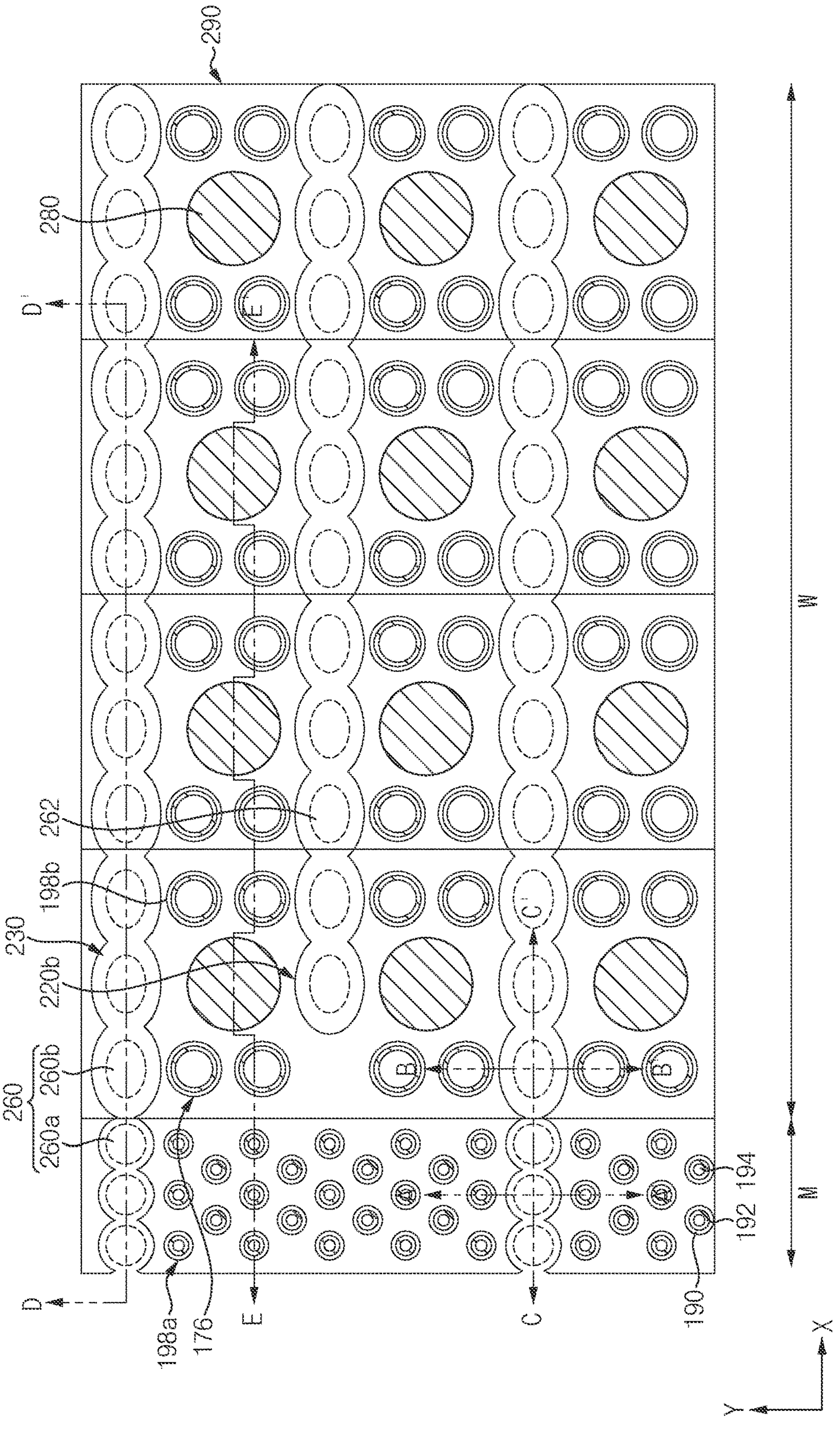

Referring to FIGS. 42 and 43, first contact plugs 270 may be formed through the third insulating interlayer 188, and the first contact plugs 270 may contact the capping patterns 196 of the channel structures 198*a*, respectively.

A fourth insulating interlayer 272 may be formed on the third insulating interlayer 188 and the first contact plugs 270. Second contact plugs 280 may be formed through the first to fourth insulating interlayers 160, 162, 188, and 272. The second contact plugs 280 may contact upper surfaces of the gate patterns 250 on the second region W, respectively.

Thereafter, an upper insulating interlayer and upper wirings may be formed on the fourth insulating interlayer 272 and the second contact plugs 280. The upper wiring may include, e.g., a wiring electrically connected to the first contact plugs 270 and a wiring electrically connected to the second contact plug 280.

The vertical memory device may be manufactured by the above described processes.

As described above, in order to form separation trenches, the first holes 172 may be formed on the first region M, and the second holes 174 may be formed on the second region W. The etching process for forming the second opening 200 by expanding the width of the first holes 172 and the etching process for forming the third opening 220 by expanding the width of the second holes 174 may be different etching processes. Accordingly, defects caused by the etching processes may be decreased.

Structural features of the vertical memory device may be described.

The structural features of the vertical memory device may be described with reference to FIGS. 39, 40, 42, and 43.

Referring to FIGS. 39, 40, 42 and 43 again, the vertical memory device may include a lower circuit pattern 112 on a substrate 100, a common source plate ("CSP") 120, a gate pattern structure 290, a first separation pattern structure 260, a second separation pattern structure 262, a channel structure 198*a*, a dummy channel structure 198*b*, a first contact plug 270, and a second contact plug 280 on the substrate 100.

In addition, the vertical memory device may further include a support layer 140, a channel connection pattern 210*a*, a lower insulating interlayer 110, a first lower insulation layer 148, and first to fourth insulating interlayers 160, 162, 188, and 272.

In the vertical memory device, the lower circuit pattern 112 comprising a peripheral circuit may be formed on the substrate 100, and the lower insulating interlayer 110 may be on (e.g., cover) the lower circuit patterns 112. Memory cells and contact plugs may be formed on the lower insulating interlayer 110. As such, the vertical memory device may have a Cell Over Peripheral (COP) structure. However, the vertical memory device may not be limited to the COP structure, and the vertical memory device may be any vertical memory device including a separation pattern structure in a word line cutting region (e.g., the word line cutting region WC).

The substrate 100 may include a first region M and a second region W extending around (e.g., surrounding) the first region M. The first region M may be a region where a memory cell array is formed, and the second region W may be a region extending from the memory cell array.

The common source plate 120 may be on the lower insulating interlayer 110. For example, the common source plate 120 may include polysilicon doped with n-type impurities. In some embodiments, the common source plate 120 may include metal silicide layer and a polysilicon layer doped with n-type impurities sequentially stacked. The metal silicide layer may include, e.g., tungsten silicide.

The channel connection pattern 210*a*, the support layer 140, and the first lower insulation layer 148 may be formed on the common source plate 120.

The channel connection pattern 210*a* may be formed on the first region M of the substrate 100. The channel connection pattern 210*a* may contact the upper surface of the common source plate 120 on the first region M.

The support layer 140 may be formed on the channel connection pattern 210*a* on the first region M and the common source plate 120 on the second region W. In some example embodiments, a sacrificial layer structure 130 may be disposed on the common source plate 120 on the second region W.

For example, the channel connection pattern 210*a* may include polysilicon doped with n-type impurities or undoped polysilicon.

The gate pattern structure 290 may be on the first lower insulation layer 148. The gate pattern structure 290 may include first insulation layers 150 and gate patterns 250 alternately and repeatedly stacked. The gate pattern structure 290 may extend in the first direction X. A plurality of gate pattern structures 290 may be spaced apart in the second direction Y. For example, adjacent gate pattern structures 290 among the plurality of gate pattern structures 290 may be spaced apart from each other in the second direction Y.

The gate pattern structure 290 may extend in the first direction X from the first region M to the second region W of the substrate 100. The gate pattern structure 290 on the second region W may have a staircase shape whose a length in the first direction X decreases toward upside. For example, a length of the staircase shape in the first direction X may decrease as a distance between an upper surface of the staircase and an upper surface of the substrate 100 increases in the vertical direction. In example embodiments, the gate pattern structure 290 may include stairs in the first direction X. In some example embodiments, the gate pattern structure 290 may include stairs in the first direction X and the second direction Y.

The first insulating interlayer 160 may be on (e.g., cover) an upper surface of the gate pattern structure 290 on the second region W. A second insulating interlayer 162 may be on the first insulating interlayer 160. A third insulating interlayer 188 may be on the second insulating interlayer 162.

The first separation pattern structure 260 may be formed between the (adjacent) gate pattern structures 290 in the second direction Y. The first separation pattern structure 260 may pass through the third insulating interlayer 188, the second insulating interlayer 162, the first insulating interlayer 160, the gate pattern structure 290, and the lower insulating interlayer 110, and may extend in the vertical direction.

Particularly, a first trench 230 extending in the first direction X from the first region M to the second region W may be formed between the gate pattern structures 290 (e.g., between the adjacent gate pattern structures 290). The (adjacent) gate pattern structures 290 may be separated from each other in the second direction Y by the first trench 230. The first trench 230 on the first region M may be referred to as a second opening 200, and the first trench 230 on the second region W may be referred to as a third opening 220. The second and third openings 200 and 220 may be connected to each other.

The upper portion (e.g., the upper surface) of the common source plate 120 corresponding to a lower portion (e.g., the lower surface) of the second opening 200 may include a first recess 202*a* and a first protrusion 202*b* (on the first region M) repeatedly arranged in the first direction X. The first recesses 202*a* may be spaced apart from each other in the first direction X. The upper portion (e.g., upper surface) of the common source plate 120 of a lower portion (e.g., the lower surface) of the third opening 220 may have a fourth recess 203*a* and a second protrusion 204*b* (on the second region W) repeatedly arranged in the first direction X. The fourth recesses 203*a* may be spaced apart from each other in the first direction X.

In example embodiments, an inner width of the first recess 202*a* in the first direction X and an inner width of the fourth recess 203*a* in the first direction X may be different from each other. For example, the inner width of the fourth recess 203*a* in the first direction X may be greater than the inner width of the first recess 202*a* in the first direction X.

In example embodiments, a distance between the first recesses 202*a* in the first direction X and a distance between the fourth recesses 203*a* in the first direction X may be different from each other. For example, the distance between the fourth recesses 203*a* in the first direction X may be greater than the distance between the first recesses 202*a* in the first direction X. A width of the first protrusion 202*b* in the first direction X and a width of the second protrusion 204*b* in the first direction X may be different from each other. For example, the width of the second protrusion 204*b* in the first direction X may be greater than the width of the first protrusion 202*b* in the first direction X.

In example embodiments, a distance from the first recess 202*a* to the second opening 200 in the second direction Y and a distance from the fourth recess 203*a* to the third opening 220 in the second direction Y may be different from each other.

The support layers 140 may be disposed at a lower portion of the second opening 200, and may face the first protrusion 202*b*. The support layers 140 may be spaced apart from each other in the first direction X. In example embodiments, the channel connection pattern 210*a* may be disposed between a lower portion (e.g., a lower sidewall and/or a lower surface) of the support layer 140 and the upper surface of the common source plate 120. A seam 214 extending in the horizontal direction may be included within the channel connection pattern 210*a*.

In example embodiments, the channel connection pattern 210*a* may fill the first recess 202*a* on the upper surface of the common source plate 120. For example, the channel connection layer 210 may include, for example, poly silicon. In some embodiments, the support layer 140 and the channel connection pattern 210*a* may be at least partially exposed by the lower portion of the second opening 200.

At least a portion of the upper surface of the common source plate 120 may be exposed by a lower portion (e.g., a lower sidewall and/or a lower surface) of the third opening 220. The support layer 140 may be formed on the second protrusion 204*b*.

At this case, the channel connection pattern 210*a* may not be formed in the fourth recess 203*a*. For example, the fourth recess 203*a* may not be filled with a polysilicon.

In a plan view, the second opening 200 and the third opening 220 may have different inner widths (e.g., different inner width in the same direction). In a plan view, the second opening 200 and the third opening 220 may have different shapes (e.g., different sizes and/or different figures).

In a plan view, the second openings 200 may not have the same width in the second direction Y, but may have different widths depending on positions of the second opening 200. The second opening 200 may include a first portion having a maximum width in the second direction Y and a second portion having a minimum width in the second direction Y. The first portions and the second portions may be repeatedly (e.g., repeatedly and alternately) arranged in the first direction X. The width of the second opening 200 in the second direction Y gradually decrease from the first portion to the second portion in the first direction X, and may gradually increase again from the second portion to another first portion in the first direction X. In a plan view, the second opening 200 may have a connected circular shape or a connected oval shape.

In a plan view, the third opening 220 may not have the same width in the second direction Y, but may have a different width depending on the positions thereof. The third opening 220 may have a third portion having a maximum width in the second direction Y and a fourth portion having the minimum width in the second direction Y. The third portion and the fourth portion of the third opening 220 may be repeatedly (e.g., repeatedly and alternately) arranged in the first direction X. A width of the third opening 220 in the second direction Y may gradually decreases from the third portion to the fourth portion in the first direction X, and may gradually increase again from the fourth portion to another third portion in the first direction X. In a plan view, the third opening 220 may have a connected circular shape or a connected oval shape.

A profile of a sidewall of the gate pattern structure 290 in the second direction Y may be the same as a profile of a sidewall of the first trench 230 in the second direction Y. Additionally, a profile of the sidewall of the first separation pattern structure 260 may be the same as a profile of the sidewall of the first trench 230. In some embodiments, the profiles of the sidewalls of the gate pattern structures 290 in the second direction Y may be different on the first and second regions M and W. Additionally, the profiles of the sidewalls of the first separation pattern structures 260 in the second direction Y may be different on the first and second regions M and W.

The first separation pattern structure 260 may fill the first trench 230. The first separation pattern structure 260 may include, e.g., silicon oxide.

The first separation pattern structure 260 may include a first separation pattern 260*a* on the first region M and a second separation pattern 260*b* on the second region W. The first separation pattern 260*a* may fill the second opening 200, and may extend in the first direction X. The second separation pattern 260*b* may fill the third opening 220 and may extend in the first direction X while being connected to an end of the first separation pattern 260*a*. The second separation pattern 260*b* may have a shape different from a shape of the first separation pattern 260*a*.

The first separation pattern 260*a* may have a first portion having a maximum width in the second direction Y and a second portion having a minimum width in the second direction Y. The first portion and the second portion of the first separation pattern 260*a* may be repeatedly (e.g., repeatedly and alternately) arranged in the first direction X. Both sidewalls of the first separation pattern 260*a* may have a rounded shape. Two opposing sidewalls of the first separation pattern 260*a* may be symmetrical to each other. In a plan view, the first separation pattern 260*a* may have a connected circular shape or a connected oval shape.

The second separation pattern 260*b* may have a third portion having the maximum width in the second direction Y and a fourth portion having the minimum width in the second direction Y. The third portion and the fourth portion of the second separation pattern 260*b* may be repeatedly (e.g., repeatedly and alternately) arranged in the first direction X. Both sidewalls of the second separation pattern 260*b* may have a rounded shape. Two opposing sidewalls of the second separation pattern 260*b* may be symmetrical to each other. In a plan view, the second separation pattern 260*b* may have a connected circular shape or a connected oval shape.

In example embodiments, a curvature of the rounded sidewalls of the first separation pattern 260*a* may be different from a curvature of the rounded sidewalls of the second separation pattern 260*b*.

In example embodiments, as shown in FIG. 43, the first separation pattern 260*a* may have the connected circular shape, and the second separation pattern 260*b* may have the connected oval shape.

In example embodiments, a first maximum width (e.g., a first maximum width in a direction) of the first separation pattern 260*a* and a second maximum width (e.g., a second maximum width in the direction) of the second separation pattern 260*b* may be different from each other. A first minimum width (e.g., a first minimum width in a direction) of the first separation pattern 260*a* and a second minimum width (e.g., a second minimum width in the direction) of the second separation pattern 260*b* may be different from each other. For example, the second maximum width may be greater than the first maximum width, and the second minimum width may be greater than the first minimum width.

At least a portion of a lower portion (e.g., a lower surface and/or a lower sidewall) of the first separation pattern 260*a* may contact the channel connection pattern 210*a*. The lower portion (e.g., the lower surfaces) of the first separation pattern 260*a* may directly contact upper surfaces of the support layer 140 and the channel connection pattern 210*a*. A lower portion (e.g., a lower surface and/or a lower sidewall) of the second separation pattern 260*b* may contact upper surfaces of the common source plate 120 and the support layer 140. The second separation pattern 260*b* may fill the fourth recess 203*a*. Since the lower portion of the second separation pattern 260*b* corresponding to the fourth recess 203*a* protrudes downward, the lower portions of the second separation patterns 260*b* may comprise protrusions protruding downward that are repeatedly arranged.

The first separation pattern 260*a* may include the first portions having the maximum width in the second direction Y and the second portions having the minimum width in the second direction Y repeatedly (e.g., repeatedly and alternately) arranged in the first direction X. The second separation pattern 260*b* may include the third portion having the maximum width in the second direction Y and the fourth portion having the minimum width in the second direction Y repeatedly (e.g., repeatedly and alternately) arranged in the first direction X. In a plan view, each of the first and second separation patterns 260*a* and 260*b* may have a connected circular shape or a connected oval shape.

The first separation pattern 260*a* and the second separation pattern 260*b* may have different widths (e.g., different width in the same direction). In example embodiments, the first maximum width of the first separation pattern 260*a* and the second maximum width of the second separation pattern 260*b* may be different from each other (e.g., different from each other in the same direction). The first minimum width of the first separation pattern 260*a* and the second minimum width of the second separation pattern 260*b* may be different from each other (e.g., different from each other in the same direction). In an example embodiment, the second maximum width may be greater than the first maximum width (e.g., greater than the first maximum width in the same direction), and the second minimum width may be greater than the first minimum width (e.g., greater than the first minimum width in the same direction).

The second separation pattern structure 262 may be formed in the second trench 220*b*. The second separation pattern structure 262 may have a shape the same as a shape the second trench 220*b*. The second separation pattern structure 262 may pass through the gate pattern structure 290 on the second region W, and may extend in the first direction X. The second separation pattern structure 262 may partially separate the gate pattern structure 290.

The channel structures 198*a* may pass through the gate pattern structure 290 on the first region M, and may contact an upper portion (e.g., an upper surface) of the common source plate 120. For example, the channel structures 198*a* may partially penetrate the common source plate 120. The channel structure 198*a* may be formed in the channel hole 170.

The channel structure 198*a* may include a charge storage structure 190, a channel 192, a filling insulation pattern 194, and a capping pattern 196. Upper and lower portions of the charge storage structure 190 included in the channel structure 198*a* may be separated (e.g., separated by the channel connection pattern 210*a*).

In the first region M of the substrate 100, the channel connection pattern 210*a* may be between the support layer 140 and the common source plate 120 below the gate pattern structure 290. Accordingly, a lower portion of the channel connection pattern 210*a* may contact the common source plate 120. A lower portion of the channel 192 included in the channel structure 198*a* may contact the channel connection pattern 210*a*.

The dummy channel structures 198*b* may pass through the gate pattern structure 290 on the second region W, may contact the upper surface of the common source plate 120. For example, the dummy channel structures 198*b* may partially penetrate the common source plate 120. The dummy channel structure 198*b* may be formed in the dummy channel hole 176.

The dummy channel structure 198*b* may have a stacked structure the same as a stacked structure of the channel structure 198*a*. That is, the dummy channel structure 198*b* may include the charge storage structure 190, the channel 192, the filling insulation pattern 194, and the capping pattern 196.

The dummy channel structure 198*b* may serve as a support pillar to support the gate pattern structure 290 on the second region W. Therefore, the charge storage structure 190 and the channel 192 included in the dummy channel structure 198*b* may serve as a dummy charge storage structure and a dummy channel that do not actually operate as a channel or a charge storage structure.

The upper and lower portions of the charge storage structure 190 included in the dummy channel structure 198*b* may not be separated. The charge storage structure 190 may extend around (e.g., surround) the sidewalls and bottom of the channel 192. The channel 192 included in the dummy channel structure 198*b* may not contact the channel connection pattern 210*a*.

The first contact plugs 270 may pass through the third insulating interlayer 188 and may contact the capping pattern 196 of the channel structure 198*a*. Second contact plugs 280 may pass through the first to third insulating interlayers 160, 162 and 188, and may contact the gate patterns 250 of the gate pattern structure 290, respectively. The second contact plugs 280 may contact upper surfaces of the gate patterns 250 on the second region W, respectively.

An upper insulating interlayer and upper wirings may be on the fourth insulating interlayer 272 and the second contact plugs 280.

The first and second separation patterns (e.g., the first and second separation patterns 260*a* and 260*b*) included in the first separation pattern structure may be variously modified to have different shapes and different widths. Hereinafter, the various shapes of the first separation pattern structure (e.g., the first separation pattern structure 260) according to example embodiments may be described.

Figure 44:
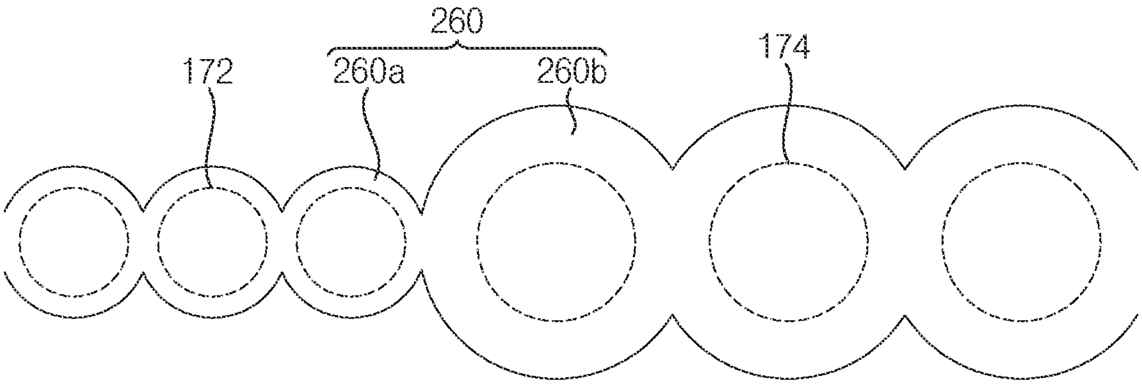
Figure 45:
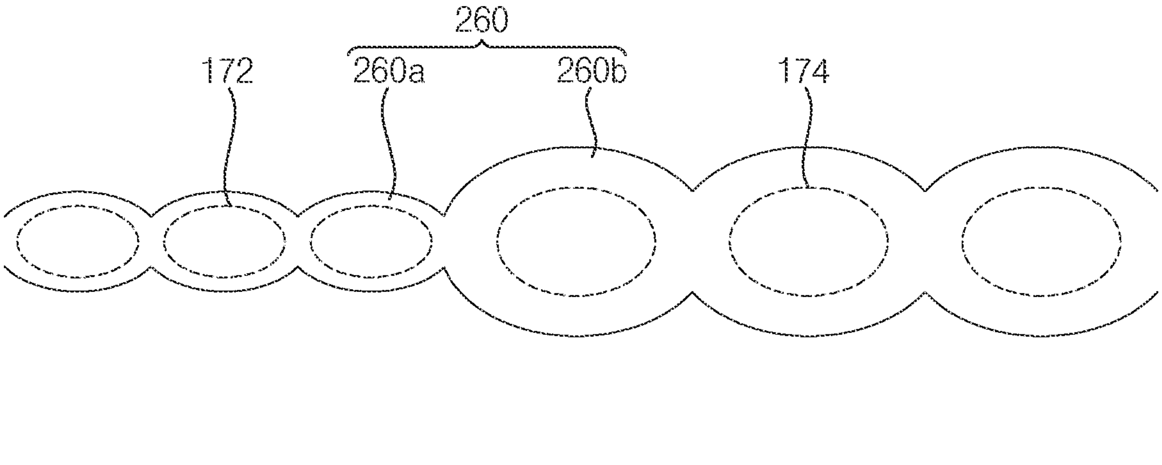

FIG. 44 is a plan view of a first separation pattern structure in a vertical memory device according to example embodiments. FIG. 45 is a plan view of a first separation pattern structure in a vertical memory device according to example embodiments.

Referring to FIG. 44, in the first separation pattern structure 260, the first separation pattern 260*a* may have a connected circular shape, and the second separation pattern 260*b* may have a connected circular shape. In this case, the first and second holes 172 and 174 formed before forming the second opening (e.g., the second opening 200) may have a circular shape.

Referring to FIG. 45, in the first separation pattern structure 260, the first separation pattern 260*a* may have a connected oval shape, and the second separation pattern 260*b* may have a connected oval shape. In this case, the first and second holes 172 and 174 formed before forming the second opening (e.g., the second opening 200) may have an oval shape.

While the present inventive concepts have been shown and described with reference to example embodiments thereof, it will be understood by those of ordinary skill in the art that various changes in form and details may be made thereto without departing from the scope of the present inventive concepts as set forth by the following claims.

What is claimed is:

1. A vertical memory device, comprising:

a common source plate on a substrate, wherein the common source plate includes a first region and a second region extending around the first region;

a plurality of gate pattern structures on the common source plate, wherein the plurality of gate pattern structures extends from the first region to the second region in a first direction parallel to an upper surface of the substrate, wherein each of the plurality of gate pattern structures includes gate patterns and first insulation layers alternately and repeatedly stacked, and wherein adjacent gate pattern structures among the plurality of gate pattern structures are spaced apart from each other in a second direction perpendicular to the first direction;

a plurality of first separation patterns filling a plurality of first openings between the adjacent gate pattern structures among the plurality of gate pattern structures on the first region, wherein the plurality of first separation patterns is arranged in the first direction;

a plurality of second separation patterns filling a plurality of second openings between the adjacent gate pattern structures among the plurality of gate pattern structures on the second region, wherein the plurality of second separation patterns is arranged in the first direction, wherein a second separation pattern among the plurality of second separation patterns is connected to a first separation pattern among the plurality of first separation patterns, and wherein the second separation pattern has a shape different from a shape of the first separation pattern; and a plurality of channel structures passing through the plurality of gate pattern structures on the common source plate on the first region, wherein each of the plurality of channel structures includes a channel and a charge storage structure.

2. The vertical memory device of claim 1, wherein the plurality of first separation patterns includes rounded sidewalls, wherein first portions of the plurality of first separation patterns have a first maximum width in the second direction, and second portions of the plurality of first separation patterns have a first minimum width in the second direction, wherein the first portions and the second portions are repeatedly and alternately arranged in the first direction, wherein the plurality of second separation patterns includes rounded sidewalls, wherein third portions of the plurality of second separation patterns have a second maximum width in the second direction, and fourth portions of the plurality of second separation patterns have a second minimum width in the second direction, and wherein the third portions and the fourth portions are repeatedly and alternately arranged in the first direction.

3. The vertical memory device of claim 2, wherein the first maximum width of the first portions is different from the second maximum width of the third portions, and wherein the first minimum width of the second portions is different from the second minimum width of the fourth portions.

4. The vertical memory device of claim 2, wherein a curvature of the rounded sidewalls of the plurality of first separation patterns and a curvature of the rounded sidewalls of the plurality of second separation patterns are different from each other.

5. The vertical memory device of claim 1, wherein an upper surface of the common source plate facing the plurality of first openings in a vertical direction includes first recesses spaced apart from each other in the first direction, wherein an upper surface of the common source plate facing the plurality of second openings in the vertical direction includes second recesses spaced apart from each other in the first direction, and wherein the vertical direction is perpendicular to the substrate.

6. The vertical memory device of claim 5, wherein a distance between the first recesses in the first direction and a distance between the second recesses in the first direction are different from each other.

7. The vertical memory device of claim 6, wherein an inner width of each of the first recesses is different from an inner width of each of the second recesses.

8. The vertical memory device of claim 6, wherein a distance from a first recess among the first recesses to one of the plurality of first openings in the second direction is different from a distance from a second recess among the second recesses to one of the plurality of second openings in the second direction.

9. The vertical memory device of claim 6, wherein the plurality of second separation patterns fills the second recesses.

10. The vertical memory device of claim 6, further comprising a channel connection pattern between the common source plate and at least one of the plurality of gate pattern structures on the first region, and wherein the channel connection pattern fills the first recesses.

11. The vertical memory device of claim 1, wherein the gate patterns on the second region have a staircase shape, wherein lengths of the gate patterns in the first direction decrease as distances between the gate patterns and the substrate in a vertical direction increase, and wherein the vertical direction is perpendicular to the substrate.

12. The vertical memory device of claim 1, further comprising a third separation pattern passing through a gate pattern structure among the plurality of gate pattern structures on the second region, wherein the third separation pattern extends in the first direction, and wherein the third separation pattern partially separates the gate pattern structure.

13. The vertical memory device of claim 1, further comprising dummy channel structures passing through the plurality of gate pattern structures on the common source plate on the second region.

14. A vertical memory device, comprising:

a common source plate on a substrate, wherein the common source plate includes a first region and a second region that extends around the first region;

a plurality of gate pattern structures on the common source plate, wherein the plurality of gate pattern structures extends from the first region to the second region in a first direction parallel to an upper surface of the substrate, wherein each of the plurality of gate pattern structures includes gate patterns and first insulation layers alternately and repeatedly stacked, and wherein adjacent gate pattern structures among the plurality of gate pattern structures are spaced apart in a second direction perpendicular to the first direction;

a plurality of first separation patterns filling a plurality of first openings between the adjacent gate pattern structures among the plurality of gate pattern structures on the first region, wherein the plurality of first separation patterns is arranged in the first direction;

a plurality of second separation patterns filling a plurality of second openings between the adjacent gate pattern structures among the plurality of gate pattern structures on the second region, wherein the plurality of second separation patterns is arranged in the first direction, and wherein a second separation pattern among the plurality of second separation patterns is connected to a first separation pattern among the plurality of first separation patterns; and a plurality of channel structures passing through the plurality of gate pattern structures on the common source plate on the first region, wherein each of the plurality of channel structures includes a channel and a charge storage structure, wherein the plurality of first separation patterns has different widths depending on positions thereof in the second direction, and opposite sidewalls of the plurality of first separation patterns are symmetrical to each other, wherein the plurality of second separation patterns has different widths depending on positions thereof in the second direction, and opposite sidewalls of the plurality of second separation patterns are symmetrical to each other, and wherein a first maximum width of the plurality of first separation patterns in the second direction is different from a second maximum width of the plurality of second separation patterns in the second direction.

15. The vertical memory device of claim 14, wherein the plurality of first separation patterns includes rounded sidewalls, wherein first portions of the plurality of first separation patterns have the first maximum width in the second direction, and second portions of the plurality of first separations patterns have a first minimum width in the second direction, wherein the first portions and the second portions are repeatedly and alternately arranged in the first direction, wherein the plurality of second separation patterns includes rounded sidewalls, wherein third portions of the plurality of second separation patterns have the second maximum width in the second direction, and fourth portions of the plurality of second separation patterns have a second minimum width in the second direction, and wherein the third portions and the fourth portions are repeatedly and alternately arranged in the first direction.

16. The vertical memory device of claim 14, wherein an upper surface of the plurality of first separation patterns has a first connected circular shape or a first connected oval shape, and wherein an upper surface of the plurality of second separation patterns has a second connected circular shape or a second connected oval shape.

17. The vertical memory device of claim 14, wherein an upper surface of the common source plate facing the plurality of first openings in a vertical direction includes first recesses spaced apart from each other in the first direction, wherein an upper surface of the common source plate facing the plurality of second openings in the vertical direction includes second recesses spaced apart from each other in the first direction, wherein the vertical direction is perpendicular to the substrate, and wherein, in a plan view, each of the first and second recesses has a circular shape or an oval shape.

18. The vertical memory device of claim 17, further comprising a channel connection pattern between the common source plate and at least one of the plurality of gate pattern structures on the first region, and wherein the channel connection pattern fills the first recesses.

19. The vertical memory device of claim 17, wherein a distance from a first recess among the first recesses to one of the plurality of first openings in the second direction is different from a distance from a second recess among the second recesses to one of the plurality of second openings in the second direction.

20. A vertical memory device, comprising:

a lower circuit pattern on a substrate;

a common source plate on the lower circuit pattern, wherein the common source plate includes a first region and a second region extending around the first region;

a plurality of gate pattern structures on the common source plate, wherein the plurality of gate pattern structures extends from the first region to the second region in a first direction parallel to an upper surface of the substrate, wherein each of the plurality of gate pattern structures includes gate patterns and first insulation layers alternately and repeatedly stacked, and wherein adjacent gate pattern structures among the plurality of gate pattern structures are spaced apart in a second direction perpendicular to the first direction;

a plurality of first separation patterns filling a plurality of first openings between the adjacent gate pattern structures among the plurality of gate pattern structures on the first region, wherein the plurality of first separation patterns is arranged in the first direction;

a plurality of second separation patterns filling a plurality of second openings between the adjacent gate pattern structures among the plurality of gate pattern structures on the second region, wherein the plurality of second separation patterns is arranged in the first direction, wherein a second separation pattern among the plurality of second separation patterns is connected to a first separation pattern among the plurality of first separation patterns, and wherein the second separation pattern has a shape different from a shape of the first separation pattern;

a plurality of channel structures passing through the plurality of gate pattern structures on the common source plate on the first region, wherein each of the plurality of channel structures includes a channel and a charge storage structure; and a channel connection pattern between the common source plate and at least one of the plurality of gate pattern structures on the first region, wherein the gate patterns on the second region have a staircase shape, wherein lengths of the gate patterns in the first direction decrease as distances between the gate patterns and the substrate in a vertical direction increase, wherein the vertical direction is perpendicular to the substrate, and wherein at least a portion of one of the plurality of first separation patterns contacts the channel connection pattern.

* * * * *